(12) United States Patent
Huang et al.

(10) Patent No.: US 11,448,715 B2
(45) Date of Patent: Sep. 20, 2022

(54) PERMANENT MAGNET SYSTEM AND METHOD OF FORMING THEREOF

(71) Applicant: Singapore University of Technology and Design, Singapore (SG)

(72) Inventors: Shao Ying Huang, Singapore (SG); Zhi Hua Ren, Singapore (SG); Wen Chuan Mu, Singapore (SG); Jia Gong, Singapore (SG)

(73) Assignee: SINGAPORE UNIVERSITY OF TECHNOLOGY AND DESIGN, Singapore (SG)

( * ) Notice: Subject to any disclaimer, the term of this patent is extended or adjusted under 35 U.S.C. 154(b) by 0 days.

(21) Appl. No.: 17/272,949

(22) PCT Filed: Sep. 3, 2019

(86) PCT No.: PCT/SG2019/050441
§ 371 (c)(1),
(2) Date: Mar. 3, 2021

(87) PCT Pub. No.: WO2020/050776
PCT Pub. Date: Mar. 12, 2020

(65) Prior Publication Data
US 2021/0325491 A1    Oct. 21, 2021

(30) Foreign Application Priority Data
Sep. 3, 2018    (SG) .......................... 10201807522U

(51) Int. Cl.
*G01R 33/383* (2006.01)
*H01F 41/02* (2006.01)

(52) U.S. Cl.
CPC ....... *G01R 33/383* (2013.01); *H01F 41/0253* (2013.01)

(58) Field of Classification Search
USPC .......................................................... 324/318
See application file for complete search history.

(56) References Cited

U.S. PATENT DOCUMENTS

| 3,237,059 A | * | 2/1966 | Meyerer | ................. | H01J 23/00 335/210 |
| 5,014,032 A | * | 5/1991 | Aubert | ................. | H01F 7/0278 324/318 |

(Continued)

FOREIGN PATENT DOCUMENTS

CN    105390229 A    3/2016

OTHER PUBLICATIONS

Cooley, et al, Design of sparse Halbach magnet arrays for portable MRI using a genetic algorithm. IEEE Trans Magn. Oct. 23, 2017; 54(1): doi:10.1109/TMAG.2017.2751001. (Year: 2017).*

(Continued)

*Primary Examiner* — Rodney E Fuller
(74) *Attorney, Agent, or Firm* — Viering, Jentschura & Partner mbB

(57) ABSTRACT

There is provided a method of forming a permanent magnet system, the method including: determining one or more types of geometrical parameters for forming an array of magnet ring pairs including a first subarray of first magnet rings and a second subarray of second magnet rings spaced apart from the first subarray of the first magnet rings along a longitudinal axis; and forming the array of magnet ring pairs based on the determined one or more types of geometrical parameters, whereby the above-mentioned determining one or more types of geometrical parameters for forming the array of magnet ring pairs is based on a genetic algorithm. There is also provided a corresponding permanent magnet system, such as formed by the method.

20 Claims, 33 Drawing Sheets

(56) References Cited

U.S. PATENT DOCUMENTS

| | | | | |
|---|---|---|---|---|
| 5,028,903 | A * | 7/1991 | Aubert | H01F 7/0278 324/318 |
| 5,332,971 | A * | 7/1994 | Aubert | G01R 33/383 324/306 |
| 5,576,679 | A * | 11/1996 | Ohashi | H01J 23/10 315/5.35 |
| 5,900,793 | A * | 5/1999 | Katznelson | G01R 33/383 335/298 |
| 10,596,393 | B2 * | 3/2020 | Stanescu | A61B 6/4417 |
| 10,867,733 | B2 * | 12/2020 | Haham Hay | H01F 7/0252 |
| 2002/0175792 | A1 * | 11/2002 | Laskaris | H01F 41/0253 335/299 |
| 2011/0175694 | A1 * | 7/2011 | Fallone | G01R 33/543 335/306 |
| 2018/0325477 | A1 * | 11/2018 | Wang | A61B 5/0035 |
| 2020/0174087 | A1 * | 6/2020 | Haham Hay | G01R 33/383 |
| 2021/0173024 | A1 * | 6/2021 | Hugon | A61B 5/055 |
| 2021/0255263 | A1 * | 8/2021 | Franke | G01R 33/4808 |

OTHER PUBLICATIONS

Klaus Halbach, "Design of Permanent Multipole Magnets with Oriented Rare Earth Cobalt Materials", Nuclear Instruments and Methods, Feb. 1, 1980, pp. 1-10, vol. 169, Issue 1.

Clarissa Zimmerman Cooley et al., "Two-Dimensional Imaging in a Lightweight Portable MRI Scanner without Gradient Coils", Magnetic Resonance in Medicine, 2015, pp. 872-883, vol. 73, No. 2.

Zhi Hua Ren et al., "A Novel Optimization Method for the Design of Permanent Magnet Array and its Application to a Portable Magnetic Resonance Imaging (MRI) System", 24th International Society for Magnetic Resonance in Medicine Annual Meeting & Exhibition, 2017, 3 pages.

Takeshi Kimura et al., "Development of a mobile magnetic resonance imaging system for outdoor tree measurements", Review of Scientific Instruments, May 17, 2011, 6 pages, vol. 82, No. 5, p. 053704, American Institute of Physics.

Mathieu Sarracanie et al., "Low-Cost High-Performance MRI", Scientific Reports, Oct. 15, 2015, 9 pages, vol. 5, p. 15177.

Zhi Hua Ren et al., "A Low-field Portable Magnetic Resonance Imaging System for Head Imaging", 2017 Progress in Electromagnetics Research Symposium—Fall (Piers—Fall), Nov. 19-22, 2017, pp. 3042-3044, IEEE, Singapore.

L.L. Tsai et al., "An Open-Access, Very-Low-Field MRI System for Posture-Dependent 3He Human Lung Imaging" Journal of Magnetic Resonance, Aug. 2008, pp. 274-285, vol. 193, No. 2.

Hans-Martin Klein et al., "Clinical Low Field Strength Magnetic Resonance Imaging", A Practical Guide to Accessible MRI, 2015, 166 pages, Springer.

Zhi Hua Ren et al., "Magnet Array for a Portable Magnetic Resonance Imaging System", 2015 IEEE MTT-S 2015 International Microwave Workshop Series on RF and Wireless Technologies for Biomedical and Healthcare Applications (IMWS-BIO), Sep. 21-23, 2015, pp. 92-95, IEEE, Taipei, Taiwan.

Clarissa Zimmerman Cooley et al., "Design of Sparse Halbach Magnet Arrays for Portable MRI Using a Genetic Algorithm", IEEE Transactions on Magnetics, Jan. 1, 2018, vol. 54, No. 1, pp. 1-12.

Peter Bluemler, "Permanent Magnet System for MRI with Constant Gradient mechanically adjustable in Direction and Strength", Concepts in Magnetic Resonance Part B Magnetic Resonance Engineering, Oct. 2015, 12 pages.

Cedric Hugon et al., "Design, fabrication and evaluation of a low-cost homogeneous portable permanent magnet for NMR and MRI", Comptes Rendus Chimie, 2010, pp. 388-393, vol. 13, No. 4.

Katharina Menzel et al., "Design and application of a longitudinal field Aubert permanent magnet composed of identically-shaped blocks for large-scale Magnetic Separation", Separation and Purification Technology, 2014, pp. 220-231, vol. 134, ELSEVIER.

Kalyanmoy Deb et al., "A Fast and Elitist Multiobjective Genetic Algorithm: NSGA-II", IEEE Transactions on Evolutionary Computation, Apr. 2002, pp. 182-197, vol. 6, No. 2, IEEE.

Darrel Whitley, "A Genetic Algorithm Tutorial", Statistics and Computing, 1994, 37 pages, vol. 4, No. 2.

Nicholas R. Shaw et al., "Genetic Algorithms for MRI Magnet Design", IEEE Transactions on Applied Superconductivity, Mar. 2002, pp. 733-736, vol. 12, No. 1, IEEE.

Yingying Yao et al., "A New Design Method for Completely Open Architecture Permanent Magnet for MRI", IEEE Transactions on Magnetics, May 2005, pp. 1504-1507, vol. 41, No. 5, IEEE.

Elleaume et al.; "Computing 3D Magnetic Fields From Insertion Devices", IEEE Proceedings of the 1997 Particle Accelerator Conference, May 16, 1997, vol. 3, IEEE.

Jae-Seok Choi et al., "Design of a Halbach Magnet Array Based on Optimization Techniques", IEEE Transactions on Magnetics, Oct. 2008, pp. 2361 2366, vol. 44, No. 10, IEEE.

Klaas P. Pruessmann et al., "SENSE: Sensitivity Encoding for Fast MRI", Magnetic Resonance in Medicine, 1999, pp. 952-962, vol. 42, No. 5.

A. Trakic et al., "Image reconstructions with the rotating RF coil", Journal of Magnetic Resonance, 2009, pp. 186-198, vol. 201, No. 2, ELSEVIER.

T. J. Sumner, "Convectional magnetic shielding", Journal of Physics D: Applied Physics, 1987, pp. 1095-1101, vol. 20, No. 9.

Zhi Hua Ren et al., "Design and Optimization of a Ring-Pair Permanent Magnet Array for Head Imaging in a Low-Field Portable MRI System", IEEE Transactions on Magnetics, Jan. 2019, 8 pages, vol. 55, No. 1, IEEE.

Zhi Hua Ren et al., "An Irregular-Shaped Inward-Outward Ring-Pair Magnet Array With a Monotonic Field Gradient for 2D Head Imaging in Low-Field Portable MRI", IEEE Access, 2019, pp. 48715-48724, vol. 7.

J.C. Compter et al., "Ampere's Circuital 3-D Model for Noncuboidal Magnets", IEEE Transactions on Magnetics, Sep. 2, 2010, pp. 4009-4015, vol. 46, No. 12, IEEE.

Jia Gong et al., "Effects of Encoding Fields of Permanent Magnet Arrays on Image Quality in Low-Field Portable MRI Systems", IEEE Access, Jun. 14, 2019, pp. 80310-80327, vol. 7.

Zhi Hua Ren et al., "A Convertible Magnet Array and Solenoid Coil for a Portable Magnetic Resonance Imaging (MRI) System", ISMRM 25th Annual Meeting & Exhibition, Apr. 22-27, 2017, Honolulu, HI, USA.

Elizaveta Motovilova et al., "Magnetic materials for nuclear magnetic resonance (NMR) and magnetic resonance imaging (MRI)", Advances in Magnetic Materials: Processing, Properties and Performance, Feb. 2017, 82 pages, Chapter 3, CRC Press/Taylor & Francis.

Zhi Hua Ren et al., "An Irregular-shaped Ring-Pair Magnet Array with a Monotonic Field Gradient for 2D Head Imaging in Low-field Portable MRI", IEEE Access, Apr. 17, 2019, 13 pages, vol. 7, IEEE.

Zhi Hua Ren et al., "A New Yokeless Permanent Magnet Array with High Field Strength and High Field Homogeneity for Low-field Portable MRI System", ISMRM 26th Annual Meeting & Exhibition, Jun. 16-21, 2018, 4 pages, Paris, France.

Zhi Hua Ren et al., "An Irregular Aubert Ring-Pair-Aggregate Optimized with Improved Gradient for Head Imaging in a Low-field Portable MRI System", ISMRM 27th Annual Meeting & Exhibition, May 11-16, 2019, 4 pages, Montreal, Canada.

Zhi Hua Ren et al., "An Aubert Ring Aggregate Magnet Helmet for 3D Head Imaging in a Low-field Portable MRI", ISMRM 27th Annual Meeting & Exhibition, May 11-16, 2019, 3 pages, Montreal, Canada.

Zheng Xu et al., "Equivalent magnetic dipole method for designing gradient coils of the Halbach magnetic resonance device", International Journal of Applied Electromagnetics and Mechanics, Jan. 1, 2018, pp. 595-604, vol. 56, IOS Press.

Zheng Xu et al., "Equivalent magnetic dipole method used to design gradient coil for unilateral magnetic resonance imaging", 2018 Chinese Physics B, Apr. 26, 2018, 7 pages, vol. 27, No. 5.

Zhonghua He et al., "The Novel Design of a Single-Sided MRI Probe for Assessing Burn Depth", Sensors 2017, Mar. 6, 2017, vol. 17, No. 526, MDPI.

(56) References Cited

OTHER PUBLICATIONS

Zheng Xu et al., "Fast analytical calculation method for eddy current induced by gradient fields in an MRI system", COMPEL—The international journal for computation and mathematics in electrical and electronic engineering, Jun. 5, 2017, pp. 1690-1705, vol. 36, No. 6, Emerald Insight.
Zhonghua He et al., "An Optimized Passive Shimming Method for Bi-planar Permanent MRI Magnets", Applied magnetic Resonance 2017, Jun. 20, 2017, pp. 871-887, vol. 48, Springer.
Anthony Grbic et al., "Near-Field Focusing Plates and Their Design", IEEE Transactions on Antennas and Propagation, Oct. 2008, pp. 3159-3165, vol. 56, No. 10, IEEE.

\* cited by examiner

400

402 — determining one or more types of geometrical parameters for forming an array of magnet ring pairs comprising a first subarray of first magnet rings and a second subarray of second magnet rings spaced apart from the first subarray of the first magnet rings along a longitudinal axis, whereby the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray 404 — forming the array of magnet ring pairs based on the determined one or more types of geometrical parameters

FIG. 4

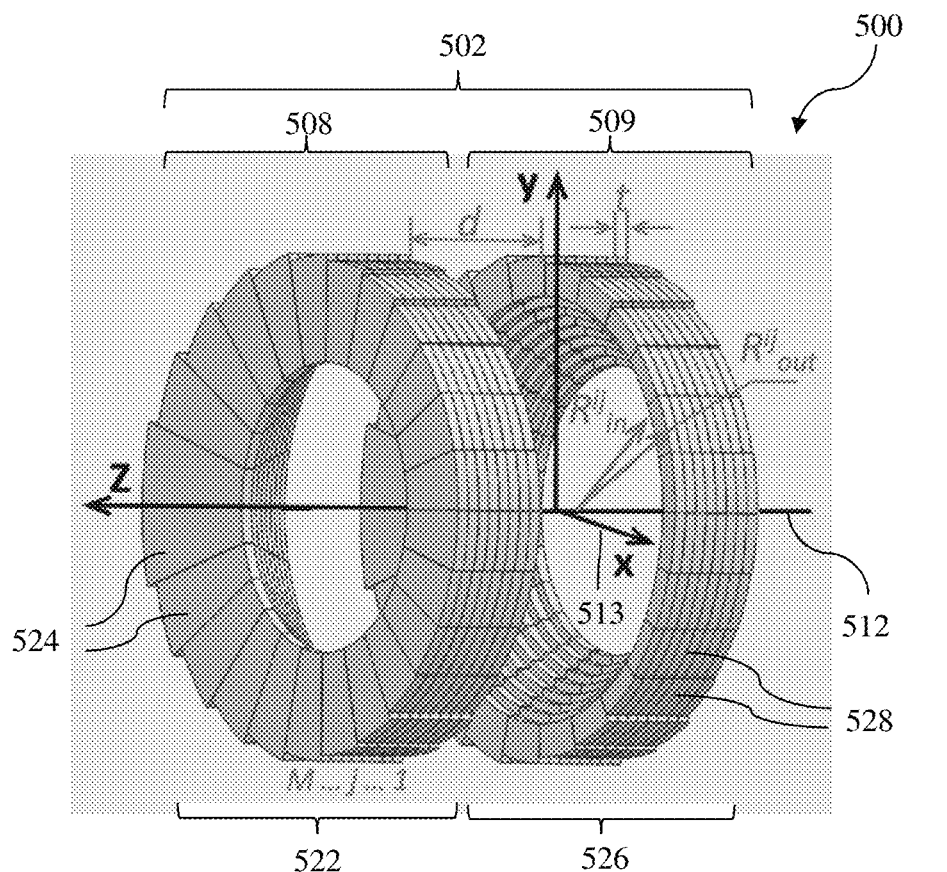

FIG. 5

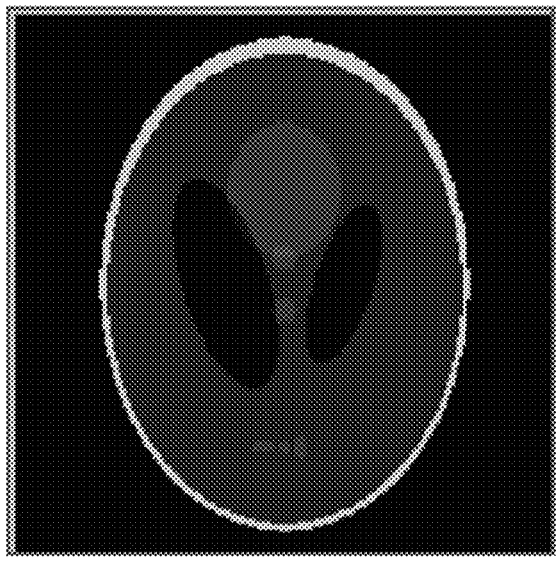
FIG. 25A
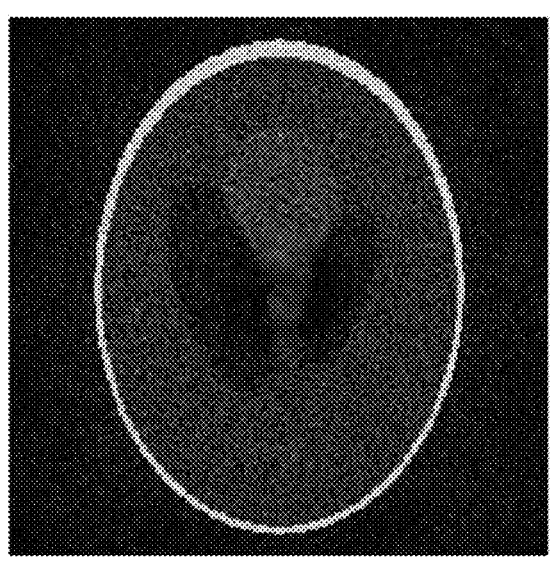
FIG. 25B
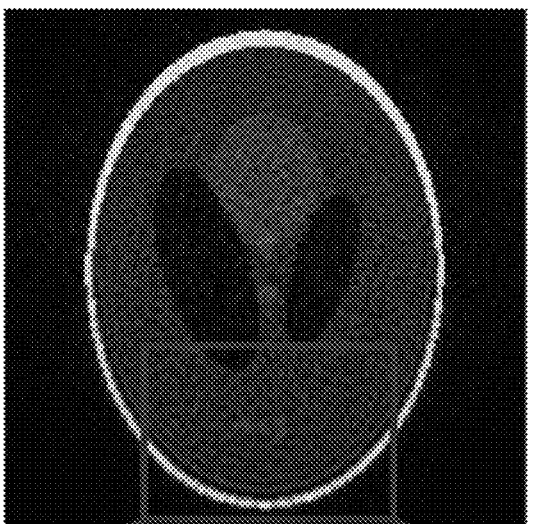
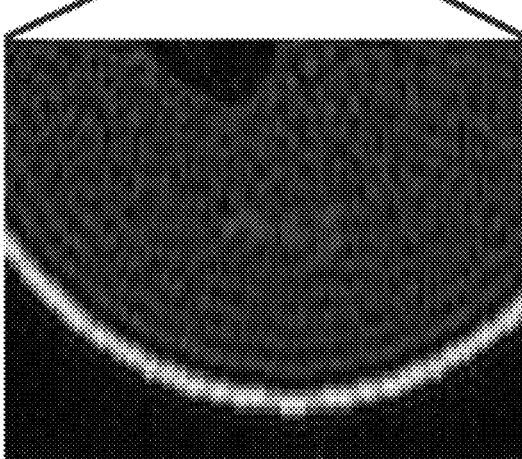
FIG. 25C
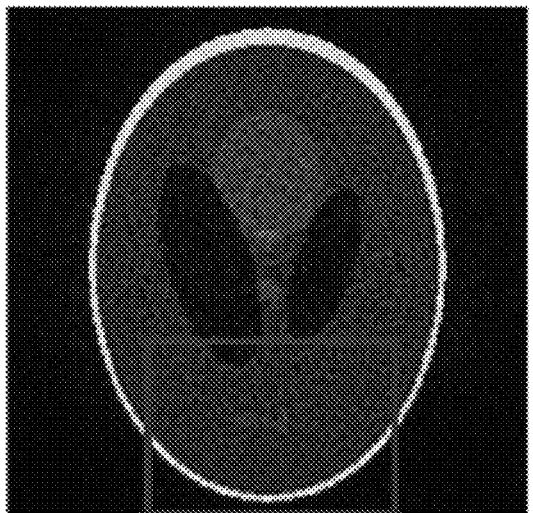
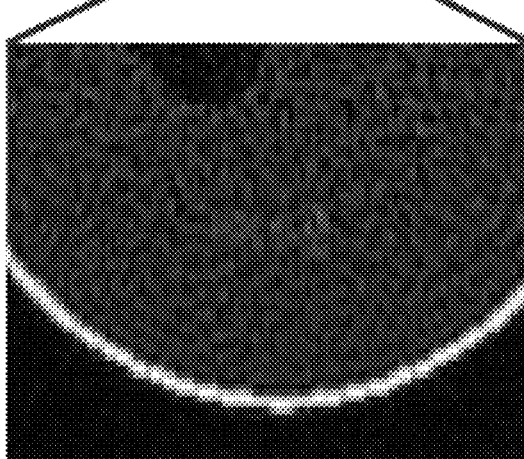
FIG. 25D

PERMANENT MAGNET SYSTEM AND METHOD OF FORMING THEREOF

CROSS-REFERENCE TO RELATED APPLICATIONS

This application is a national stage entry according to 35 U.S.C. § 371 of PCT Application No.: PCT/SG2019/050441 filed on Sep. 3, 2019, which claims the benefit of priority of Singapore Patent Application No. 10201807522U filed on Sep. 3, 2018, the contents of which are all incorporated by reference in their entirety for all purposes.

TECHNICAL FIELD

The present disclosure generally relates to a permanent magnet system and a method of forming thereof, and more particularly, for a portable magnetic resonance imaging (MRI) system.

BACKGROUND

The majority of clinical magnetic resonance imaging (MRI) scanners are based on a superconducting magnet. They are bulky, heavy, and costly to purchase, site, and maintain. Various disadvantages of conventional MRI systems have led to increasing interests in the development of a portable MRI scanner. Portable MRI scanners may provide a supplementary medical imaging solution to a moving environment (e.g., the ambulance and the field hospital), to rural areas, or to underdeveloped areas/countries due to their low cost, portability, and compatibility with patients having metallic implants compared with conventional MRI scanners based on superconducting magnets. To make an MRI scanner portable, it may be inevitable to replace the superconducting magnet that takes up a large percentage of the space of the MRI system with other mechanisms to supply the $B_0$ field. Moreover, building the MRI scanner around a part of the human body under imaging rather than a whole body coverage helps to achieve the compactness of the MRI system. On this basis, portable MRI imaging systems have been proposed by building a magnet or a magnet array and radio frequency (RF) coils around the object under scanning (e.g., head and extremities), The magnet array in such an MRI system is configured to be compact to make the MIll system compact. In such an approach, electromagnets and permanent magnet arrays may be good or suitable options to provide the $B_0$ field. However, conventional portable MRI systems have not been found to be able to generate a sufficient or desired magnetic field for imaging (MRI imaging) within a desired field of view, for example, that can accommodate a part of human body (e.g., a human head).

Furthermore, with no power consumption and low cost, permanent magnet arrays may be attractive to be used as a source of the static main magnetic field ($B_0$ field) for a portable MRI scanner. However, when a traditional imaging approach is taken with Fourier transformation and linear gradient fields, a homogeneous $B_0$ field may be required in an MRI scanner, resulting in a bulky magnet array, or if the magnet array is scaled down to a portable size, the imaging volume becomes too small to image, for example, a human organ.

A need therefore exists to provide a permanent magnet system, and a method of forming thereof, that seek to overcome, or at least ameliorate, one or more of the deficiencies or problems associated with conventional permanent magnet systems, such as, but not limited to, being able to generate a sufficient or desired magnetic field within a desired field of view (e.g., that can accommodate a part of human body, such as a human head) for imaging in a portable MRI system. It is against this background that the present disclosure has been developed.

SUMMARY

According to a first aspect of the present disclosure, there is provided a method of forming a permanent magnet system, the method including:

determining one or more types of geometrical parameters for forming an array of magnet ring pairs including a first subarray of first magnet rings and a second subarray of second magnet rings spaced apart from the first subarray of the first magnet rings along a longitudinal axis; and forming the array of magnet ring pairs based on the determined one or more types of geometrical parameters, whereby the above-mentioned determining one or more types of geometrical parameters for forming the array of magnet ring pairs is based on a genetic algorithm.

In various first embodiments, based on the genetic algorithm, said determining the one or more types of geometrical parameters for forming the array of magnetic ring pairs includes:

optimizing the one or more types of geometrical parameters for forming the array of magnetic ring pairs with respect to a field strength and a field homogeneity of a magnetic field in a longitudinal direction in a field of view within the array of magnetic ring pairs to be generated by the array of magnetic ring pairs when formed based on the determined one or more types of geometrical parameters.

In various second embodiments, the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray.

In various second embodiments, based on the genetic algorithm, the above-mentioned determining the one or more types of geometrical parameters for forming the array of magnetic ring pairs includes:

optimizing the one or more types of geometrical parameters for forming the array of magnetic ring pairs with respect to a field strength and a field homogeneity of a magnetic field in a longitudinal direction and with respect to a field monotonicity of the magnetic field in a transverse direction in a field of view within the array of magnetic ring pairs to be generated by the array of magnetic ring pairs when formed based on the determined one or more types of geometrical parameters.

According to a second aspect of the present disclosure, there is provided a permanent magnet system including:

an array of magnet ring pairs including:

a first subarray of first magnet rings; and a second subarray of second magnet rings spaced apart from the first subarray of the first magnet rings along a longitudinal axis.

In various first embodiments, the array of magnet ring pairs is configured based on one or more types of geometrical parameters determined to generate a magnetic field in the longitudinal direction in a field of view within the array of magnetic ring pairs having an average field strength of 150 mT or more and a field homogeneity of 50,000 ppm or less.

In various first embodiments, the permanent magnet system is formed by the method of forming a permanent magnet system according to various first embodiments described herein.

In various second embodiments, the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray.

In various second embodiments, the array of magnet ring pairs is configured based on one or more types of geometrical parameters to generate a magnetic field in a field of view within the array of magnetic ring pairs having an average field strength of 100 mT or more and a field homogeneity of 200,000 ppm or less in the longitudinal direction, and a field monotonicity having a field gradient of 0.40 T/m or less in the transverse direction.

In various second embodiments, the permanent magnet system is formed by the method of forming a permanent magnet system according to various second embodiments described herein.

BRIEF DESCRIPTION OF THE DRAWINGS

Embodiments of the present disclosure will be better understood and readily apparent to one of ordinary skill in the art from the following written description, by way of example only, and in conjunction with the drawings, in which:

FIG. 4 depicts a schematic flow diagram of a method of forming a permanent magnet system according to various second embodiments of the present disclosure;

FIG. 5 depicts a schematic drawing of a perspective view of a permanent magnet system according to various second embodiments of the present disclosure;

FIG. 25A depicts a Shepp-Logan 2D phantom;

FIG. 25B depicts a reconstructed image using the reference magnetic field generated by the Halbach array of FIG. 24A;

FIG. 25C depicts a reconstructed image using the $B_0$ field generated by the optimized magnet array of FIG. 21B, according to various second example embodiments of the present disclosure;

FIG. 25D depicts a reconstructed image using the reference magnetic field generated by the further optimized array with improved monotonicity in FIGS. 26A to 26E, according to various second example embodiments of the present disclosure;

DETAILED DESCRIPTION

Figure 1A:
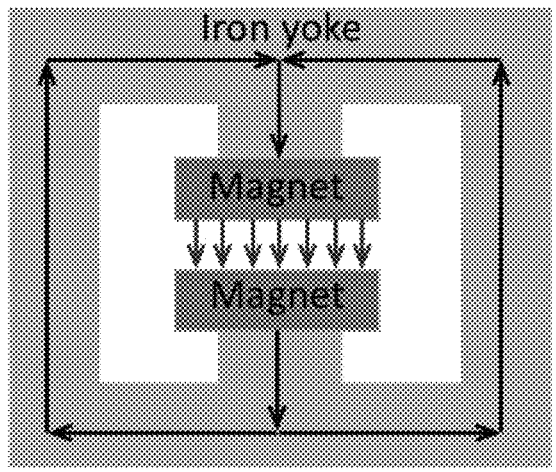
FIGS. 1A to 1D depict various types of conventional magnets.

Various embodiments of the present disclosure provide a permanent magnet system and a method of forming thereof, and more particularly, for a portable magnetic resonance imaging (MM) system. For example, as described in the background, conventional portable MRI systems have not been found to be able to generate a sufficient or desired magnetic field within a desired field of view for imaging (MIRI imaging), for example, that can accommodate a part of human body (e.g., a human head). Accordingly, various embodiments provide a permanent magnet system, and a method of forming thereof, that seek to overcome, or at least ameliorate, one or more of the deficiencies or problems associated with conventional permanent magnet system, such as but not limited to, being able to generate a sufficient or desired magnetic field within a desired field of view (e.g., that can accommodate a part of human body, such as a human head) for imaging in a portable MRI system.

According to various first embodiments, as described in the background, the majority of clinical MRI scanners are based on a superconducting magnet. They are bulky, heavy, and costly to purchase, site, and maintain. Various disadvantages of conventional MRI systems have led to increasing interests in the development of a portable MRI scanner. Portable MRI scanners may provide a supplementary medical imaging solution to a moving environment (e.g., the ambulance and the field hospital), to rural areas, or to underdeveloped areas/countries due to their low cost, portability, and compatibility with patients having metallic implants compared with conventional MRI scanners based on superconducting magnets. To make an MRI scanner portable, it may be inevitable to replace the superconducting magnet that takes up a large percentage of the space of the MRI system with other mechanisms to supply the $B_0$ field. Moreover, building the MRI scanner around a part of the human body under imaging rather than a whole body coverage helps to achieve the compactness of the MRI system. On this basis, portable MRI imaging systems have been proposed by building a magnet or a magnet array and radio frequency (RF) coils around the object under scanning (e.g., head and extremities). The magnet array in such an MRI system is configured to be compact to make the MRI system compact. In such an approach, electromagnets and permanent magnet arrays may be good or suitable options to provide the $B_0$ field. However, various first embodiments of the present disclosure note that providing such a magnet system is challenging because such a magnet system may be required to have high field strength and high field homogeneity within a desired field of view (FOV) that can accommodate parts of human body (e.g., a human head). For example, various first embodiments of the present disclosure note that a high field strength leads to high signal-to-noise ratio and thus a high spatial resolution for imaging, whereas a high homogeneity leads to a small working bandwidth and thus a possible high-quality factor (Q-factor) for the RF coils and spectrometer console. Moreover, a high homogeneity may be necessary for the use of traditional gradient coils and the application of many traditional MRI sequences.

For electromagnets, they generate static magnetic fields using DC currents. They could be installed relatively easily and can be switched off anytime. However, electromagnets are limited by a small output magnetic field and a large size. Electromagnets dissipate a considerable amount of heat, which limits the input power and consequently caps the field strength they can generate. Moreover, the size of such an electromagnet has to be much larger than a FOV. In 2015, a low-cost MRI system was introduced using an electromagnet. This custom built biplanar electromagnet has a cross-sectional outer diameter of 220 cm, a width of 90 cm, and a weight of about 340 kg for generating an average field strength of 6.5 mT and a homogeneity of about 100 ppm within a FOV with a diameter of 40 cm (e.g., head sized).

Figure 1B:
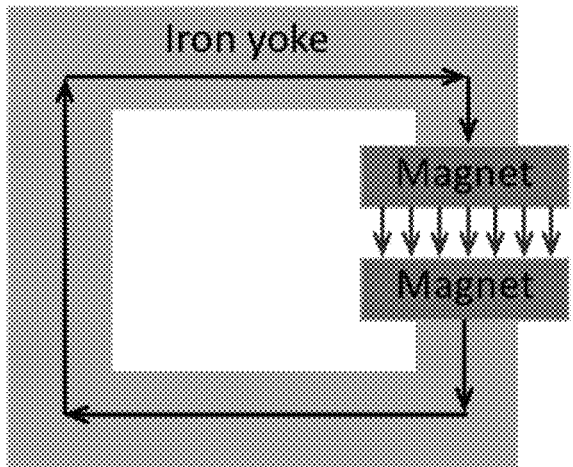

A permanent magnet system may also be an option to generate $B_0$ field with a compact size, no electric power consumption, no heat dissipation thus no cryogen system needed, and relatively low cost. Mainly, there are two types of systems that have been used for portable MRI systems. One is a magnetic circuit including two poles (with aggregated magnets) and an iron yoke. In such a system, the space between the two poles is used for imaging. The H-shaped and the C-shaped magnet yoke shown in FIGS. 1A and 1B, respectively, are the two examples of such a system. The poles include small magnet blocks stacked up. The disadvantages of such a system are that the size and weight of the system are proportional to the FOV. The iron yoke could guide and concentrate the magnetic flux, thus greatly reduce the fringe field. However, it increases the weight and size of the magnet assembly dramatically. Usually, the FOV is much smaller than the size of the magnetic poles. For a FOV of a head size, the system can take up to a room size (>30 $m^2$) and a weight over 10 tonne. A mobile MRI system has previously been developed for imaging outdoor trees based on a C-shaped magnet. The magnet assembly has a total weight of 57 kg with a gap of 80 mm. It generates a $B_0$ field with an average field strength of 0.3 T and the field homogeneity of 60 ppm in a spherical volume with a diameter of 30 mm.

Figure 1C:
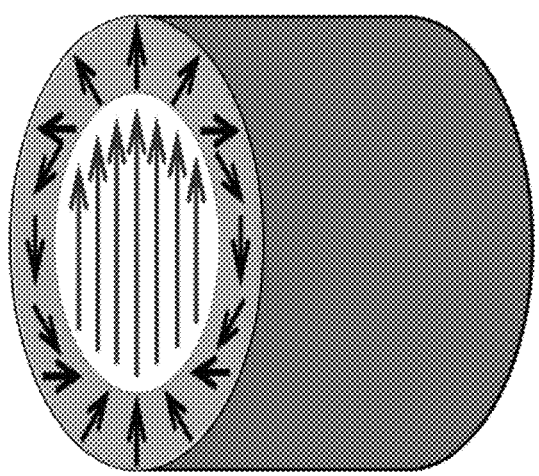

Another type of permanent magnet system is the permanent magnet array. Halbach array proposed by Halbach (e.g., see K. Halbach, "Design of permanent multiple magnets with oriented rare Earth cobalt material", *Nucl. Instrum. Methods*, vol, 169, no. 1, pp. 1-10, 1980), and the yokeless magnet ring pair proposed by Aubert (which may also be referred to as an Aubert ring pair herein) in G. Aubert, "Permanent magnet for nuclear magnetic resonance imaging equipment", U.S. Pat. No. 5,332,971, 26 Jul. 1994, the content of which being hereby incorporated by reference in its entirety for all purposes), are the two representatives of this category. They are shown in FIGS. 1C and 1D, respectively.

An ideal Halbach cylinder is an infinitely long cylindrical magnet with a continuously varying polarization in the azimuthal direction. The polarizations are indicated by the outer arrows in FIG. 1C. It generates a single directional homogeneous transverse field inside the bore of the magnet cylinder (indicated by the inner arrows in FIG. 1C), and negligible fringe fields outside. A Halbach array is an implementation of a Halbach cylinder where the cylinder is discretized in the azimuthal direction and built by using permanent magnet bars, cubes, and cylinders. The discretization makes a Halbach array relatively lightweight compared to other permanent magnet systems. However, on the other hand, the field strength and homogeneity are lowered by the sparse discretization. Shimming using small magnet cubes was proposed to compensate for the degradation caused by the discretization. In recent years, Halbach array has been used to provide the $B_0$ field in a portable MRI system. In a Halbach array, due to the transversal direction of the $B_0$ field, the existing design of RF coils for conventional MRI scanners has to be re-engineered for systems using a Halbach array.

Figure 1D:
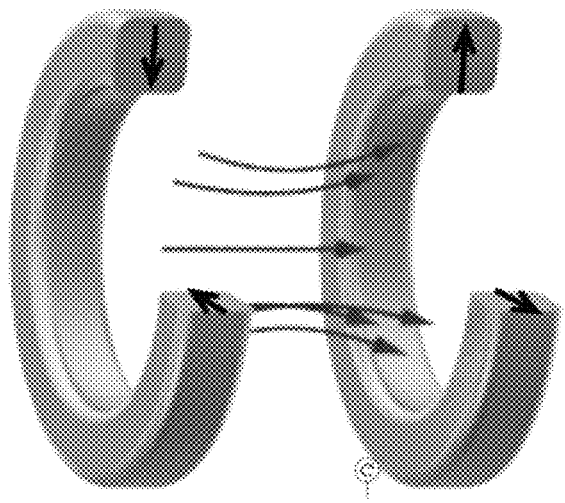

Aubert ring pair as shown in FIG. 1D includes two magnet rings with opposite radial polarization (illustrated by the outer arrows), one pointing inward and the other pointing outward. The combination of the two rings generates a confined longitudinal field (illustrated by the inner arrows) in the central volume of the structure. When it is applied for MRI imaging, since the direction of the magnetic field is the same as that in a superconducting-magnet-based MRI system, the existing designs and advancement of RF coils for conventional MRI scanners can be applied directly. However, various embodiments note that with existing designs, the homogeneities and field strength of the magnetic field are not enough, for example, for MRI imaging in a head-size FOV. For example, the development of an Aubert ring pair has previously been reported. In particular, the ring pair includes 48 identical NdFeB magnet cubes with a dimension of 12×12×12 mm, and produces a magnetic field with an average field strength of 100 mT and a field homogeneity of 40 ppm in a volume of 5 $mm^3$. The magnet assembly has a bore of 52 mm diameter. Therefore, such an Aubert ring pair does not generate a magnetic field having sufficient homogeneities and field strength for, for example, MRI imaging in a head-size FOV.

Accordingly, in various first embodiments, the design and optimization of a ring-pair permanent magnet array are disclosed for imaging (e.g., head imaging) in a portable MRI system. The design may be based on the Aubert ring pair. In the design process, according to various embodiments, a genetic algorithm (GA) is applied for the optimization of field strength and homogeneity in, for example, a cylindrical FONT of 200 mm in diameter and 50 mm in length at the center of the magnet bore. In the optimization loop, according to various first embodiments, a simplified current model (which may also be referred to herein as a current density model) is provided to accelerate the calculation or determination of the magnetic field with accuracy.

Figure 2:
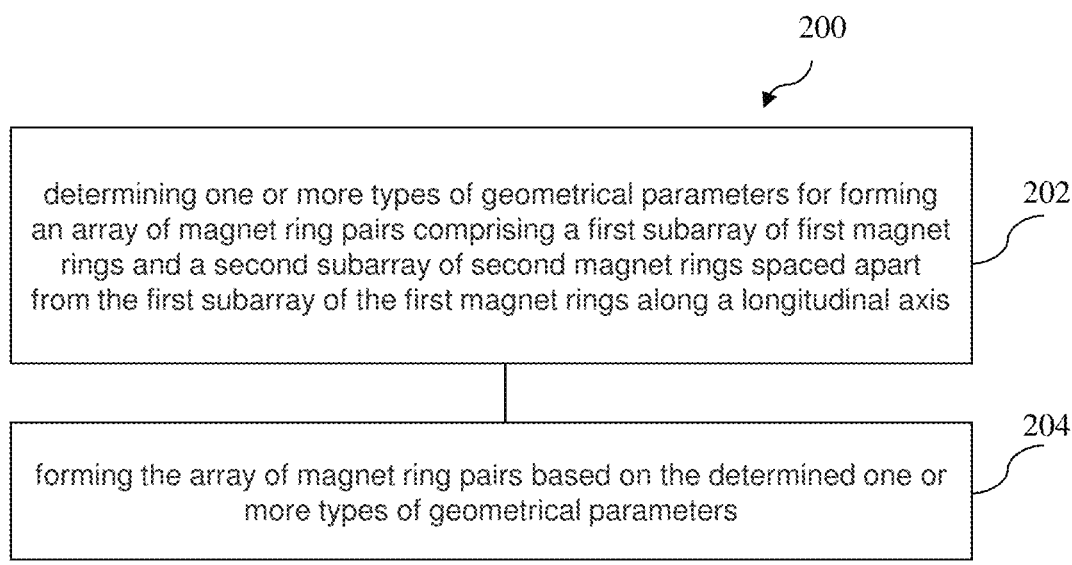
FIG. 2 depicts a schematic flow diagram of a method of forming a permanent magnet system according to various first embodiments of the present disclosure.

FIG. 2 depicts a schematic flow diagram of a method 200 of forming a permanent magnet system according to various first embodiments of the present disclosure. The method 200 includes: determining (at 202) one or more types of geometrical parameters for forming an array of magnet ring pairs including a first subarray of first magnet rings and a second subarray of second magnet rings spaced apart from the first subarray of the first magnet rings along a longitudinal axis; and forming (at 204) the array of magnet ring pairs based on the determined one or more types of geometrical parameters, whereby the above-mentioned determining one or more types of geometrical parameters for forming the array of magnet ring pairs is based on a genetic algorithm.

In various first embodiments, the longitudinal axis may be a longitudinal axis of the array of magnet ring pairs, and may be referred to as a z-axis of a three-dimensional (3D) Cartesian coordinate system (having x-axis, y-axis and z-axis).

In various first embodiments, in relation to 204, the first magnet rings in the first subarray are formed or arranged in series and adjacent (immediately adjacent) first magnet rings therein are in contact (via their cross-sectional or planar surfaces facing each other) with each other. Similarly, the second magnet rings in the second subarray are formed or arranged in series and adjacent (immediately adjacent) second magnet rings therein are in contact (Via their cross-sectional or planar surfaces facing each other) with each other.

Forming a permanent magnet system including an array of magnet ring pairs including a first sub array of first magnet rings and a second sub array of second magnet rings spaced apart from the first subarray of the first magnet rings along the longitudinal axis in the manner as described herein according to various first embodiments (based on the determined one or more types of geometrical parameters) has been advantageously found to be able to generate a sufficient or desired magnetic field within a desired field of view (e.g., that can accommodate a part of human body, such as a human head)) for imaging in a portable MRI system, such as a magnetic field in a longitudinal direction within the desired field of view having a field strength (or average field strength) of 150 mT or more and a field homogeneity of 50,000 ppm (parts per million) or less. By way of an example and without limitation, an example permanent magnet system was advantageously found to be able to generate a longitudinal main static magnetic field with an average field strength of 169.7 mT and a homogeneity of 24,786 ppm in a field of view (cylindrical field of view) with a diameter of 200 mm and a thickness of 50 mm, as will be described later according to various first example embodiments. For example, this is a significant increase in field homogeneity by about 80% compared to a traditional ring-pair structure of the same or similar dimension and mass while still maintaining a similar field strength.

In various first embodiments, based on the genetic algorithm, the above-mentioned determining the one or more types of geometrical parameters for forming the array of magnetic ring pairs includes: optimizing the one or more types of geometrical parameters for forming the array of magnetic ring pairs with respect to a field strength and a field homogeneity of a magnetic field in a longitudinal direction in a field of view within the array of magnetic ring pairs to be generated by the array of magnetic ring pairs when formed based on the determined one or more types of geometrical parameters.

In various first embodiments, based on the genetic algorithm, the above-mentioned optimizing the one or more types of geometrical parameters for forming the array of magnetic ring pairs includes: obtaining a plurality of test configurations for forming the array of magnetic ring pairs, each test configuration including a test set of geometrical parameters relating to the one or more types of geometrical parameters being optimized for forming the array of magnetic ring pairs; and determining, for each of the plurality of test configurations, a field strength and a field homogeneity of a magnetic field in the longitudinal direction in the field of view within the array of magnet ring pairs having the test configuration.

In various first embodiments, the above-mentioned determining, for each of the plurality of test configurations, the field strength and the field homogeneity of the magnetic field includes determining, for each of the plurality of test configurations, the magnetic field for the array of magnetic ring pairs having the test configuration based on a current density model for each magnet ring in the array of magnetic ring pairs having the test configuration.

In various first embodiments, the current density model is based on a first equivalent surface current source relating to a first surface of the magnet ring facing a first direction substantially parallel to the longitudinal axis and a second equivalent surface current source relating to a second surface of the magnet ring facing a second direction, opposite to the first direction, substantially parallel to the longitudinal axis.

In various first embodiments, the current density model is simplified by configuring the current density model to determine the magnetic field for each magnet ring in the array of magnet ring pairs having the test configuration to be symmetric about the longitudinal axis.

In various first embodiments, the above-mentioned optimizing the one or more types of geometrical parameters for forming the array of magnetic ring pairs further includes: determining, for each of the plurality of test configurations, a fitness measure (e.g., a measure indicating a degree of fit) of the field strength and the field homogeneity of the magnetic field determined based on the current density model for the array of magnetic ring pairs having the test configuration; and determining whether the fitness measures determined for the plurality of test configurations satisfy a predetermined condition. In this regard, if the fitness measures satisfy the predetermined condition, the above-mentioned optimizing the one or more types of geometrical parameters for forming the array of magnetic ring pairs further includes selecting one of the plurality of test configurations as the determined one or more types of geometrical parameters for the array of magnet ring pairs. On the other hand, if the fitness measures do not satisfy the predetermined condition, the above-mentioned optimizing the one or more types of geometrical parameters for forming the array of magnetic ring pairs further includes: generating a plurality of offspring configurations based on a selected number of the plurality of test configurations; mutating and crossovering the plurality of offspring configurations generated; and determining, for each of the plurality of offspring configurations, a field strength and a field homogeneity of a magnetic field in the longitudinal direction in the field of view within the array of magnet ring pairs having the offspring configuration.

Accordingly, based on the genetic algorithm, the above-mentioned optimizing the one or more types of geometrical parameters may be an iterative process and continues until the predetermined condition is satisfied.

In various first embodiments, the above-mentioned forming the array of magnet ring pairs includes forming the array of magnet ring pairs based on the determined one or more types of geometrical parameters to generate a magnetic field in the longitudinal direction in the field of view within the array of magnetic ring pairs having an average field strength of 150 mT or more and a field homogeneity of 50,000 ppm or less. In various first embodiments, the average field strength may be 160 mT or more, 180 mT or more, 200 mT or more, or in the range of 150 mT to 500 mT. In various embodiments the field homogeneity may be 40,000 ppm or less, 35,000 ppm or less, 30,000 ppm or less, 25,000 ppm or less, 20,000 ppm or less, 15,000 ppm or less, 10,000 ppm or less, or in the range of 5,000 ppm to 50,000 ppm.

In various first embodiments, the one or more types of geometrical parameters for the array of magnet ring pairs includes one or more types of geometrical parameters for each magnet ring pair of the array of magnet ring pairs.

In various first embodiments, each magnet ring in the first and second subarrays is in the form of a hollow cylinder, and hence has a general ring shape. In various first embodiments, the hollow cylinder may be defined by a plurality of geometrical parameters including an inner radius parameter relating to an inner radius of the hollow cylinder, an outer radius parameter relating to an outer radius of the hollow cylinder, and a thickness (or height) parameter relating to a thickness (or height) of hollow cylinder.

In various first embodiments, the one or more types of geometrical parameters for each magnet ring pair is selected from a group consisting of an inner radius parameter relating to an inner radius of the magnet ring pair, an outer radius parameter relating to an outer radius of the magnet ring pair, and a thickness parameter relating to a thickness of each magnet ring in the magnet ring pair.

In various first embodiments, the one or more types of geometrical parameters for the array of magnet ring pairs further includes a number parameter relating to a number of ring pairs in the array of magnet ring pairs, and a distance parameter relating to a distance in which the first subarray and the second subarray is spaced apart along the longitudinal axis.

In various first embodiments, the one or more types of geometrical parameters is at least multiple types of geometrical parameters, that is, 2 or more types of geometrical parameters.

In various first embodiments, the one or more types of geometrical parameters include the inner radius parameter and the distance parameter.

In various embodiments, each magnet ring pair in the array of magnet ring pairs is an Aubert ring pair. In various first embodiments, each first magnet ring in the first subarray has a first direction of radial polarization, and each second magnet ring in the second subarray has a second direction of radial polarization, whereby the first and second directions are opposite in direction (e.g., an inward radial polarization and an outward radial polarization).

Figure 3:
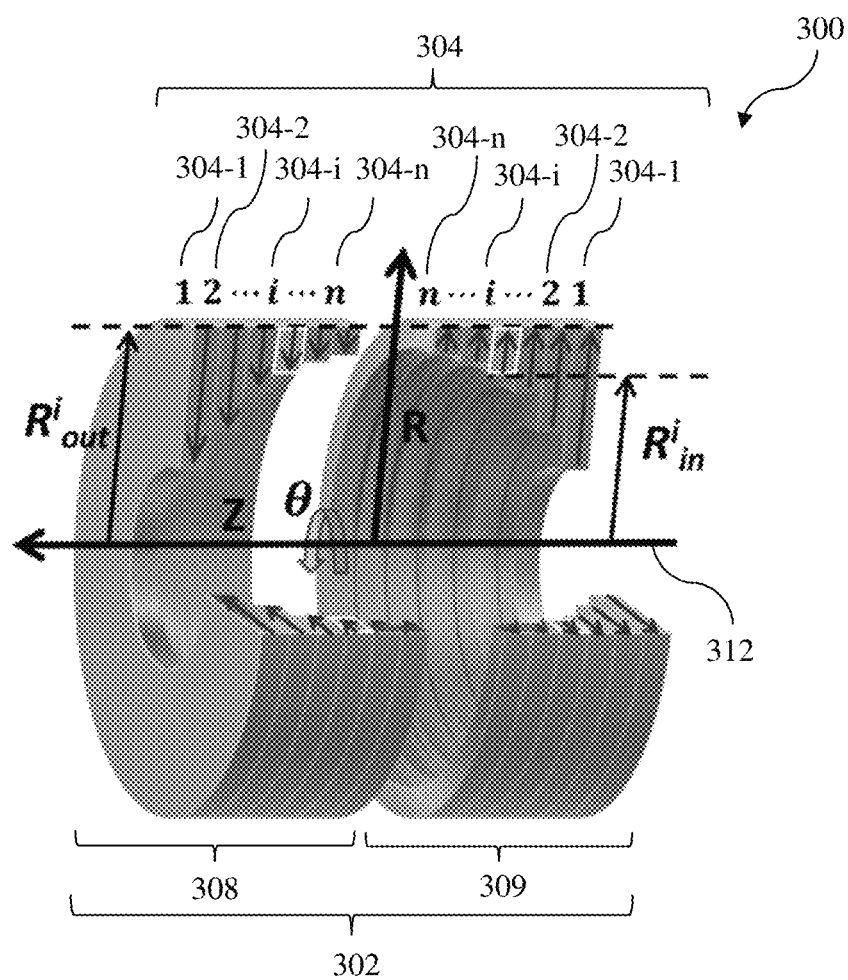
FIG. 3 depicts a schematic drawing of a perspective view of a permanent magnet system according to various first embodiments of the present disclosure.

FIG. 3 depicts a schematic drawing of a perspective view of a permanent magnet system 300 according to various first embodiments of the present disclosure, such as corresponding to the permanent magnet system formed by the method 200 of forming a permanent magnet system as described hereinbefore with reference to FIG. 2. The permanent magnet system 300 includes: an array 302 of magnet ring pairs 304 (304-1, 304-2, ..., 304-$i$, ..., 304-$n$) including: a first subarray 308 of first magnet rings; and a second subarray 309 of second magnet rings spaced apart from the first subarray 308 of the first magnet rings along a longitudinal axis 312.

In various first embodiments, the array 302 of magnet ring pairs 304 is configured based on one or more types of geometrical parameters determined to generate a magnetic field in the longitudinal direction 312 in a field of view within the array 302 of magnetic ring pairs 304 having an average field strength of 150 mT or more and a field homogeneity of 50,000 ppm or less.

In various first embodiments, the permanent magnet system 300 is formed according to the method 200 of forming a permanent magnet system as described hereinbefore with reference to FIG. 2, therefore, various features of the permanent magnet system 300 may correspond to (e.g., the same as) those of the permanent magnet system formed by the method 200 as described hereinbefore according to various first embodiments, and thus need not be repeated with respect to the permanent magnet system 300 as shown in FIG. 3 for clarity and conciseness. In other words, various first embodiments described herein in context of the method 200 as shown in FIG. 2 are analogously valid for the permanent magnet system 300 shown in FIG. 3, and vice versa.

As mentioned hereinbefore, such a permanent magnet system including an array of magnet ring pairs including a first subarray of first magnet rings and a second subarray of second magnet rings spaced apart from the first subarray of the first magnet rings along a longitudinal axis, according to various first embodiments has been advantageously found to be able to generate a sufficient or desired magnetic field within a desired field of view (e.g., that can accommodate a part of human body, such as a human head) for imaging in a portable MRI system.

According to various second embodiments, as also described in the background, with no power consumption and low cost, permanent magnet arrays may be attractive to be used as a source of the static main magnetic field ($B_0$ field) for a portable MRI scanner. However, when a traditional imaging approach is taken with Fourier transformation and linear gradient fields, homogeneous $B_0$ field may be required in an MRI scanner, resulting in a bulky magnet array, or if the magnet array is scaled down to a portable size, the imaging volume becomes too small to image, for example, a human organ. Recently, nonlinear gradient fields have been proposed to be used as spatial encoding magnetic fields (SEMs) for MRI image reconstructions to overcome physiological limitations of the conventional spatial linear gradient setup, e.g., to reduce peripheral nerve stimulation. Some examples are the parallel imaging technique using localized gradients (PatLoc) imaging, and O-space imaging. In these approaches, as static field patterns without spatial linearity can be used to encode MRI signals for imaging, the requirements for the homogeneity of the static field may be relaxed. When a permanent magnet array is used to supply the $B_0$ field, it allows an array with a reduced size, reduced weight to have a bigger imaging volume which may accommodate a part of human body, such as a head. It offers opportunities of constructing a truly portable low-cost MRI scanner.

A sparse dipolar Halbach array (also named "NMR Mandhala") has been disclosed and was used to supply a SEM (the main field plus the gradient field) with a quadrupolar field pattern in the transverse direction for head imaging with a portability. The SEM from a sparse Halbach array is curvilinear and nonbijective, so the sensitivity encoding (SENSE) using multiple receiver coils was applied to resolve the spatial ambiguity. Furthermore, the magnet array was rotated to obtain a variation of $B_0$ field relative to the sample, so as to provide additional spatial encoding information to localize the MR signal. Although the ambiguity is mitigated by using multiple receive coils and by rotating the magnet, there is substantial blurring in the central region of the imaging volume, for the central region of the quadrupolar SEMs is relatively homogeneous. Moreover, in the region with low or zero gradients, the image quality can greatly be degraded. It was reported that a shorter sparse Halbach array may be implemented for MR imaging. However, similar problems of imaging due to the nonbijective encoding $B_0$-fields were encountered. In such an MRI system where a permanent magnet array is used, various second embodiments note that monotonic SEMs with a relatively linear gradient may be preferred to have an increased image quality.

There are other designs of magnets that have reported to generate linear SEMs in the literature. It is commonly seen in single-sided or unilateral NMR/MRI systems for one-dimensional profiling near the surface of a magnet. Examples in this category are a horseshoe magnet, a magnet array including many small magnet blocks with the optimized arrangement, a single-bar magnet, a single magnet topped with a shaped iron pole cap, and a Halbach cylinder when the stray field outside the cylinder is used. For the magnets reported for single-sided or unilateral NMR/MRI systems, although the SEMs are linear, the field of view (FoV) is usually limited to the region close to the surface of the magnets, which is not large enough to accommodate and image a large sample (e.g., a human head). A Halbach array allows a relatively large FoV when the inner field is used. Besides the optimization for a monotonic field reported, it has previously been proposed to concentrically nested dipolar and quadrupolar Halbach cylinders, obtaining constant gradients for MRI imaging. For example, the proposed nested Halbach cylinders theoretically shows an average field strength of 0.45 T in a circular region with a diameter of 20 mm, and the gradients in FoV can be varied from 44.5 to 53.0 mT/m.

For a Halbach array, the magnetic field it supplies is in the transverse plane of the array cylinder, where the designs of traditional radiofrequency (RF) coils cannot be applied directly. A ring-pair magnet array 302 is provided as described according to various first embodiments, showing a longitudinal field with a relatively high field strength and homogeneity in a cylindrical FoV (e.g., a diameter of 20 cm and a length of 5 cm). The ring-pair magnet array 302 may include multiple ring pairs 304 with different inner and/or outer radii according to various first embodiments. For a single ring pair, it may have one ring that has the magnetization pointing radially inward and the other one pointing radially outward. The single ring pair was extended to a two ring-pair structure in G. Aubert, "Cylindrical permanent magnet with longitudinal induced field", U.S. Pat. No. 5,014,032 A, 7 May 1991, the content of which being hereby incorporated by reference in its entirety for all purposes), to obtain a homogeneous field for MRI. This design was further extended to an array of magnet ring pairs (e.g., 10 ring pairs) to generate a relatively strong SEM with a relatively low inhomogeneity for non-linear imaging for MRI, as described according to various first embodiments. According to various first embodiments, such a ring pair may be called inward-outward ring pair (IO ring pair) to identify its characteristics. The field pattern generated by the IO ring-pair magnet array 302 according to various first embodiments may be concentric which intrinsically spatially encodes the NMR/MRI signal in the radial direction. For this design or configuration according to various first embodiments, the encoding along the θ-direction may be missing or omitted. To achieve a 2D spatial encoding, according to various first embodiments, one method is to apply coil sensitivity encoding provided by rotating receiving coils to obtain additional information in the θ-direction. In various other embodiments, a rotating encoding magnet block (or blocks) may be introduced to break the axial symmetry of the magnetic field to bring additional encoding information in the θ-direction for 2D imaging.

Accordingly, in various second embodiments, the IO ring-pair magnet array 302 according to various first embodiments may be further optimized to obtain a 1D monotonic field pattern to favor the image reconstruction, on top of having a relatively high field strength and the acceptable field inhomogeneity along the longitudinal direction. To achieve this goal, according to various second embodiments, the ring pair may be discretized into ring segment pairs for optimization, resulting in irregular-shaped rings. The resultant IO ring-pair magnet array design or configuration may be referred to herein as an irregular-shaped IO ring-pair magnet array. According to various second embodiments, a genetic algorithm was applied (e.g., in the same or similar manner as various first embodiments and a current model (which may also be referred to as a current density model) for a ring segment pair (may also be referred to as a fan-shaped pair) is derived and used for a fast forward calculation of the magnetic field in the optimization.

FIG. 4 depicts a schematic flow diagram of a method 400 of forming a permanent magnet system according to various second embodiments, the method 400 including: determining (at 402) one or more types of geometrical parameters for forming an array of magnet ring pairs including a first subarray of first magnet rings and a second subarray of second magnet rings spaced apart from the first subarray of the first magnet rings along a longitudinal axis, whereby the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray; and forming (at 404) the array of magnet ring pairs based on the determined one or more types of geometrical parameters, whereby the above-mentioned determining one or more types of geometrical parameters for forming the array of magnet ring pairs is based on a genetic algorithm.

In various second embodiments, the same as various first embodiments, the longitudinal axis may be a longitudinal axis of the array of magnet ring pairs, and may be referred to as a z-axis of a three-dimensional (3D) Cartesian coordinate system (having x-axis, y-axis and z-axis).

In various second embodiments, in relation to 404, the same as various first embodiments, the first magnet rings in the first subarray are formed or arranged in series and adjacent (immediately adjacent) first magnet rings therein are in contact (via their cross-sectional or planar surfaces facing each other) with each other. Similarly, the second magnet rings in the second subarray are formed or arranged in series and adjacent (immediately adjacent) second magnet rings therein are in contact (via their cross-sectional or planar surfaces facing each other) with each other.

Forming a permanent magnet system including an array of magnet ring pairs including a first sub array of first magnet rings and a second sub array of second magnet rings spaced apart from the first subarray of the first magnet rings along the longitudinal axis, whereby the first subarray of the first magnet rings is segmented into a first subarray of first ring segments about the longitudinal axis and the second subarray of the second magnet rings is segmented into a second subarray of second ring segments about the longitudinal axis in the manner as described herein according to various second embodiments (based on the determined one or more types of geometrical parameters) has been advantageously found to be able to generate a sufficient or desired magnetic field within a desired field of view (e.g., that can accommodate a part of human body, such as a human head)) for imaging in a portable MRI system, such as a magnetic field having a field strength (or average field strength) of 100 mT or more, a field homogeneity of 200,000 ppm (parts per million) or less in a longitudinal direction, and a field monotonicity having a field gradient of 0.40 Tim or less in a transverse direction (e.g., along the x-axis) in the desired field of view in the desired field of view. By way of an example and without limitation, an example permanent magnet system was advantageously found to be able to generate a longitudinal main static magnetic field with an average field strength of 132.98 mT and a field homogeneity of 151,840 ppm in a field of view (cylindrical field of view) with a diameter of 200 min and a thickness (or length) of 50 mm, as will be described later according to various example second embodiments.

In various second embodiments, based on the genetic algorithm, the above-mentioned determining the one or more types of geometrical parameters for forming the array of magnetic ring pairs includes: optimizing the one or more types of geometrical parameters for forming the array of magnetic ring pairs with respect to a field strength and a field homogeneity of a magnetic field in a longitudinal direction and with respect to a field monotonicity of the magnetic field in a transverse direction in a field of view within the array of magnetic ring pairs to be generated by the array of magnetic ring pairs when formed based on the determined one or more types of geometrical parameters.

In various second embodiments, in general, the genetic algorithm performs or functions in a similar or the same manner as in various first embodiments described herein, except that the one or more types of geometrical parameters are optimized additionally with respect to a field monotonicity of the magnetic field in a transverse direction in a field of view within the array of magnetic ring pairs.

In various second embodiments, based on the genetic algorithm, the above-mentioned optimizing the one or more types of geometrical parameters for forming the array of magnetic ring pairs includes: obtaining a plurality of test configurations for forming the array of magnetic ring pairs, each test configuration including a test set of geometrical parameters relating to the one or more types of geometrical parameters being optimized for forming the array of magnetic ring pairs; and determining, for each of the plurality of test configurations, a field strength and a field homogeneity of a magnetic field in the longitudinal direction and with respect to a field monotonicity of the magnetic field in the transverse direction in the field of view within the array of magnetic ring pairs having the test configuration.

In various second embodiments, the above-mentioned determining, for each of the plurality of test configurations, the field strength, the field homogeneity and the field monotonicity of the magnetic field includes determining, for each of the plurality of test configurations, the magnetic field for the array of magnetic ring pairs having the test configuration based on a current density model for each ring segment of each magnet ring in the array of magnetic ring pairs having the test configuration.

In various second embodiments, the current density model is based on a first equivalent surface current source relating to a first surface of the ring segment facing a first direction substantially parallel to the longitudinal axis, a second equivalent surface current source relating to a second surface of the ring segment facing a second direction, opposite to the first direction, substantially parallel to the longitudinal axis, a third equivalent surface current source relating to a third surface of the ring segment between the first and second surfaces, and a fourth surface of the ring segment between the first and second surfaces and opposite to the third surface.

In various second embodiments, the current density model is simplified by configuring the current density model to generate the magnetic field for each ring segment of each magnet ring in the array of magnet ring pairs having the test configuration, including setting each magnet ring pair of the array of magnet ring pairs to have an inner radius parameter relating to an inner radius of the magnet ring pair to taper (e.g., incrementally increasing) from an outermost magnet ring pair to an innermost magnet ring pair of the array of magnet ring pairs.

In various second embodiments, the current density model is further simplified by configuring the current density model to determine the magnetic field for each ring segment of each magnet ring in the array of magnet ring pairs having the test configuration to be symmetric with respect to a plane perpendicular to the longitudinal axis and about the transverse axis.

In various second embodiments, the above-mentioned optimizing the one or more types of geometrical parameters for forming the array of magnetic ring pairs further includes: determining, for each of the plurality of test configurations, a fitness measure (e.g., a measure indicating a degree of fit) of the field strength, the field homogeneity and the field monotonicity of the magnetic field determined based on the current density model for the array of magnetic ring pairs having the test configuration; and determining whether the fitness measures determined for the plurality of test configurations satisfy a predetermined condition. In this regard, if the fitness measures satisfy the predetermined condition, the above-mentioned optimizing the one or more types of geometrical parameters for forming the array of magnetic ring pairs further includes selecting one of the plurality of test configurations as the determined one or more types of geometrical parameters for the array of magnet ring pairs. On the other hand, if the fitness measures do not satisfy the predetermined condition, the above-mentioned optimizing the one or more types of geometrical parameters for forming the array of magnetic ring pairs further includes: generating a plurality of offspring configurations based on a selected number of the plurality of test configurations; mutating and crossovering the plurality of offspring configurations generated; and determining, for each of the plurality of offspring configurations, a field strength and a field homogeneity of a magnetic field in the longitudinal direction and with respect to a field monotonicity of the magnetic field in the transverse direction in the field of view within the array of magnetic ring pairs having the offspring configuration.

Accordingly, based on the genetic algorithm, similar or the same as various first embodiments, the above-mentioned optimizing the one or more types of geometrical parameters may be an iterative process and continues until the predetermined condition is satisfied.

In various second embodiments, the above-mentioned forming the array of magnet ring pairs includes forming the array of magnet ring pairs based on the determined one or more types of geometrical parameters to generate a magnetic field in the field of view within the array of magnetic ring pairs having an average field strength of 100 mT or more and a field homogeneity of 200,000 ppm or less in the longitudinal direction, and a field monotonicity having a field gradient of 0.40 T/m or less in the transverse direction. In various second embodiments, the average field strength may be 120 mT or more, 140 mT or more, 160 mT or more, 180 mT or more, or in the range of 100 mT to 300 mT. In various embodiments the field homogeneity may be 180,000 ppm or less, 150,000 ppm or less, 120,000 ppm or less, 100,000 ppm or less, or in the range of 50,000 ppm to 200,000 ppm. In various embodiments, the field gradient may be in the range of 0.36 T/m or less, 0.30 T/m or less, 0.26 T/m or less, 0.23 T/m or less, 0.20 T/m or less, or in the range of 0.10 T/m to 0.40 T/m.

In various second embodiments, the one or more types of geometrical parameters for the array of magnet ring pairs includes one or more types of geometrical parameters for each ring segment of each magnet ring pair of the array of magnet ring pairs.

In various second embodiments, the one or more types of geometrical parameters for each ring segment is selected from a group consisting of an inner radius parameter relating to an inner radius of the ring segment, an outer radius parameter relating to an outer radius of the ring segment, a step reduction parameter relating to a step reduction of the outer radius of the ring segment, and a tapering order parameter relating to an order of a tapering function associated with the ring segment.

In various second embodiments, the one or more types of geometrical parameters for the array of magnet ring pairs further includes a number parameter relating to a number of ring segments in each of the first subarray of the first magnet rings and the second subarray of the second magnet rings, and a distance parameter relating to a distance in which the first subarray of the first magnet rings and the second subarray of the second magnet rings are spaced apart along the longitudinal axis.

In various first embodiments, the one or more types of geometrical parameters is at least multiple types of geometrical parameters, that is, 2 or more types of geometrical parameters.

In various second embodiments, the one or more types of geometrical parameters include the outer radius parameter, the step reduction parameter, and the tapering order parameter.

In various second embodiments, each magnet ring pair in the array of magnet ring pairs is an Aubert ring pair. In various second embodiments, each first magnet ring in the first subarray has a first direction of radial polarization, and each second magnet ring in the second subarray has a second direction of radial polarization, whereby the first and second directions are opposite in direction (e.g., an inward radial polarization and an outward radial polarization).

FIG. 5 depicts a schematic drawing of a perspective view of a permanent magnet system 500 according to various second embodiments of the present disclosure, such as corresponding to the permanent magnet system formed by the method 400 of forming a permanent magnet system as described hereinbefore with reference to FIG. 4 according to various second embodiments. The permanent magnet system 500 includes: an array 502 of magnet ring pairs including: a first subarray 508 of first magnet rings; and a second subarray 509 of second magnet rings spaced apart from the first subarray 508 of the first magnet rings along a longitudinal axis 512. Furthermore, the first subarray 508 of the first magnet rings is segmented into a first subarray 522 of first ring segments 524 about the longitudinal axis 512 and the second subarray 509 of the second magnet rings is segmented into a second subarray 526 of second ring segments 528 about the longitudinal axis 512. As can be seen from FIG. 5, each first ring segment 524 extends through all first magnet rings in the first subarray 508, and each second ring segment 528 extends through all second magnet rings in the second subarray 509.

In various second embodiments, each magnet ring pair of the array of magnet ring pairs is configured to have an inner radius parameter relating to an inner radius of the magnet ring pair tapering (e.g., incrementally increasing) from an outermost magnet ring pair to an innermost magnet ring pair of the array of magnet ring pairs.

In various second embodiments, the array of magnet ring pairs is configured based on one or more types of geometrical parameters to generate a magnetic field in a field of view within the array of magnetic ring pairs having an average field strength of 100 mT or more and a field homogeneity of 200,000 ppm or less in the longitudinal direction (e.g., parallel to the longitudinal axis 512 (or z-axis)), and a field monotonicity having a field gradient of 0.40 T/m or less in the transverse direction (e.g., parallel to the transverse axis 513 (or x-axis)).

In various second embodiments, the permanent magnet system 500 is formed by the method 400 of forming a permanent magnet system as described hereinbefore with reference to FIG. 4, therefore, various features of the permanent magnet system 500 may correspond to (e.g., the same as) those of the permanent magnet system formed by the method 400 as described hereinbefore according to various second embodiments, and thus need not be repeated with respect to the permanent magnet system 500 as shown in FIG. 5 for clarity and conciseness. In other words, various second embodiments described herein in context of the method 400 as shown in FIG. 4 are analogously valid for the permanent magnet system 400 shown in FIG. 5, and vice versa.

Figure 6:
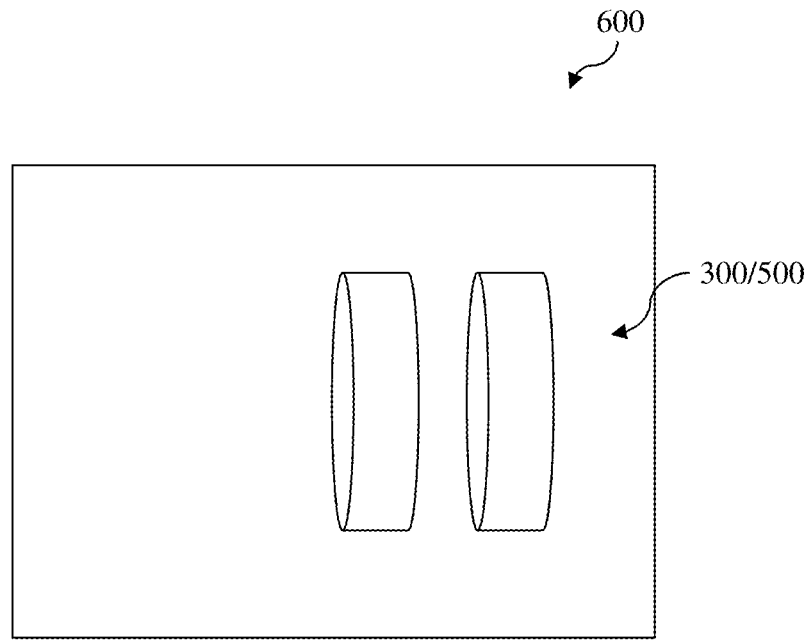
FIG. 6 depicts a schematic drawing of a MRI system according to various embodiments of the present disclosure.

FIG. 6 depicts a schematic drawing of a MRI system 600 according to various embodiments of the present disclosure. In various embodiments, the MRI system 600 is a portable MRI system. The MRI system 600 includes a permanent magnet system 300 as described herein with reference to FIG. 3 according to various first embodiments or a permanent magnet system 500 as described herein with reference to FIG. 5 according to various second embodiments, configured to generate or produce a magnetic field for MRI. It will be appreciated by a person skilled in the art that various components of a MRI system are known in the art, and thus various components known in the art need not be described with respect to the system 200 for clarity and conciseness. For example, it will be appreciated to a person skilled in the art that the MRI system 600 may be based on an existing MRI system as desired or as appropriate, but with the permanent magnet system replaced with the permanent magnet system 300 or 500 according to various first or second embodiments of the present disclosure. It will also be appreciated to a person skilled in the art that various modifications may be made to such an MRI system as desired or as appropriate without going beyond the scope of the present disclosure, such as a reduction in the size of the MRI system enabled by the permanent magnet system 300 or 500 according to various first or second embodiments of the present disclosure.

Figure 7:
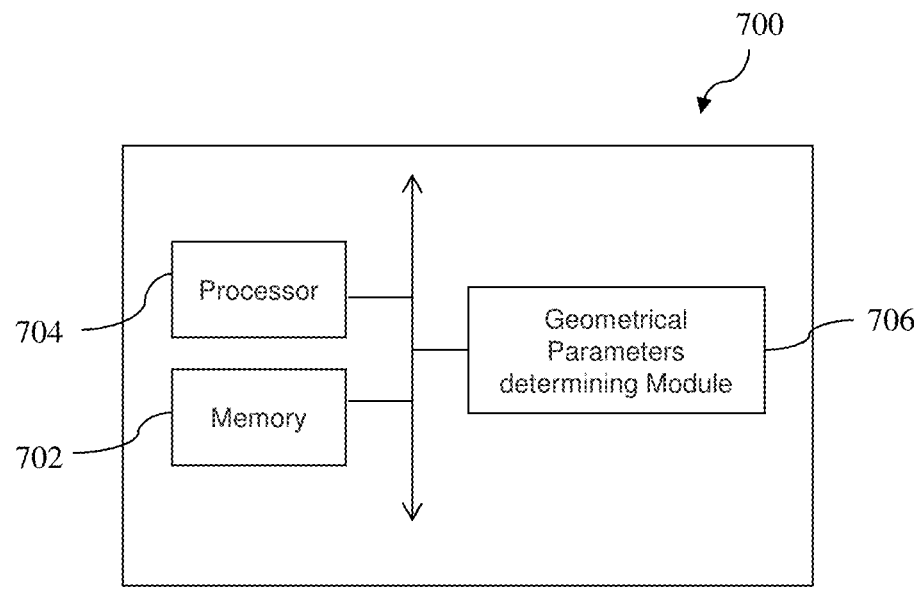
FIG. 7 depicts a system for determining geometrical parameters for forming an array of magnet ring pairs according to various embodiments.

FIG. 7 depicts a schematic block diagram of a system 700 for determining one or more types of geometrical parameters (or simply, for determining geometrical parameters) for forming an array of magnet ring pairs according to various embodiments, such as the array 302 of magnet ring pairs as described hereinbefore with reference to FIG. 3 according to various first embodiments or the array 502 of magnet ring pairs as described hereinbefore with reference to FIG. 5 according to various second embodiments. The system 700 includes a memory 702, and at least one processor 704 communicatively coupled to the memory 702 and configured to: determine one or more types of geometrical parameters for forming the array 302 of magnet ring pairs including a first subarray of first magnet rings and a second subarray of second magnet rings spaced apart from the first subarray of the first magnet rings along a longitudinal axis, as described hereinbefore with reference to FIG. 3 according to various first embodiments, or determine one or more types of geometrical parameters for forming the array 502 of magnet ring pairs including a first subarray of first magnet rings and a second subarray of second magnet rings spaced apart from the first subarray of the first magnet rings along a longitudinal axis, whereby the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray, as described hereinbefore with reference to FIG. 5 according to various second embodiments.

It will be appreciated by a person skilled in the art that the at least one processor may be configured to perform the required functions or operations through set(s) of instructions (e.g., software module(s)) executable by the at least one processor 704 to perform the required functions or operations. Accordingly, as shown in FIG. 7, the system 700 may include a geometrical parameters determining module (or a geometrical parameters determining circuit) 706 configured to: determine one or more types of geometrical parameters for forming the array 302 of magnet ring pairs including a first subarray of first magnet rings and a second subarray of second magnet rings spaced apart from the first subarray of the first magnet rings along a longitudinal axis, as described hereinbefore with reference to FIG. 3 according to various first embodiments, or determine one or more types of geometrical parameters for forming the array 502 of magnet ring pairs including a first subarray of first magnet rings and a second subarray of second magnet rings spaced apart from the first subarray of the first magnet rings along a longitudinal axis, whereby the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray, as described hereinbefore with reference to FIG. 5 according to various second embodiments.

It will be appreciated by a person skilled in the art that the above-mentioned module may be realized by or implemented as one functional module (e.g., a circuit or a software program) as desired or as appropriate. For example, the geometrical parameters determining module 706 may be realized as an executable software program (e.g., software application or simply referred to as an "app"), which for example may be stored in the memory 702 and executable by the at least one processor 704 to perform the functions/operations as described herein according to various embodiments.

In various embodiments, the system 700 corresponds to the step 202 of determining one or more types of geometrical parameters for forming an array of magnet ring pairs in the method 200 as described hereinbefore with reference to FIG. 2 or corresponds to the step 402 of determining one or more types of geometrical parameters for forming an array of magnet ring pairs in the method 400 as described hereinbefore with reference to FIG. 4, therefore, various functions or operations configured to be performed by the least one processor 704 may correspond to the step 202 of the method 200 described hereinbefore according to various first embodiments or the step 402 of the method 400 described hereinbefore according to various second embodiments, and thus need not be repeated with respect to the system 200 for clarity and conciseness. In other words, various embodiments described herein in context of the step 202 of the method 200 or the step 402 of the method 400 are analogously valid for the respective system (e.g., the system 700), and vice versa.

For example, in various embodiments, the memory 702 may have stored therein the geometrical parameters determining module 706 as described hereinbefore according to various embodiments, which are executable by the at least one processor 704 to perform the corresponding functions/operations as described herein.

A computing system, a controller, a microcontroller or any other system providing a processing capability may be provided according to various embodiments in the present disclosure. Such a system may be taken to include one or more processors and one or more computer-readable storage mediums. For example, the system 700 described hereinbefore may include a processor (or controller) 704 and a computer-readable storage medium (or memory) 702 which are for example used in various processing carried out therein as described herein. A memory or computer-readable storage medium used in various embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In various embodiments, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g., a microprocessor (e.g., a Complex Instruction Set Computer (CISC) processor or a Reduced Instruction Set Computer (RISC) processor). A "circuit" may also be a processor executing software, e.g., any kind of computer program, e.g., a computer program using a virtual machine code, e.g., Java. Any other kind of implementation of the respective functions which will be described in more detail below may also be understood as a "circuit" in accordance with various alternative embodiments. Similarly, a "module" may be a portion of a system according to various embodiments in the present disclosure and may encompass a "circuit" as above, or may be understood to be any kind of a logic-implementing entity therefrom.

Some portions of the present disclosure are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "determining", "optimizing", "obtaining", "generating", "mutating", "crossovering", or the like, refer to the actions and processes of a computer system, or similar electronic device, that manipulates and transforms data represented as physical quantities within the computer system into other data similarly represented as physical quantities within the computer system or other information storage, transmission or display devices.

The present specification also discloses a system (e.g., which may also be embodied as a device or an apparatus) for performing the operations/functions of various steps of methods described herein. Such a system may be specially constructed for the required purposes, or may include a general purpose computer or other device selectively activated or reconfigured by a computer program stored in the computer. The algorithms presented herein are not inherently related to any particular computer or other apparatus. Various general-purpose machines may be used with computer programs in accordance with the teachings herein.

Alternatively, the construction of more specialized apparatus to perform the required method steps may be appropriate.

In addition, the present specification also at least implicitly discloses a computer program or software/functional module, in that it would be apparent to the person skilled in the art that the individual steps of the methods described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the disclosure. For example, it will be appreciated by a person skilled in the art that the geometrical parameter determining module 706 may be software module(s) realized by computer program(s) or set(s) of instructions executable by a computer processor to perform the required functions, or may be hardware module(s) being functional hardware unit(s) designed to perform the required functions. It will also be appreciated that a combination of hardware and software modules may be implemented.

Furthermore, one or more of the steps of a computer program/module or method described herein may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer program when loaded and executed on such a general-purpose computer effectively results in an apparatus that implements one or more steps of the methods described herein.

In various embodiments, there is provided a computer program product, embodied in one or more computer-readable storage mediums (non-transitory computer-readable storage medium), including instructions (e.g., the geometrical parameters determining module 706) executable by one or more computer processors to perform the step 202 of determining one or more types of geometrical parameters for forming an array of magnet ring pairs as described hereinbefore with reference to FIG. 2 according to various first embodiments or to perform the step 402 of determining one or more types of geometrical parameters for forming an array of magnet ring pairs as described hereinbefore with reference to FIG. 4 according to various second embodiments. Accordingly, various computer program(s) or module(s) described herein may be stored in a computer program product receivable by a system therein, such as the system 700 as shown in FIG. 7, for execution by at least one processor 704 of the system 700 to perform the required or desired functions.

The software or functional modules described herein may also be implemented as hardware modules. More particularly, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the software or functional module(s) described herein can also be implemented as a combination of hardware and software modules.

Figure 8:
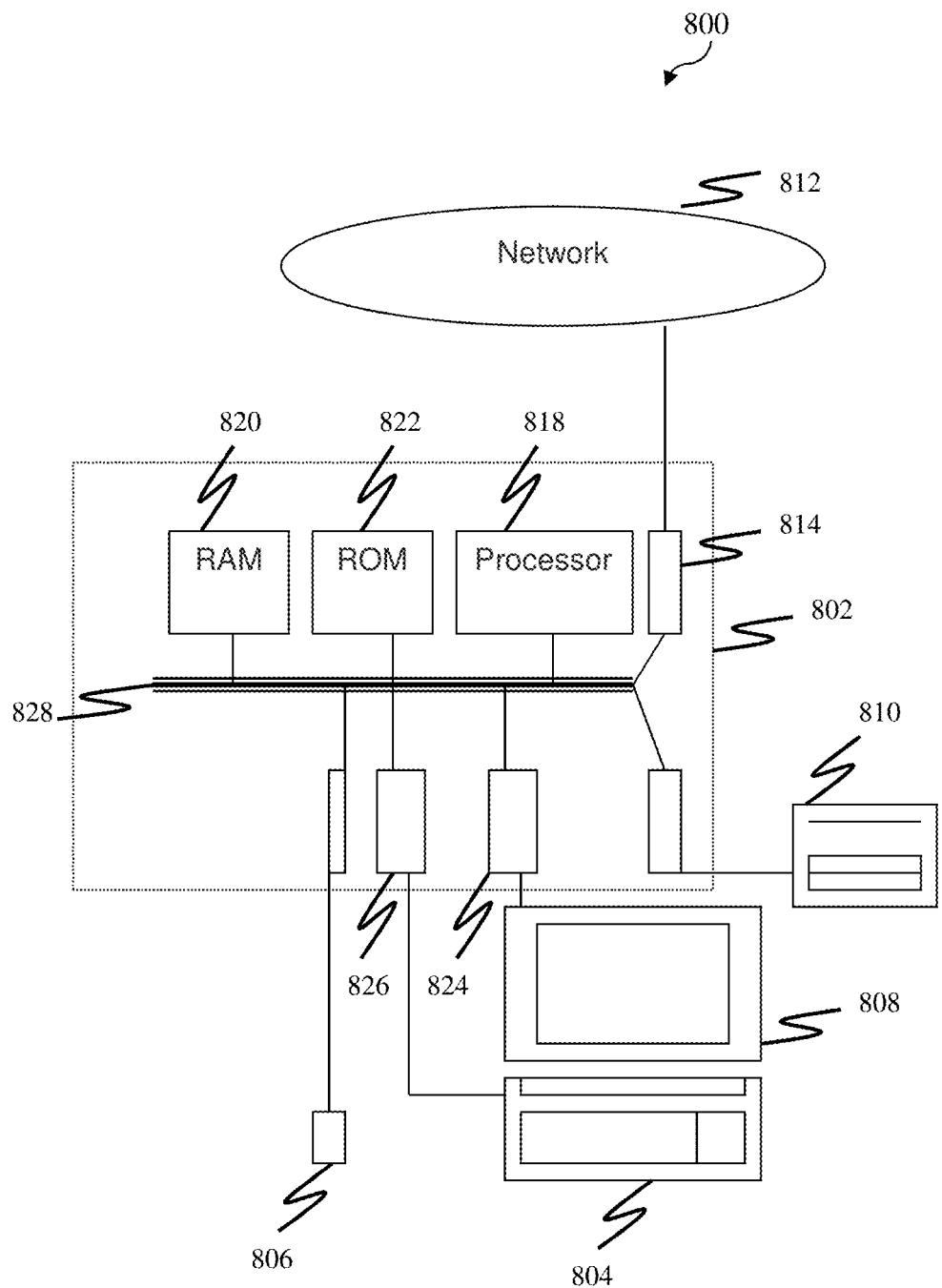
FIG. 8 depicts a schematic block diagram of an exemplary computer system which may be used to realize or implement the system as depicted in FIG. 7.

In various embodiments, the system 700 may be realized by any computer system (e.g., desktop or portable computer system) including at least one processor and a memory, such as a computer system 800 as schematically shown in FIG. 8 as an example only and without limitation. Various steps or functional modules (e.g., the geometrical parameters determining module 706) may be implemented as software, such as a computer program being executed within the computer system 800, and instructing the computer system 800 (in particular, one or more processors therein) to conduct one or more steps of methods/functions of various embodiments described herein. The computer system 800 may include a computer module 802, input modules, such as a keyboard 804 and a mouse 806, and a plurality of output devices such as a display 808, and a printer 810. The computer module 802 may be connected to a computer network 812 via a suitable transceiver device 814, to enable access to e.g., the Internet or other network systems such as Local Area Network (LAN) or Wide Area Network (WAN). The computer module 802 in the example may include a processor 818 for executing various instructions, a Random Access Memory (RAM) 820 and a Read Only Memory (ROM) 822. The computer module 802 may also include a number of Input/Output (I/O) interfaces, for example FO interface 824 to the display 808, and FO interface 826 to the keyboard 804. The components of the computer module 802 typically communicate via an interconnected bus 828 and in a manner known to the person skilled in the relevant art.

It will be appreciated by a person skilled in the art that the terminology used herein is for the purpose of describing various embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In order that the present disclosure may be readily understood and put into practical effect, various example embodiments of the present disclosure will be described hereinafter by way of examples only and not limitations. It will be appreciated by a person skilled in the art that the present disclosure may, however, be embodied in various different forms and should not be construed as limited to the example embodiments set forth hereinafter. Rather, these example embodiments are provided so that this disclosure will be thorough and complete, and will fully convey the scope of the present disclosure to those skilled in the art.

In particular, for better understanding of the present disclosure and without limitation or loss of generality, various example embodiments of the present disclosure will now be described with respect to example permanent magnet arrays for head imaging in a low-field portable MRI system.

According to various first example embodiments, the design and optimization (e.g., configuration) of a ring-pair permanent magnet array are disclosed for head imaging in a portable MRI system. The design may be based on the Aubert ring pair. In the design process, according to various first example embodiments, a genetic algorithm (GA) is applied for the optimization of field strength and homogeneity in, for example, a cylindrical FOV of 200 mm in diameter and 50 mm in length at the center of the magnet bore. In the optimization loop, according to various first example embodiments, a simplified current model is provided to accelerate the calculation of the magnetic field with accuracy. In the section "I. Design and Optimization" described below, the design and optimization, including the application of an example genetic algorithm and a simplified current model, is described according to various first example embodiments. In the section "II. Results" described later below, simulated results of the optimized magnet array are presented according to various first example embodiments, which shows a significant improvement in the field homogeneity after the optimization compared to an Aubert ring pair with a similar dimension and the same mass of magnetic material before the optimization. Discussion on the design and optimization is presented in the section "III. Discussion" and a conclusion is provided in the section "IV. Conclusion" later below.

I. DESIGN AND OPTIMIZATION

Figure 9:
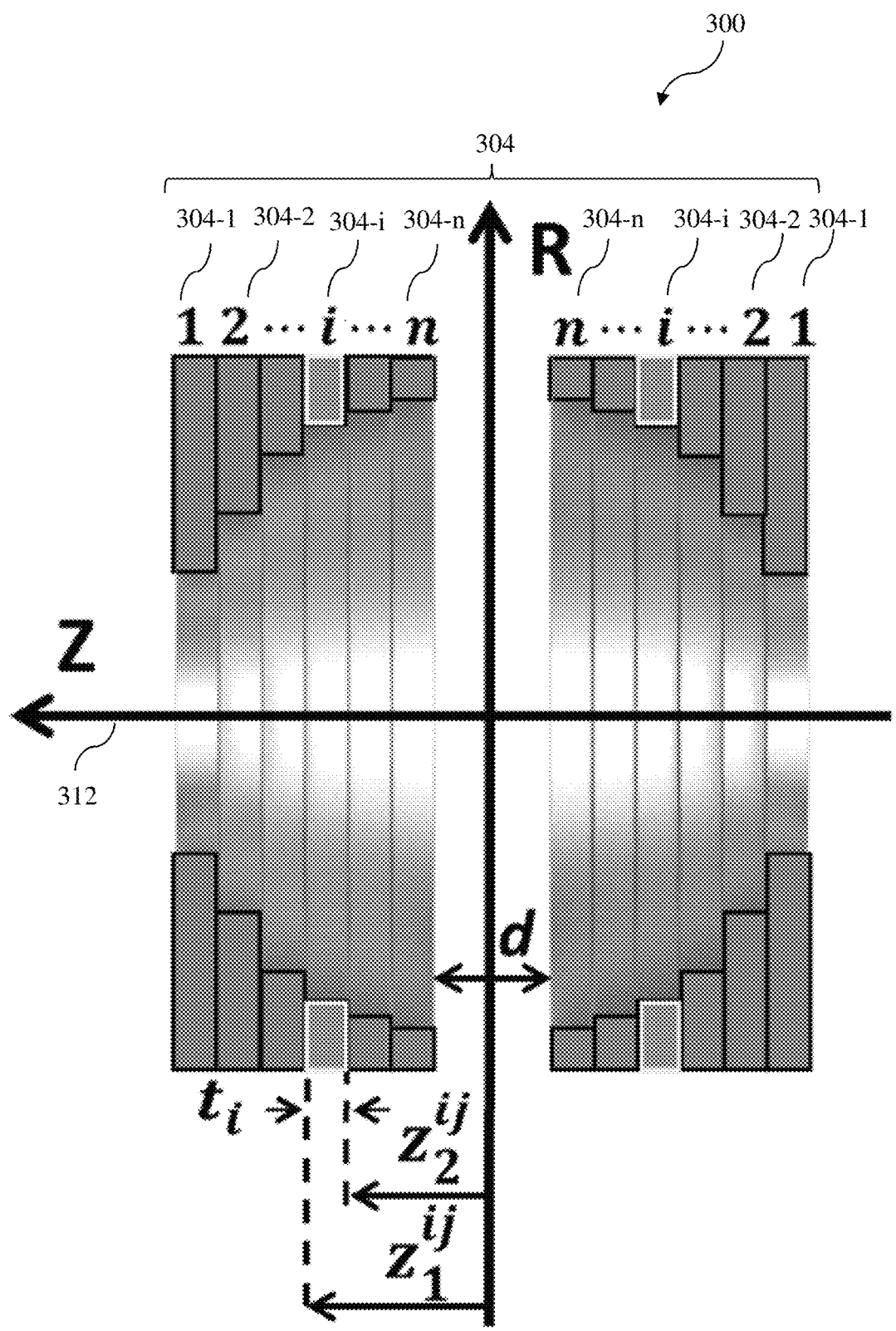
FIG. 9 depicts a side cross-sectional view of the permanent magnet system as depicted in FIG. 3, according to various first example embodiments of the present disclosure.

According to various first example embodiments, the example ring-pair permanent magnet array (e.g., corresponding to the permanent magnet system 300 described according to various first embodiments) is an aggregate of Aubert ring pairs (e.g., an Aubert ring pair is shown in FIG. 1D). In various first example embodiments, the example permanent magnet system 300 may be an assembly of these Aubert ring pairs with the axis of the rings 304 aligned with the z-axis 312, as shown in EEGs, 3 and 9. FIGS. 3 and 9 show the 3-D view and 2-D side view of the example permanent magnet system 300, respectively. In particular, FIGS. 3 and 9 show an example ring-pair permanent magnet array 302, whereby FIG. 3 shows a 3-D view where the polarization of each ring is indicated by corresponding arrows and $R_{in}^i$, $R_{out}^i$, are labelled, and FIG. 9 shows a side view where $z_1^{ij}$, and $z_2^{ij}$, $t_i$, and d are labeled.

For illustration purpose only, an example Aubert ring pair is indicated with a white border in both FIGS. 3 and 9. In the example permanent magnet system 300, as shown in FIG. 9, each ring pair 304 (304-1, 304-2, . . . , 304-i, . . . , 304-n) has an inner radius of $R_{in}^i$, an outer radius of $R_{out}^i$, a thickness of $t_i$, $z_1^{ij}$, and $z_2^{ij}$, respectively, are the coordinates of the outer surface and the inner surface of the $i_{th}$ magnet ring 304-i along the z-axis 312 defining the location of the ring 304-i along the z-axis 312, with j=1, 2 indicating the left and right rings, respectively. A distance between the two inner surfaces of the two innermost rings is denoted as d, and i is the index of the ring pair when the ring pairs are indexed outside in (i.e., outermost ring pair to innermost ring pair). In the example permanent magnet system 300, the dimensions of the magnet array 302, $R_{in}^i$, $R_{out}^i$, and $t_i$, and the number of ring pairs may be optimized toward achieving a high field homogeneity and a high field strength. By way of an example, for head imaging in 2-D, the FOV may be set to be a cylindrical volume with a diameter of 200 mm and a length of 50 mm at the center of the magnet bore. For the optimization, a genetic algorithm is applied and an efficient current model is provided and used for a fast forward calculation. The details are presented below according to various first example embodiments of the present disclosure.

1-A. Genetic Algorithm

Genetic algorithm is a random search algorithm based on the natural selection theory of biological evolution. It provides potential solutions with high diversity. Generally, the genetic algorithm includes improvement iterations where offspring are produced, crossovered, and mutated. In various first example embodiments, the optimization objectives are high field strength (e.g., greater than 160 mT) and high field homogeneity (e.g., less than 50,000 ppm) within a cylindrical FONT (diameter=200 mm and length=50 mm) at the center of the magnet bore for head imaging.

Figure 10:
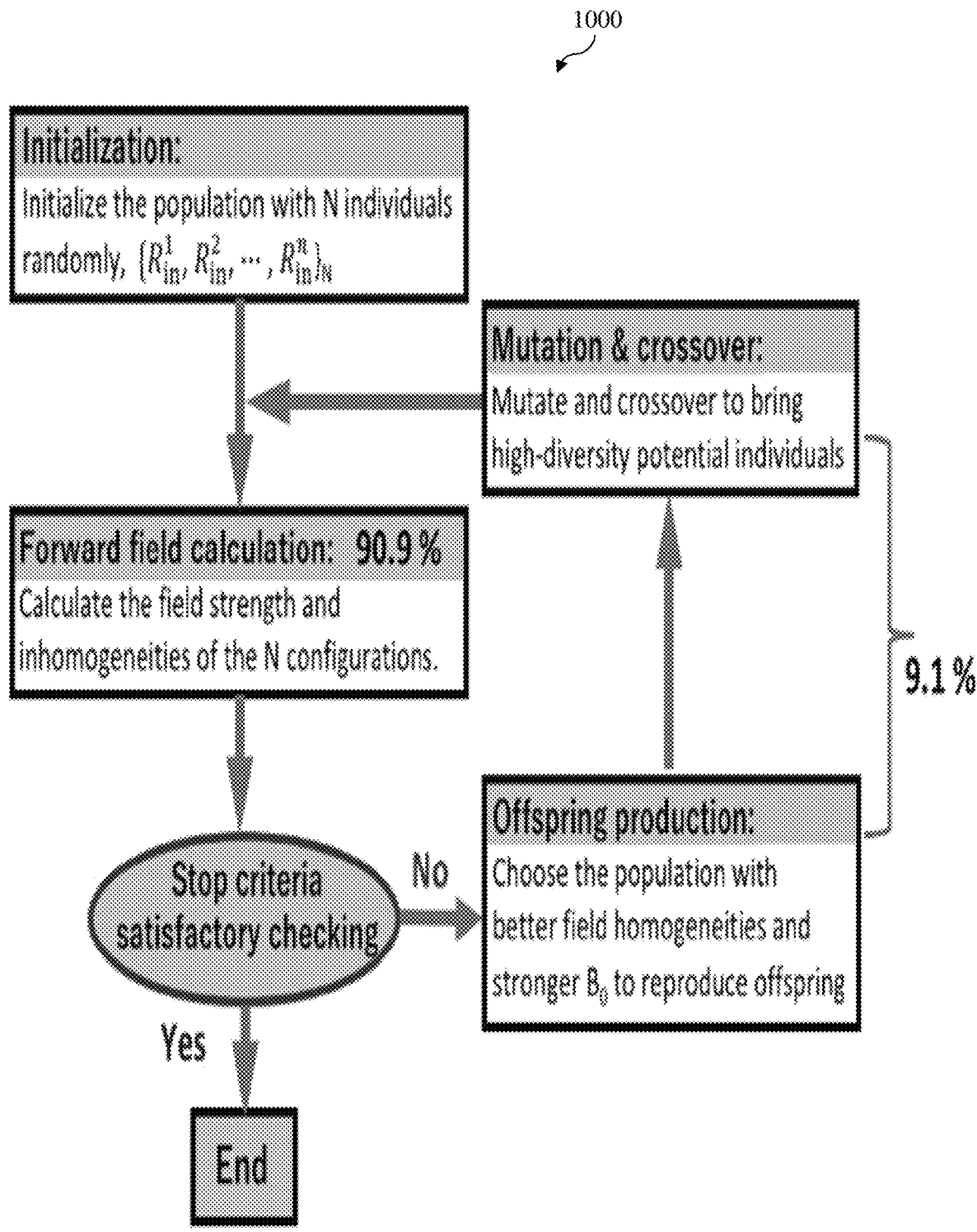
FIG. 10 depicts a schematic flow diagram of applying a genetic algorithm for the design or configuration of the ring-pair permanent magnet array, according to various first example embodiments of the present disclosure.

To facilitate the implementation, $R_{out}^i$ for each layer (magnet ring) is set to be 250 mm. The total number of layers for each side (for each subarray 308, 309) is set to be 10, and the thicknesses for each layer are set to be 10 mm. All the magnet rings are set to be magnetized with a remanence of 1.4 T. FIG. 10 shows a schematic flow diagram of applying a genetic algorithm 1000 for the design or configuration of the ring-pair permanent magnet array 302 according to various first example embodiments of the present disclosure. The first step is to initialize the population with N individuals (which may also be referred to as individual configurations, or simply configurations) randomly. In various first example embodiments, there are 11 parameters in one individual (configuration), $R_{in}^i$ (i= 1, 2, . . . , 10) and the distance d between the two innermost rings. The population size may be set to be 100 to provide enough diversity for the solution. Following the initialization, the magnetic field may be calculated (determined) for the N configurations of the parameters in the N individuals (e.g., corresponding to the "plurality of test configurations" described hereinbefore according to various first embodiments) in the preset FOV. Fitness values (e.g., corresponding to the "fitness measures" described hereinbefore according to various first embodiments) are calculated based on the calculated fields. They are examined based on the stopping criteria (e.g., corresponding to the "predetermined condition" described hereinbefore according to various first embodiments) which are the field strength and field homogeneity in the FOV. If the stopping criteria are not satisfied, the populations with high field strength and field homogeneity are chosen to produce offspring based on the calculated fitness values. By way of an example only and without limitation, an example fitness function is described later below with reference to Equation (7). Afterward, mutations and crossovers are applied to the produced offspring to bring diversity to the population. Then, the magnetic field and the fitness values are calculated again for the N configurations (e.g., corresponding to the "plurality of offspring configurations" described hereinbefore according to various first embodiments) in the population. Another iteration is initiated again when the stopping criteria are not satisfied whereas the optimization is ended when the criteria are met.

In the schematic flow diagram in FIG. 10, the time it takes for each step in terms of the percentage of the total optimization time is labelled for illustration purpose. As can be seen, the optimization only takes less than 10%, however, the forward calculation of magnetic fields of the magnet array under optimization consumes more than 90% of the time when COMSOL Multiphysics was used. Accordingly, various first example embodiments note that the speed of the forward calculation dominates or decides the speed of optimization. A fast calculation with accuracy may therefore be crucial or desired for an optimization that can be done within a practical amount of time. In this regard, various first example embodiments identified that a current model for the calculation of magnetic field offers both high calculation speed and high accuracy. Accordingly, in various first example embodiments, the current model is simplified and accelerated for the field calculation for the optimization. The derivation and validation are presented in section "I-B. Simplified Current Model for an Accelerated Forward Field Calculation" below. In various first example embodiments, based on genetic algorithm, the field inhomogeneity was significantly reduced by 95%.

I-B. Simplified Current Model for an Accelerated Forward Field Calculation

As mentioned above, various first example embodiments note that a fast calculation of the field strength may be crucial or desired for the acceleration of the optimization. In the literature, there exist different calculation methods for a magnet system. For a system with both magnets and iron, such as a C-shaped system and an H shaped system, numerical methods such as boundary integral method and finite-element method (FEM) can handle the calculations of the magnetic fields. The forward model can be accelerated for an optimization. One example is Cooley et al., "Design of sparse Halbach magnet arrays for portable MRI using a genetic algorithm", *IEEE Trans. Magn.*, vol. 54, no. 1, January 2018, Art. No. 5100112, used finite-element simulations for the forward calculation of magnetic fields. The calculation was simplified by fixing the overall magnet size and extent before the optimization of the combination of the material choice (no magnet or N42 or N52 grade material) allocated for each space. For a system with magnets only, such as a Halbach array, an Aubert ring pair, and the ring-pair permanent magnet array 302 according to various first embodiments of the present disclosure, various first example embodiments identified that physical models, such as the current model (which may also be referred to as a current density model), E. P. Furlani, "*Permanent Magnet and Electromechanical Devices: Materials, Analysis, and Applications*", New York, N.Y., USA: Academic, 2001, the content of which being hereby incorporated by reference in its entirety for all purposes, are much simpler compared to numerical methods. Accordingly, various first example embodiments identified that a physical model may offer calculation efficiency due to simplicity. Accordingly, for the ring-pair magnet array 302, since it includes magnets and is axially symmetric, various first example embodiments selected the current model and simplified it for a fast forward calculation for the optimization.

Figure 11:
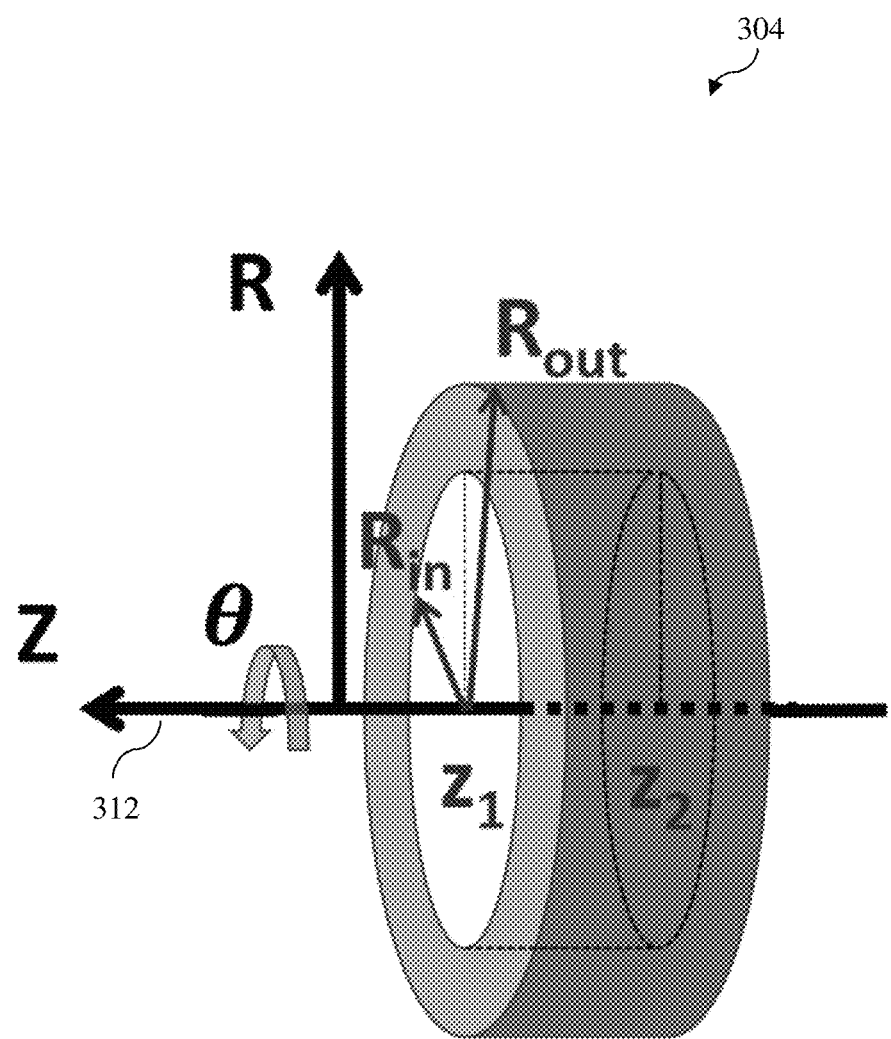
FIG. 11 depicts a schematic drawing of a single magnet ring of an array of magnet ring pairs as depicted in FIG. 3, according to various first example embodiments of the present disclosure.

FIG. 11 depicts a schematic drawing of a single magnet ring 304 of an array 302 of magnet ring pairs with the axis aligned with the z-axis 312 in a cylindrical coordinate system according to various first example embodiments of the present disclosure. The magnet ring 304 is radially polarized outward.

For the magnetic field generated by permanent magnets, the principle of superposition holds. Therefore, the calculation of the total magnetic fields generated by the example ring-pair magnet array 302 can be done by summing up the fields generated by each magnet ring 304 therein. The application and simplification of the current model for the calculation or determination of the magnetic field generated by such a magnet ring 304 is described in more detail next, according to various first example embodiments of the present disclosure.

In the current model according to various first example embodiments, a permanent magnet may be reduced to the distribution of equivalent currents. For a permanent magnet ring 304 shown in FIG. 11, there are only equivalent surface currents. The magnetic field generated by these equivalent currents may be calculated by as follows:

$$B(r) = \frac{\mu_0}{4\pi} \oint_S j_m(r') \times \frac{r - r'}{|r - r'|^3} ds' \quad (1)$$

where $r = \langle r', \theta', z' \rangle$ is the observation point, $r' = \langle r', \theta', z' \rangle$ is the point of current source, and S is the surface of the magnet. In various first example embodiments, cylindrical coordinate system is used. For a single magnet ring with an outward radial polarization, the equivalent surface current source may be expressed as follows:

$$j_m = \begin{cases} -M_0 \hat{\theta}' & z = z_1 \\ M_0 \hat{\theta}', & z = z_2 \end{cases} \quad (2)$$

where $M_0$ is the magnitude of the remanent magnetization, $z_1$ and $z_2$ are the position of the front surface and the end surface of the ring along the z-axis, respectively. As shown in Equation (2), the equivalent surface currents (e.g., corresponding to the "first equivalent surface current source" and "second equivalent surface current source" described hereinbefore according to various first embodiments) circulating on the front surface are clockwise whereas those on the end surface are anticlockwise. No surface currents are on the inner and outer side walls of the ring.

Since the magnet ring 304 with continuously varying radial polarization is symmetric with respect to its radial axis, B(r) is $\theta$ independent, or in other words, axially symmetric. Therefore, only the fields on a specific $\theta$ need to be calculated for the fields in a 3-D space. The calculations on $\theta=0$ were done, thus the observation point is defined as $r = \langle r, 0, z \rangle$ and the derivation is simplified. The calculation is thus reduced to a 2-D problem. Substituting Equation (2) into Equation (1) with $r = \langle r, 0, z \rangle$ and take the integration, Equation (3) in the following may be obtained:

$$B(r) = \quad (3)$$

$$\frac{\mu_0 M_0}{4\pi} \int_{R_{in}}^{R_{out}} \int_0^{2\pi} \times \left( \begin{array}{c} \frac{\langle r'(z_1 - z)\cos\theta', 0, rr'\cos\theta' - r'^2 \rangle}{[r^2 + r'^2 - 2rr'\cos\theta' + (z_1 - z)^2]^{3/2}} - \\ \frac{\langle r'(z_2 - z)\cos\theta', 0, rr'\cos\theta' - r'^2 \rangle}{[r^2 + r'^2 - 2rr'\cos\theta' + (z_2 - z)^2]^{3/2}} \end{array} \right) d\theta' dr'$$

where $R_{in}$ and $R_{out}$ are the inner and outer radius of the ring, respectively. As shown in Equation (3), the $\theta$-component of B(r) is zero. Equation (3) was applied to calculate the magnetic field generated by a ring and ring aggregates. The calculated results are validated by comparing to the results using COMSOL. Multiphysics, which is based on FEM.

Figure 12A:
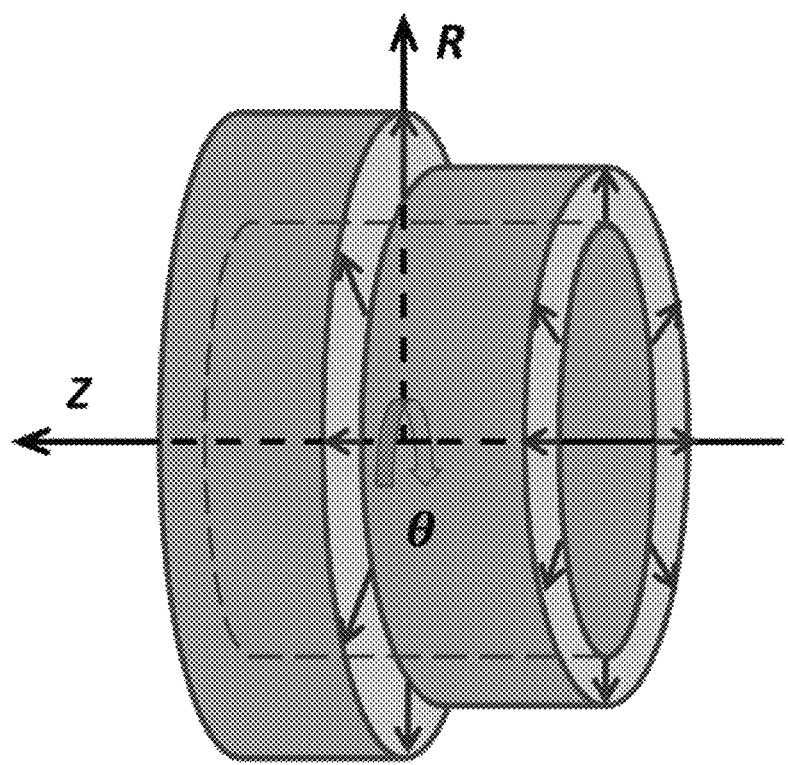
FIG. 12A depicts a perspective view of an example magnet ring aggregate of two magnet rings, according to various first example embodiments of the present disclosure.

A two-ring aggregate as shown in FIG. 12A was calculated using both Equation (3) and COMSOL. Multiphysics. In particular, FIG. 12A depicts a 3-D view of an example magnet ring aggregate of two magnet rings. The two-ring aggregate includes two magnet rings with the same inner radius of 40 mm, same thickness of 20 min, and the outer radius of 60 and 50 mm, respectively, Both magnet rings are radially polarized outward as illustrated by the arrows.

Figure 12B:
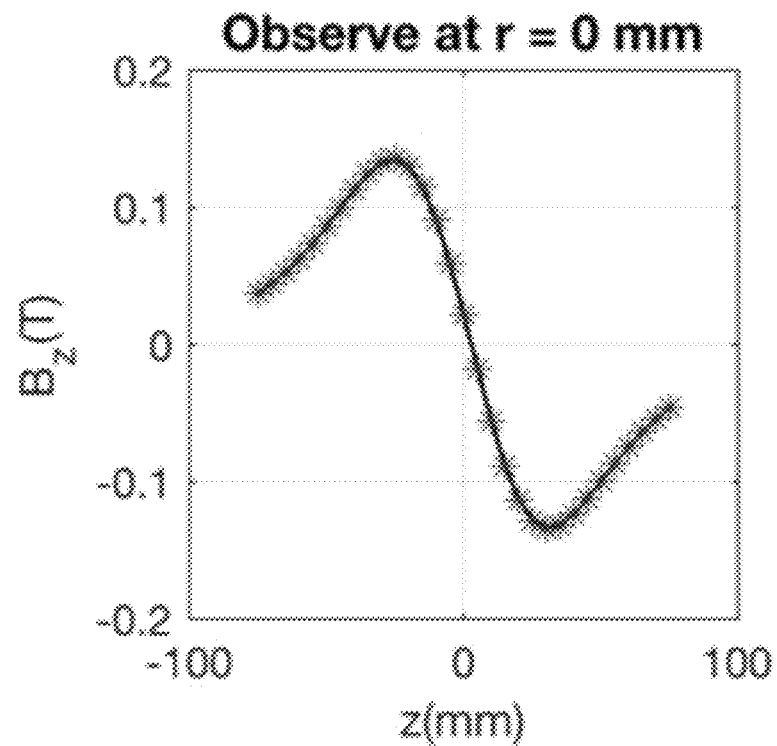
FIGS. 12B to 12D show results of the z-components of the magnetic field calculated using both the current model (denoted by stars) and COMSOL Multiphysics (denoted by black solid lines) on the cylindrical surfaces with (a) r=0 mm (FIG. 12B), (b) r=10 mm (FIG. 12C), and (c) r=20 mm (FIG. 12D), respectively.
Figure 12C:
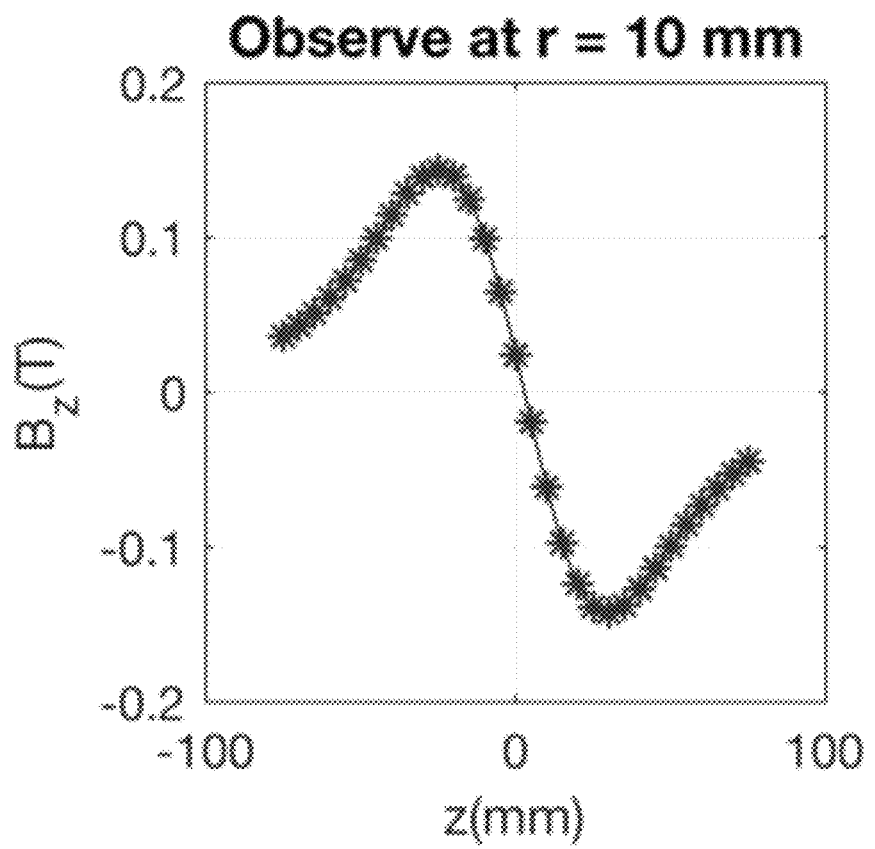
Figure 12D:
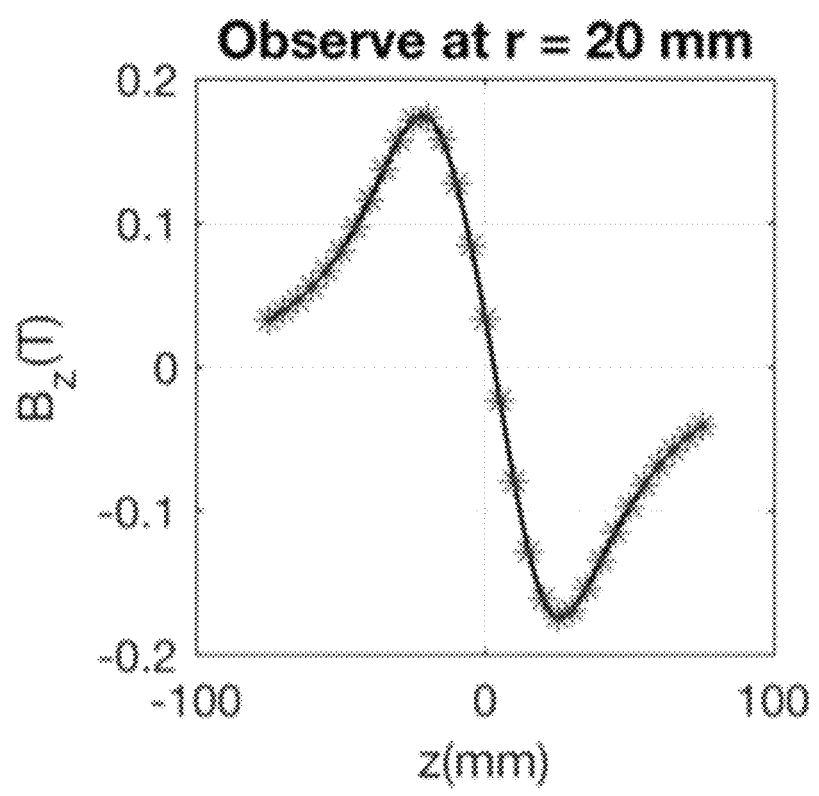

FIGS. 12B to 12D show the results calculated using Equation (3) (in MATLAB) and those using COMSOL Multi physics on different observation lines along the z-axis. In particular, the z-components of the magnetic field are calculated using both the current model (denoted by stars) and COMSOL Multiphysics (denoted by black solid lines) on the cylindrical surfaces with (h) r=0 mm, (c) r=10 mm, and (d) r=20 mm. As shown, the results using the simplified current model according to various first example embodiments and COMSOL Multiphysics are in a good agreement with each other at different observation points. The time it takes for the calculation by applying Equation (3) is only 1/10 of that by using COMSOL Multiphysics. With the validation, Equation (3) with the principle of superposition may be used according to various first example embodiments for calculating (determining) the magnetic field generated by the magnet array 302 in the optimization process. In the calculation, B field generated at r=⟨r, 0, z⟩ by a ring depends on the location and the dimension of the ring which may be written as $B(r, R_{in}^i, R_{out}^i, z_1^i, z_2^i)$. Therefore, in the genetic algorithm 1000 according to various first example embodiments, the fields generated by the example ring-pair magnet array 302 may be calculated using Equation (4) as follows:

$$B_{total}(r) = \sum_{j=1}^{2} \sum_{i=1}^{n} [B(r, R_{in}^i, R_{out}^i, z_1^{ij}, z_2^{ij})] \qquad (4)$$

where the superscript i indicates the $i^{th}$ ring pair with the first ling pair the outermost and the nth one the innermost (e.g., as shown in FIGS. 3 and 9), n is the total number of ring pairs, and j indicates the ring on the left (j=1) and that on the right (j=2). In the example magnet array 302, the z-components of $B_{total}$ are used as the main magnetic field ($B_0$) for MRI imaging. Therefore, an average $B_0$ in the FOV can be calculated using the following equation:

$$B_{0\text{-}avg} = \sum_{k=1}^{M} B_z(r_k)/M \qquad (5)$$

where k is the index of the observation points in FOV and M is the total number of the points. In the genetic algorithm 1000, a high $B_0$ field strength may be enforced by applying the constraint as follows:

$$B_{0\text{-}avg} > 160 \text{ mT.} \qquad (6)$$

The constraint is nonlinear because the relation of $B_{0\text{-}avg}$ and the parameters being optimized is not linear. For the field homogeneity, the fitness function in ppm as defined as follows may be applied:

$$\min f = \left\| \frac{\max_{1 \leq k \leq M} B_0(r_k) - \min_{1 \leq k \leq M} B_0(r_k)}{B_{0\text{-}avg}} \right\| \times 10^6. \qquad (7)$$

II. RESULTS

Figure 13A:
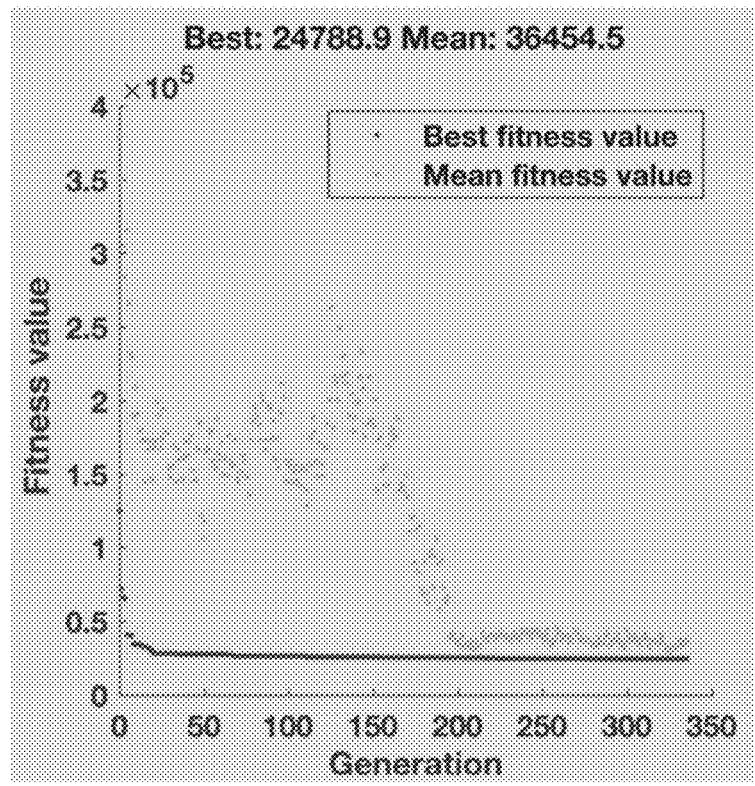
FIG. 13A depicts a plot of change of fitness values versus iteration steps for both the mean and the best fitness value for a candidate configuration, according to various first example embodiments of the present disclosure.
Figure 13B:
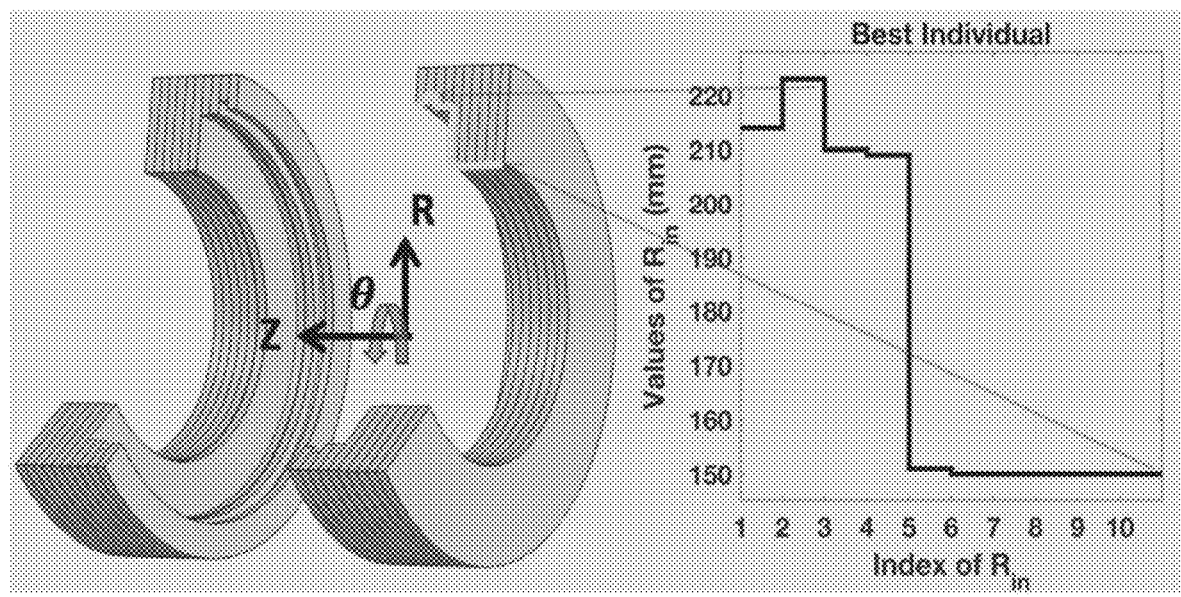
FIG. 13B depicts a 3D cross-sectional view of a ring-pair magnet array based on an optimized configuration, with inner radius parameter ranging from 150 and 220 mm, according to various first example embodiments of the present disclosure.

According to various first example embodiments, the optimization was implemented in MATLAB multiple times, and it converged to a group of results that are not exactly the same. Among the results, a good candidate solution was selected based on not only the field homogeneity and field strength but also the geometry of the magnet array when the feasibility of the fabrication and assembly of an array was examined. The selected candidate solution is showed in FIGS. 13A and 13B. FIG. 13A shows that both the mean and the best fitness value (which indicate the field inhomogeneity) decrease as the number of iterations increases. In particular, FIG. 13A shows the change of fitness value versus iteration steps. The optimization stopped at the 335th iteration when the difference between two successive best individuals was within $10^{-12}$ for 50 iterations. FIG. 13B shows a 3-D view of the ring-pair magnet array with the best $R_{in}^i$ in which ranges between 150 and 220 mm. The optimized [$R_{in}^i$] (i=1, 2, . . . , 10) is [214 223 210 209 151 150 150 150 150 150] (unit: mm). As can be seen, the $R_{in}^i$ determines the inner profile of the optimized magnet array. The optimized gap d is 200 mm.

Figure 14A:
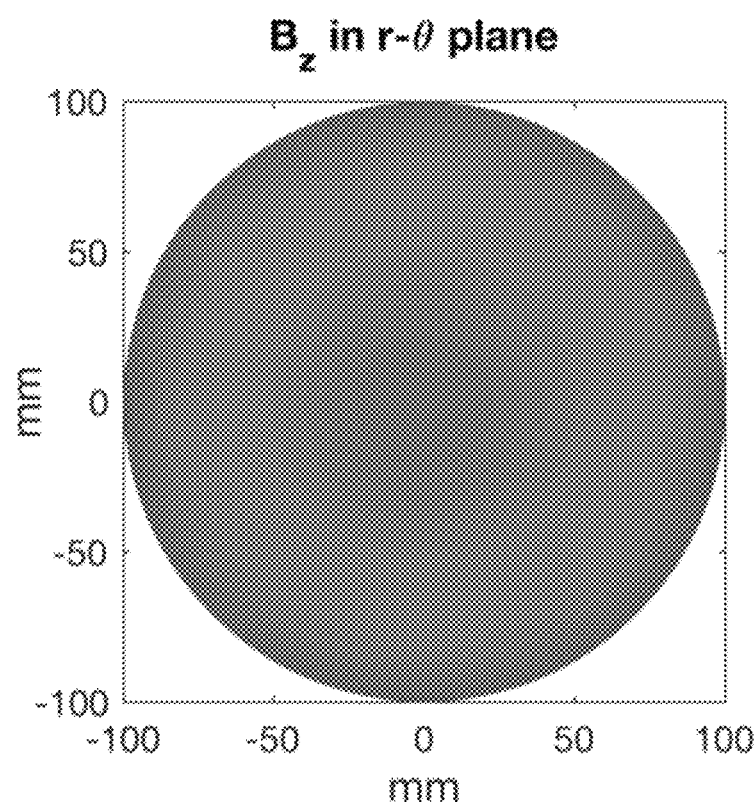
FIGS. 14A and 14B show the magnetic field generated by the optimized ring-pair configuration shown in FIG. 13B in FOV using a simplified current model in (a) r-z plane (FIG. 14A) and (b) r-z plane (FIG. 14B), respectively, according to various first example embodiments of the present disclosure.
Figure 14B:
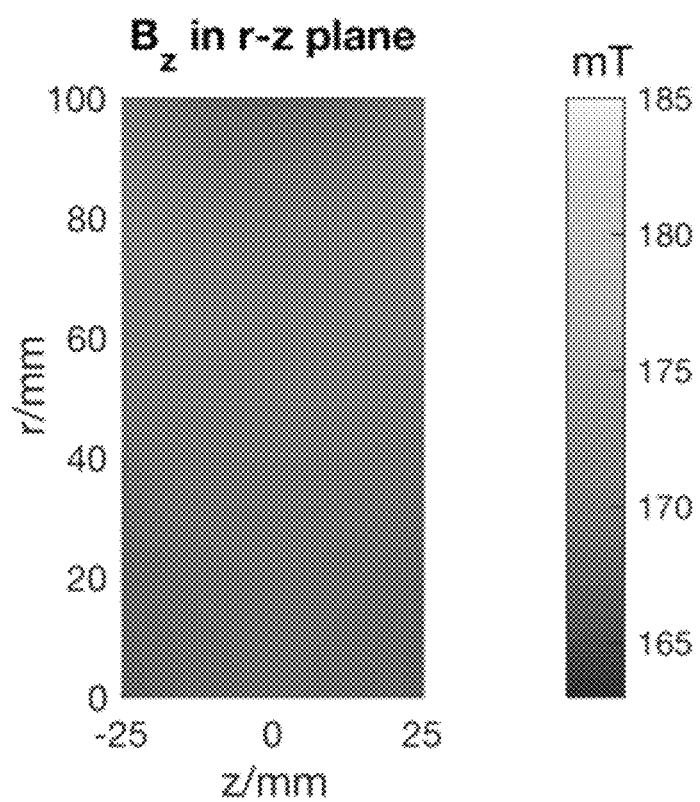
Figure 15A:
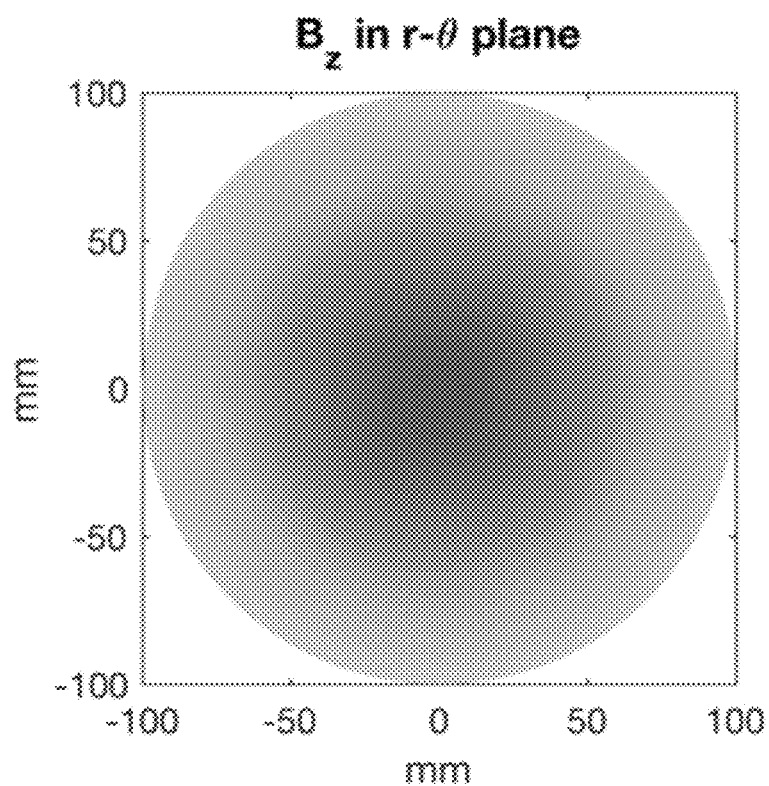
FIGS. 15A and 15B show the magnetic field generated by the reference Aubert ring pair in FOV using a simplified current model in (a) r-θ plane (FIG. 15A) and (b) r-z plane (FIG. 15B), respectively, according to various first example embodiments of the present disclosure.
Figure 15B:
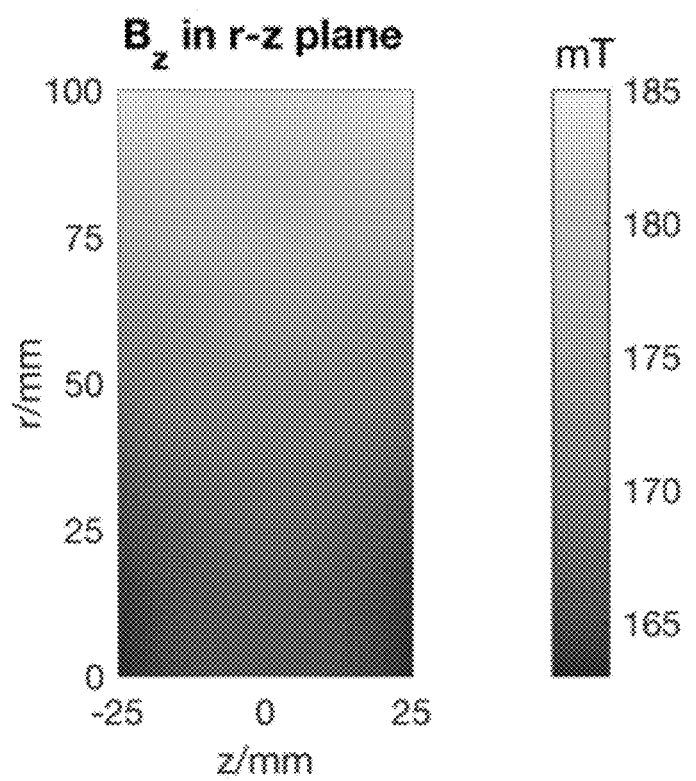

FIGS. 14A and 14B show the magnetic field generated by the optimized ring-pair design shown in FIG. 13B in FOV using the simplified current model in (a) r-z plane and (b) r-z plane, respectively. In particular, FIGS. 14A and 14B plots the z-components of B ($B_z$) generated by the optimized design in the plane when z=0 (r-θ plane) and that when θ=0 (r-z plane), respectively, in the FOV calculated by Equations (3) and (4). The $B_z$ field is symmetric with respect to the z-axis, so the plot when θ=0 is symmetric to the plot when θ=π with respect to the z-axis. For a reference and comparison, an Aubert ring pair as shown in FIG. 1D was calculated. For a fair comparison, the outer radius and the thickness of the Aubert ring was set to be 250 and 100 mm, respectively, which are the same as the optimized proposed ring-pair array. The gap between the two Aubert rings was set to be 200 mm being the same as the gap of the innermost ring pair of the optimized array. Moreover, the inner radius of the Aubert ring pair was set to be 178.5 mm which guarantees the same amount of mass of magnetic materials of the two magnet arrays under comparison. FIGS. 15A and 15B show the magnetic field generated by the reference Aubert ring pair shown in FIG. 1D in FOV using the simplified current model in (a) r-θ plane and (b) r-z plane, respectively. FIGS. 15A and 15B show the plots of the calculated $B_z$ generated by the reference Aubert ring pair in the z=0 plane and that in the θ=0 plane, respectively, in the FOV. The calculation was done using Equations (3) and (4).

Comparing the magnetic fields generated by the optimized array in FIGS. 14A and 14B and those of an Aubert array with the same mass and similar dimensions in FIGS. 15A and 15B, in the same FOV, the optimized magnet array has a field homogeneity of 24,786 ppm and an average field strength of 169.7 mT whereas the reference magnet array has a field homogeneity of 122,150 ppm and an average field strength of 178.5 mT, As can be seen, the optimization reduces the inhomogeneity by over 79.7% with a sacrifice of the field strength of less than 5% (from 178.5 to 169.7 mT). Accordingly, the optimization according to various first example embodiments offer significant improvement in field homogeneity while still maintains a similar field strength. The optimization results satisfy the preset optimization objective of an average field strength of greater than 160 mT and a field homogeneity of less than 50,000 ppm (in this example, 24,786 ppm).

Figure 16:
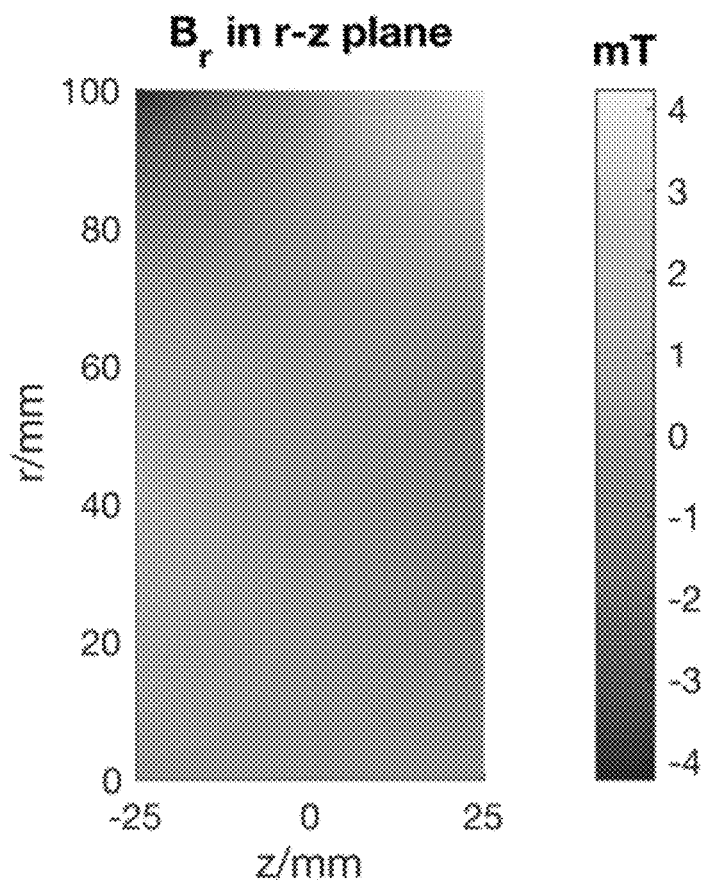
FIG. 16 shows the r-components of the magnetic field generated by the optimized ring-pair design shown in FIG. 13B in FOV in the θ=0 plane using a simplified current model, according to various first example embodiments of the present disclosure.

FIG. 16 shows the r-components of the optimized magnet array in the θ=0 plane. In particular, FIG. 16 shows the r-components of the magnetic field generated by the optimized ring-pair design shown in FIG. 13B in FOV in the θ=0 plane using the simplified current model. Comparing to the z-components as shown in FIG. 14A, the r-components of the magnetic field generated by the magnet array according to various first example embodiments are much smaller than the z-components. The z-components dominate the field in the magnet array thus the field is in the longitudinal direction. When it is applied to supply $B_0$ field for imaging, it is in the same relative orientation as that of a conventional superconducting magnet-based. MRI scanner, which allows the application of available techniques for building RI coils to the system using the proposed magnet array. The optimized magnet array is suitable for providing the $B_0$ field for a portable MRI system working with spatial encoding.

Figure 17A:
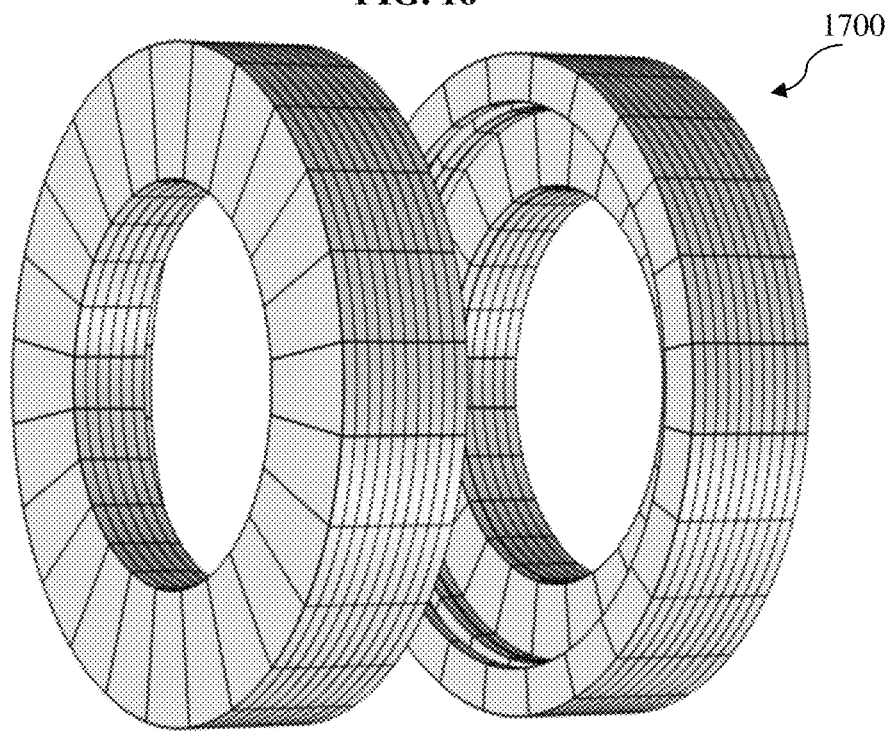
FIG. 17A depicts a schematic drawing of a segmented optimized magnet array, according to various first example embodiments of the present disclosure.
Figure 17B:
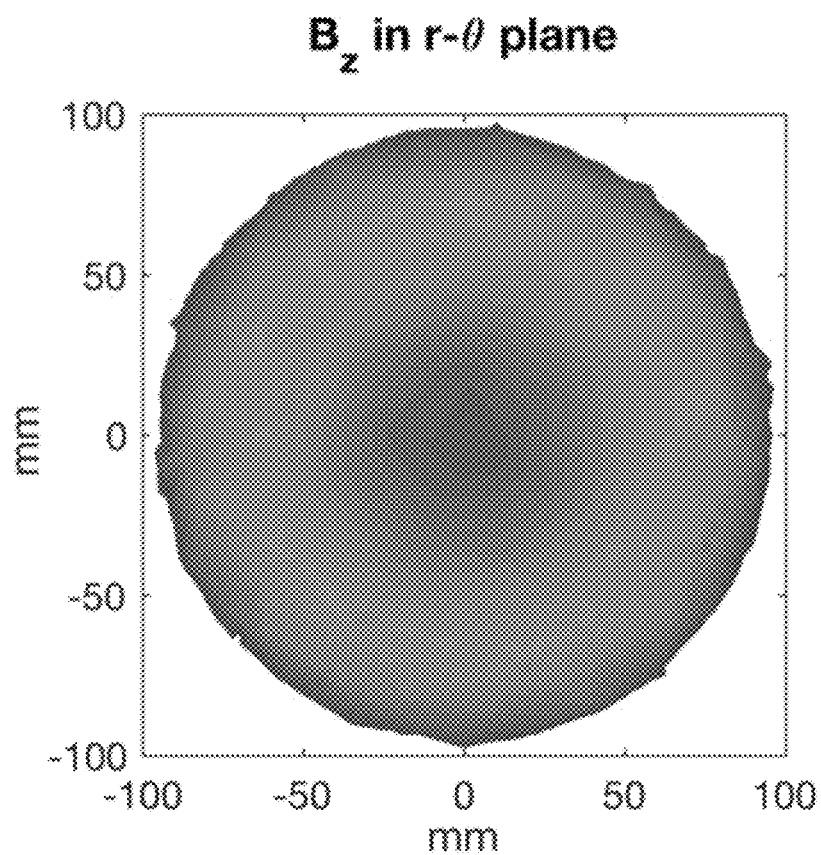
FIGS. 17B and 17C show the magnetic field generated by an example segmented optimized magnet array in FOV simulated in COMSOL Multiphysics in (a) r-θ plane (FIG. 17B) and (b) r-z plane (FIG. 17C)
Figure 17C:
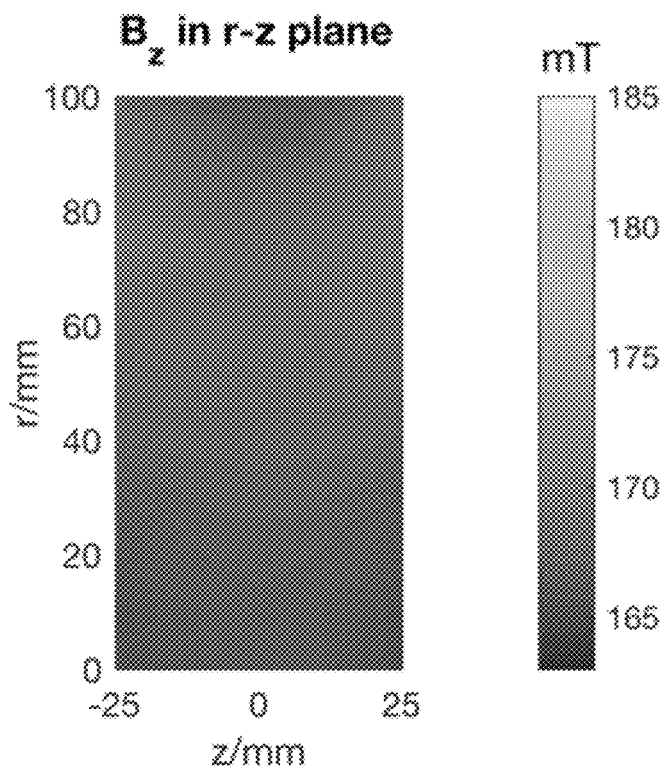

According to various first example embodiments, the design or configuration of the array of magnet ring pairs may be segmented into a plurality of ring segments (e.g., 12 identical fan-shaped magnets) with a uniform polarization. FIG. 17A depicts a 3-D view of the magnet assembly 1700 according to various first example embodiments. In particular, FIG. 17A depicts a 3-D view of the segmented optimized magnet array 1700 made up of fan-shaped magnets is shown. The magnetic field generated by the segmented optimized magnet array in FONT simulated in COMSOL Multiphysics in (a) r-θ plane (FIG. 17B) and (b) r-z plane (FIG. 17C). The simulation results are shown in FIGS. 17B and 17C. The segmented magnet array has a field homogeneity of 32,511 ppm and an average field strength of 167.6 mT. Comparing to results of an array with continuously varying polarization in FIGS. 14A and 14B, owing to the discretization, the homogeneity of the field is reduced by 31.2% and the field strength is lowered by 1.24%. Comparing to the results of the ideal reference Aubert ring pair in FIGS. 15A and 15B, the inhomogeneity is still improved by 73.4%. Moreover, the reference Aubert ring pair was segmented and simulated using COMSOL Multiphysics. It shows a field homogeneity of 133,430 ppm and an average strength of 174.5 mT. Compared to the segmented reference Aubert ring, the segmented design or configuration 1700 according to various first example embodiments still shows an improvement of 75.6% in terms of the field inhomogeneity whereas a 4% reduction in terms of the average field strength. The results show that the discretization does not degrade the performance of the magnet array according to various first example embodiments much.

III. DISCUSSION

In various first example embodiments, the design and optimization framework is flexible and effective. Genetic algorithm has a flexible definition of the fitness functions. It will be appreciated by a person skilled in the art that the present disclosure according to various first example embodiments is not limited to the field homogeneity and field strength, and the optimization allows more design objectives that may be preferred or important to the design of a magnet array for a portable MRI, such as but not limited to, lighter weight, more compact size, and a specific magnetic field pattern. It will also be appreciated to a person skilled in the art that the present disclosure according to various first example embodiments is not limited to being applied to a portable MIII system, and the design or configuration approach can be applied to design magnet arrays for other applications, such as but not limited to, accelerators and motors.

According to various first example embodiments, a specific $B_0$ field pattern may be needed for a portable MRI system to encode signals with information on the location where the need for gradient coils can be removed. However, this field pattern should be generated within a certain field inhomogeneity, $\Delta B_0$. The homogeneity corresponds to an RF bandwidth, $\Delta \omega$, which may be expressed in the Equation as follows:

$$\Delta \omega = \gamma \Delta B_0 \tag{8}$$

where $\gamma$ is the gyromagnetic magnetic ratio in MHz/T. In order to excite all the magnetic dipoles in the FOV, the bandwidth of an RF coil has to be greater or the same as $\Delta \omega$, $\Delta \omega_{coil} \geq \Delta \omega$. On the other hand, $\Delta \omega_{coil}$ has to be low to maintain high efficiency and a high Q-factor. Therefore, in the application of a magnet array for a portable MRI system where the magnetic field generated by the magnet array is used for encoding for imaging, $B_0$ needs to have a certain amount of the inhomogeneity (with a pattern) for imaging but not too much to allow working with RF coils with a reasonable Q-factor. The FOV, in this paper, is a cylinder with a diameter of 200 mm and a length of 50 mm for 2-D head imaging. In various first example embodiments, the length may be extended for 34) imaging.

Figure 18:
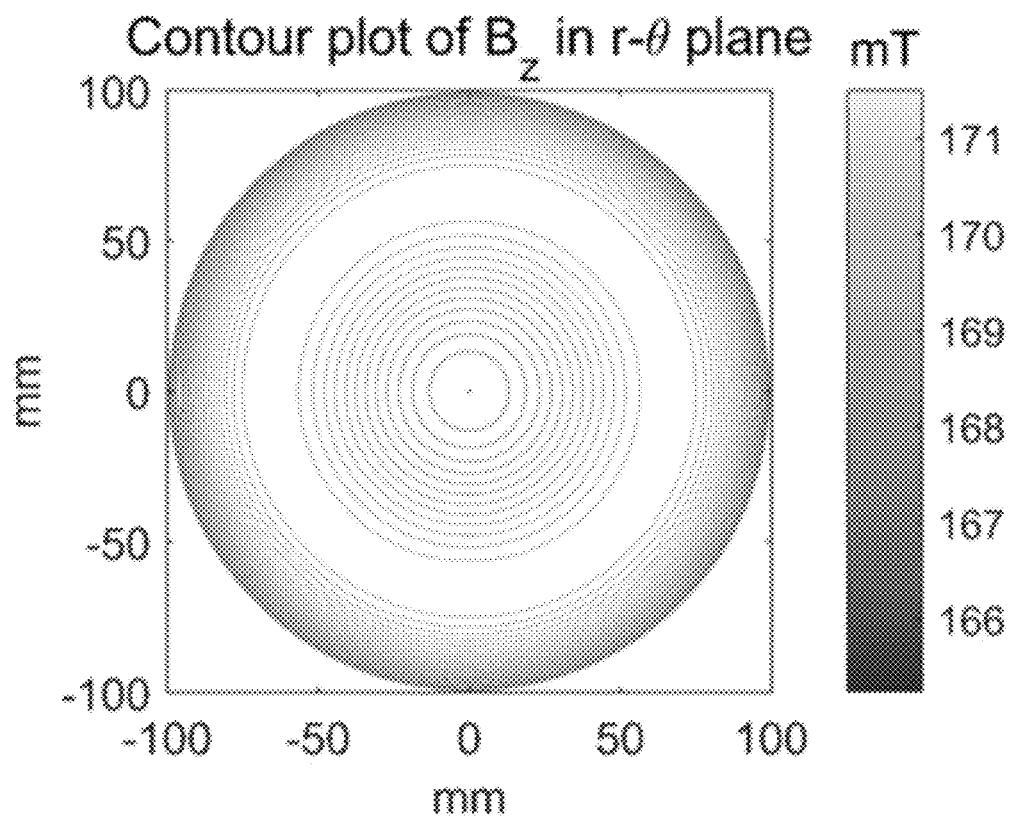
FIG. 18 depicts a concentric-circled pattern provided by a ring-pair magnet array according to various first example embodiments of the present disclosure.

In terms of the $B_0$ field pattern, the ring-pair magnet array according to various first example embodiments provides a concentric-circled pattern as shown in FIG. 18. In particular, FIG. 18 depicts a non-uniform concentric-circled pattern.

This pattern can intrinsically spatially encode the signal in the r-direction, which is equivalently an always-on gradient field applied in the radial direction. For the application of this pattern for signal encoding for imaging, one method is to apply coil sensitivity encoding provided by rotating receiving coils to obtain additional information in the θ-direction for image reconstruction. Another possible solution is to introduce a rotating encoding magnetic block (or blocks) to break the radial symmetry of the magnetic field to bring additional information in the θ-direction for image reconstruction. The need for gradient coils can be removed in the aforementioned scenarios.

Compared with a Halbach magnet array, besides its compatibility to the existing RF coils, the ring-pair design according to various first example embodiments is easier to be fabricated and assembled to achieve a performance close to that of its counterpart with ideal magnetic polarization. In various first example embodiments, the magnet ring array may be formed using various fabrication techniques or procedures known in the art based on geometrical parameters determined according to various first embodiments of the present disclosure, such as using computer numerical control machines, and thus need not be described herein for clarity and conciseness. By way of example only and without limitation, the magnet rings in the array of magnet ring pairs may be made of NdFeB. Furthermore, the housing structure for the magnet ring array may be nylon rings with designed grooves that can be fabricated, for example, using standard fabrication procedure on computer numerical control machines, which is relatively easy compared to that for a sparse Halbach cylinder. The magnet ring array design or configuration according to various first example embodiments leads to a more compact size and a higher filling factor which is helpful to obtain a high field strength and a similar performance compared with the corresponding ideal design (e.g., with a full filling factor). A filling factor may be defined as the ratio of the total mass of the magnet when an array is built to the mass of the magnet in the ideal model. For example, the filling factor in FIG. 17A is almost 100%. However, for Halbach magnet array, the Halbach cylinders are often segmented into magnet bars, cylinders magnets, which leads to a relatively low filling factor. For an example Halbach array, the filling factor is only 32.5%. Although the sparse segmentation makes the structure lighter and less expensive, the field strength and homogeneity are considerably degraded. In terms of the fringe field of a magnet ring array, the design or configuration according to various first example embodiments generates a stronger fringe field outside the magnet assembly compared to the Halbach array. One possible solution is covering the magnet assembly with high-permeability shields. The high-permeability material may guide and concentrate the magnetic flux, thus greatly reduces the strength of the fringe field and strengthen the magnetic field inside.

Due to the inevitable imperfection of magnet materials and fabrication, there may be non-negligible difference among the magnets in terms of remanent strength, and even the direction of polarization. In various first example embodiments, the effect of imperfect materials and fabrication may be identified and minimized, One way to minimize the effect of material imperfection may be labeling, measuring, and sorting the magnets before assembling thus those with serious defects could be discarded, and arrangement of magnets could be optimized. For magnet assembly, there may be discrepancies between a defined location of a magnet and its real location. The accuracy of the position of the magnet may be increased if a housing is properly designed and fabricated with grooves of right dimensions for the magnets. Another potential issue with permanent magnets is the slow degradation of remanence over time, as well as being temperature sensitive. In this regard, according to various first example embodiments, a relative thermostatic environment may be utilized, and the tracking of the field drift may be employed for the temperature compensation during the MRI scan, solution technique to address this problem according to various example first example embodiments is to add an NMR probe to the system to track the field strength drift caused by both temperature change and demagnetization effects.

IV. CONCLUSION

Accordingly, in various first example embodiments, the design and optimization of a ring-pair permanent magnet array for head imaging in a low-field portable MRI system. For example, an example magnet array generates a longitudinal $B_0$ field with a magnetic field of 169.7 ml and a homogeneity of 24,786 ppm in a FOV with a diameter of 200 mm and a thickness of 50 mm. This is a reduction of 79.7% in terms of inhomogeneity yet a less than 5% reduction in field strength compared to a traditional ring-pair structure with a similar dimension and mass. In various first example embodiments, the optimization was achieved by applying a genetic algorithm and providing an efficient current model for the forward calculation. This efficient current model is a simplification of the traditional current model based on the unique arrangement of the magnets in the design according to various first embodiments. The effectiveness of the optimization is validated by realistic simulations using COMSOL Multiphysics. With a longitudinal $B_0$ field, the existing technology on RF coils for superconducting-magnet-based MRI scanners may directly be applied to an imaging system using the magnet array according to various first embodiments. An example 12-segmentation magnet assembly based on the optimized design according to various first example embodiments is also provided which shows a similar field strength and homogeneity with its non-segmented counterpart.

In various second embodiments, the IO ring-pair magnet array 302 according to various first embodiments is further optimized to obtain a 1D monotonic field pattern to favor the image reconstruction, on top of having a relatively high field strength and the acceptable field inhomogeneity along the longitudinal direction. To achieve this goal, according to various second embodiments, the ring pair may be discretized into ring segment pairs for optimization, resulting in irregular-shaped rings. The resultant IO ring-pair magnet array design or configuration may be referred to herein as an irregular-shaped IO ring-pair magnet array. According to various second embodiments, a genetic algorithm was applied and a current model (may also be referred to as a current density model) for a ring segment pair (may also be referred to as a fan-shaped pair) was derived and used for a fast forward calculation of the magnetic field in the optimization. The design and optimization (e.g., configuration) according to various second example embodiments are described in detailed in section "V. Methods" below. The optimization results are described in section "VI. Results", and the magnet array according to various second example embodiments is compared to a Halbach array when their fields are used for encoding for MR imaging by using simulation, to show that the design or configuration according to various second example embodiments favors image reconstruction. Discussions on the design and optimization are presented in section "VII. Discussion", and a conclusion is provided in Section "VIII. Conclusion" later below.

V. METHODS

Figure 19A:
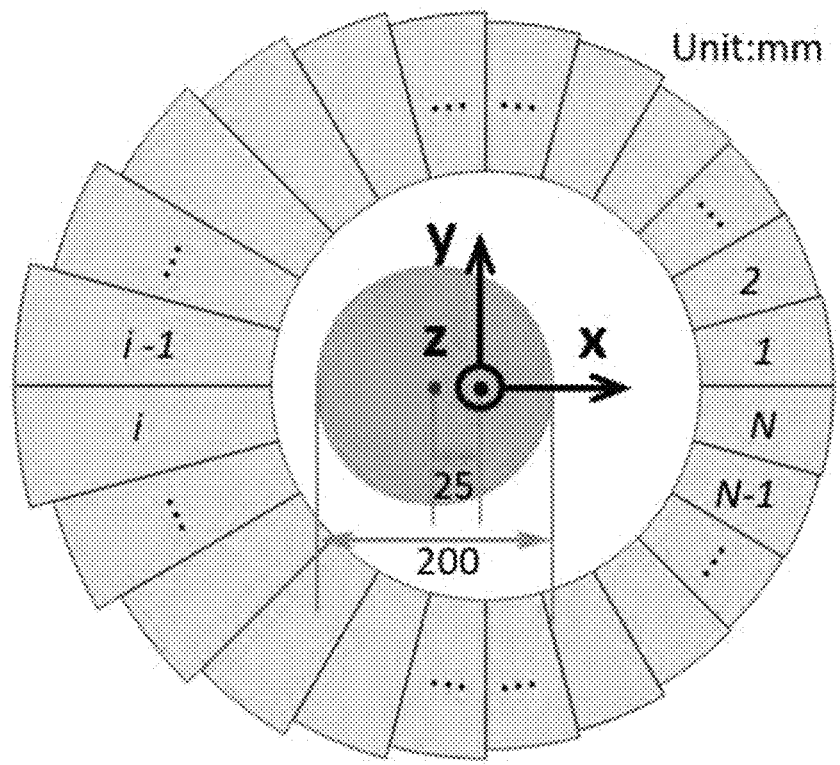
FIGS. 19A and 19B show a front view and a side cross-sectional view of a magnet array, respectively, according to various second example embodiments of the present disclosure.
Figure 19B:
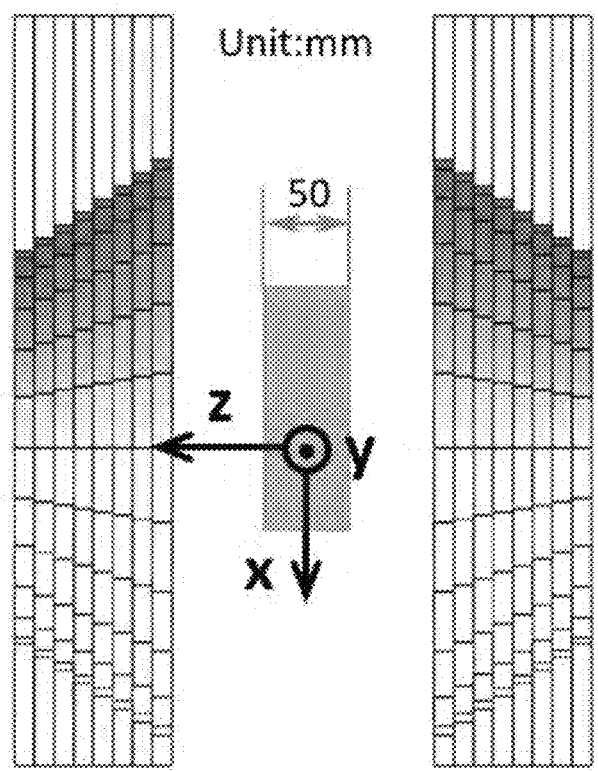
Figure 19C:
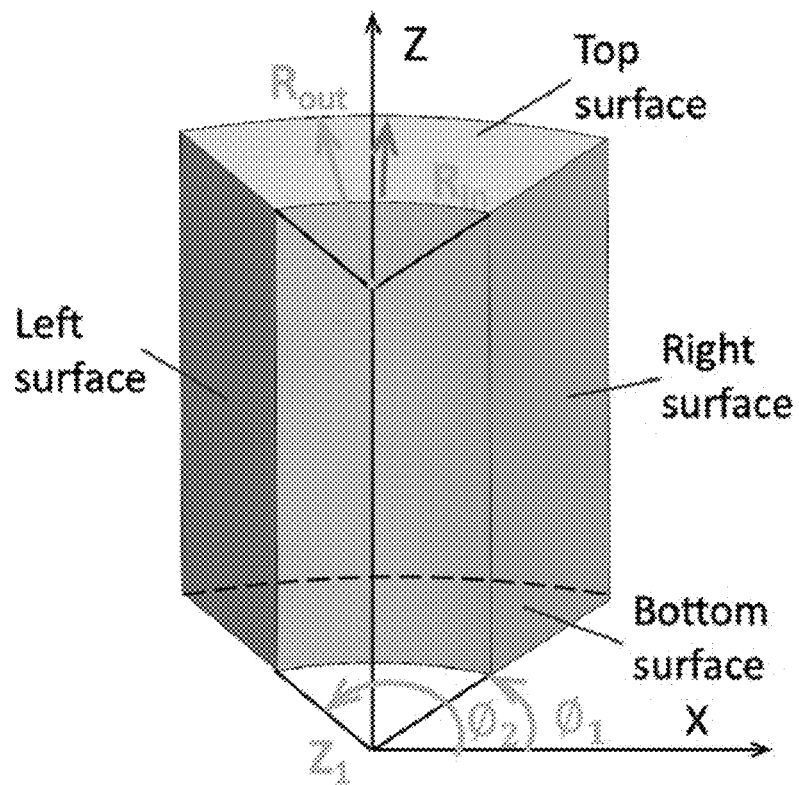
FIG. 19C shows a ring segment (segmented magnet element), according to various second example embodiments.

An example design or configuration of a magnet array 500 is shown in FIG. 5 according to various second example embodiments, which includes segmented IO ring pairs that have varying inner radii from one pair to another, and different outer radii from one segment to another. A basic IO ring pair is shown in FIG. 1D. As shown in FIG. 1D, the ring pair includes two annular magnets of the same dimension with the central axes aligned and located a distance apart, forming a cylindrical space. In the ring pair, one magnet ring has the magnetization radially pointing inward (the left one) and the other radially pointing outward (the right one). The ring pair supplies dipolar magnetic field along the axial direction of the cylinder (from left to right). As shown in FIG. 5, the example magnetic array 500 has M IO ring pairs and is symmetric with respect to the central plane (xy-plane, z=0). The magnet rings in a pair are identical. In various second example embodiments, all the magnet rings have the same thickness t. Therefore, on each side (e.g., corresponding to the "first subarray of ring magnets" and the "second subarray of ring magnets" described hereinbefore according to various second embodiments), the aggregate includes M magnet ring. The distance between the two inner edges of the two inner most rings is denoted as d. All the magnet rings on the left (z>0) may be radially polarized outwards, and those on the right (z<0) may be radially polarized inwards, thus a longitudinal magnetic field (along the z-axis 512) may be generated. In various second example embodiments, for each magnet ring, they are segmented into N fan-shaped segments (e.g., corresponding to the "ring segments" described hereinbefore according to various second embodiments), as shown in FIG. 5. FIGS. 19A and 19B show the front view and side cross-sectional view of the magnet array 500, respectively, with along with the FoV 1905. FIG. 19C shows a ring segment according to various second example embodiments. In particular, FIG. 19C shows a segmented fan-shaped magnet element with a radially outward polarization. For each ring segment, it may be indexed using j and i where j indexes the $j^{th}$ ring pair and i indexes the $i^{th}$ ring segment. The inner and outer radius of each segment are denoted as $R_{in}^{ij}$ and $R_{out}^{ij}$, respectively.

For the optimization, according to various second example embodiments, the inner radii of the segments from the same ring pair, e.g., the $j^{th}$ ring pair, are set to be the same. Therefore, various second example embodiments let $R_{in}^{ij} = R_{in}^{j}$. On the other hand, the outer radii vary from one segment to another along a ring, while they are set to be the same across rings for the segments of the same index. For this reason, $R_{out}^{ij}$ may be set to be $R_{out}^{i}$. In the optimization, $R_{in}^{j} = R_{out}^{i}$ (j=1, ..., M, and i=1, ..., N) are the geometrical parameters to be optimized to generate a targeted SEM with a desired field pattern, field strength, and homogeneity. The distance d between the two inner edges of the two inner most rings may be fixed to be 240 mm. For head imaging in 2D, the FoV under optimization may be set to be a cylindrical volume with a diameter of 200 mm and a length of 50 mm inside the magnet bore. In various second example embodiments, the FoV may be 25 mm off the origin along the −x-direction, as illustrated in FIGS. 19A and 19B. For the optimization, a genetic algorithm is applied and a current model for the calculation of the magnetic field of magnet ring segments is derived and used for a fast forward calculation. The details are presented below according to various second example embodiments of the present disclosure.

V-A. Optimization Using Genetic Algorithm

Genetic algorithm is used for the optimization of the magnet array according to various second example embodiments. In various second example embodiments, in general, the genetic algorithm performs or functions in a similar or the same manner as described in various first embodiments, except that the one or more types of geometrical parameters are optimized additionally with respect to a field monotonicity of the magnetic field in a transverse direction in a field of view within the array of magnetic ring pairs. Therefore, the genetic algorithm need not be repeated in detail in various second example embodiments for clarity and conciseness.

Genetic algorithm provides candidate solutions with a high diversity. Generally, it contains iterations with improvements where off-springs are produced, crossed over, and mutated. A key of applying genetic algorithm is the definition of an effective fitness function which rewards the good off-springs and penalizes the bad ones. Various second example embodiments may include three optimization objectives: a high average field strength (>100 mT), the controlled field inhomogeneity (<10 mT), and a monotonic field pattern that is as linear as possible. In various second example embodiments, all three objectives may be combined in a single fitness function to accelerate the optimization rather than using a multi-objective genetic algorithm. An example fitness function according to various second example embodiments is shown as follows, $$\min f = \left\| \frac{\max_{1 \leq k \leq N_1} B_z(r_k) - \min_{1 \leq k \leq N_1} B_z(r_k)}{\mathrm{mean}(B_z(r_k))} \right\| \times 10^6 - \qquad (9)$$
$$\alpha \left( \sum_{k=1}^{N_1} B_z(r_k)/N_1 - 100 \right)$$
$$\beta \left( N_2 - \sum_{h=1}^{N_2} \mathrm{issorted}\left( \left[ B_z(r_h^1), \ldots, B_z(r_h^l) \ldots B_z(r_h^{N_3^h}) \right] \right) \right)$$

where, k is the index of the observation points r in the FoV and $N_1$ is the total number of the points, $N_2$ is the total number of the observation lines parallel with the x-axis in FoV with a spatial step of 10 mm, h is the index of the observation lines in FoV, $r_h^l$ is the $l^{th}$ point along the $h^{th}$ observation line. The total number of points along the $h^{th}$ line is denoted using $N_3^h$. The first term in Equation (9) may correspond to the field inhomogeneity, and the unit is part per million (ppm). The second term in Equation (9) may reward the off-springs with a field strength higher than 100 mT, and penalizes those with a field strength lower than 100 mT. The third term in Equation (9) may take care of the monotonicity of the field pattern in FoV by checking the field gradient along the x-direction. In various second example embodiments, function issorted may be used for testing the monotonicity of the field along the observation line, and it takes less computation compared to calculating the number of voxels with undesired gradients. To balance the three objectives, according to various second example embodiments, weighting coefficients α and β may be applied to the second and third terms in Equation (9), respectively. In various second example embodiments, the weighting coefficients α and β may be empirically set to be $5 \times 10^3$ and $2.5 \times 10^4$, respectively.

V-B. Forward Calculation: Current Model

The current model may be suitable to calculate the magnetic field of a yokeless magnet system without the segmentation of the magnets. The calculation using a current model may be more efficient compared to finite element method (FEM), or Boundary Integral Method (BIM). For the magnet array according to various second example embodiments, a current model for a fan-shaped ring segment (e.g., shown in FIG. 19C) is derived and implemented for a fast forward calculation for the optimization. The details of the derivation are described next. In the derivation, a cylindrical coordinate system was used.

In a current model, according to various second example embodiments, a permanent magnet may be modeled using equivalent current sources. The magnetic field generated by these equivalent current sources may be calculated by Equation (10) below, $$B(r) = \frac{\mu_0}{4\pi} \oint_S j_m(r') \times \frac{r-r'}{|r-r'|^3} ds' + \frac{\mu_0}{4\pi} \oint_V J_m(r') \times \frac{r-r'}{|r-r'|^3} dv' \qquad (10)$$

where, $\mu_0$ is the permeability of free space, $r = \langle r, \phi, z \rangle$ is the observation point, $r' = \langle r', \phi', z' \rangle$ is current source point, $j_m$ is the equivalent surface current source, $J_m$ is the equivalent volume current source, and S and V are the surface and the volume of the magnet, respectively. For a fan-shaped magnet shown in FIG. 19C, the equivalent volume current density may be determined by:

$$J_m = \nabla \times M_0 = 0 \qquad (11)$$

where, $M_0$ is the magnitude of the remanent magnetization of a permanent magnet. As the remanent magnetization is a constant along different polarization, its curl is zero. Thus, based on Equation (11), the equivalent volume current is zero. Therefore, in Equation (10), there may only equivalent surface currents remained. Equation (10) may be rewritten as, $$B(r) = \frac{\mu_0}{4\pi} \oint_S j_m(r') \times \frac{r-r'}{|r-r'|^3} ds' \qquad (12)$$

For the equivalent surface currents, they may be expressed as, $$j_m(r) = M_0 \times \hat{n} = \begin{cases} -M_0 \hat{\phi}', & \text{top surface} \\ M_0 \hat{\phi}', & \text{bottom surface} \\ -M_0 \hat{z}', & \text{left surface} \\ M_0 \hat{z}', & \text{right surface} \end{cases} \qquad (13)$$

where, $\hat{n}$ denotes the unit normal vector of the magnet surface. Substituting (13) into (12) results in an expression for B(r). The z-component of B(r) dominates the magnetic field generated by the magnet array according to various second example embodiments, and $B_z(r)$ generated by the fan-shaped magnet ring segment may be expressed as, $$B_z(r) = \frac{-\mu_0 M_0}{4\pi} \oint_{S_{top}} \frac{C_1}{C_2} ds' + \frac{\mu_0 M_0}{4\pi} \oint_{S_{bottom}} \frac{C_1}{C_3} ds' \quad (14)$$

$$C_1 = -r\cos(\phi - \phi') + \phi\sin(\phi - \phi') + r' = 0 \quad (15)$$
$$C_2 = (r^2 + r'^2 - 2rr'\cos(\phi - \phi') + (z_1 - z')^2)^{(3/2)}$$
$$C_3 = (r^2 + r'^2 - 2rr'\cos(\phi - \phi') + (z_2 - z')^2)^{(3/2)}$$

The superposition principle holds in a yokeless magnet system, so the total resultant magnetic field $B_{total}(r)$ generated by the whole magnet array 502 according to various second example embodiments as shown in FIG. 5 may be calculated by:

$$B_{total}(t) = \sum_{j=1}^{M} \sum_{i=1}^{N} [B(r, R_{in}^i, R_{out}^i, z_1^i, z_2^i, \phi_1^i, \phi_2^i) - B(r, R_{in}^i, R_{out}^i, -z_1^i, -z_2^i, \phi_1^i, \phi_2^i) \quad (16)$$

Figure 20A:
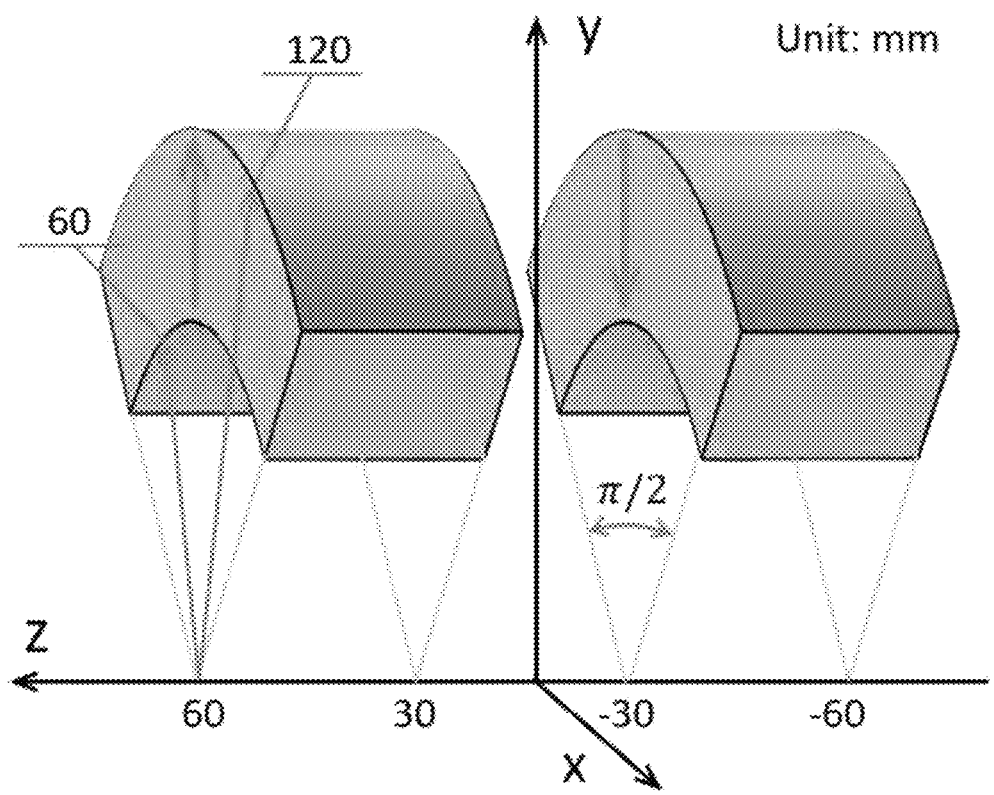
FIG. 20A shows a 3D view of a fan-shaped magnet segment pair, according to various second example embodiments.
Figure 20B:
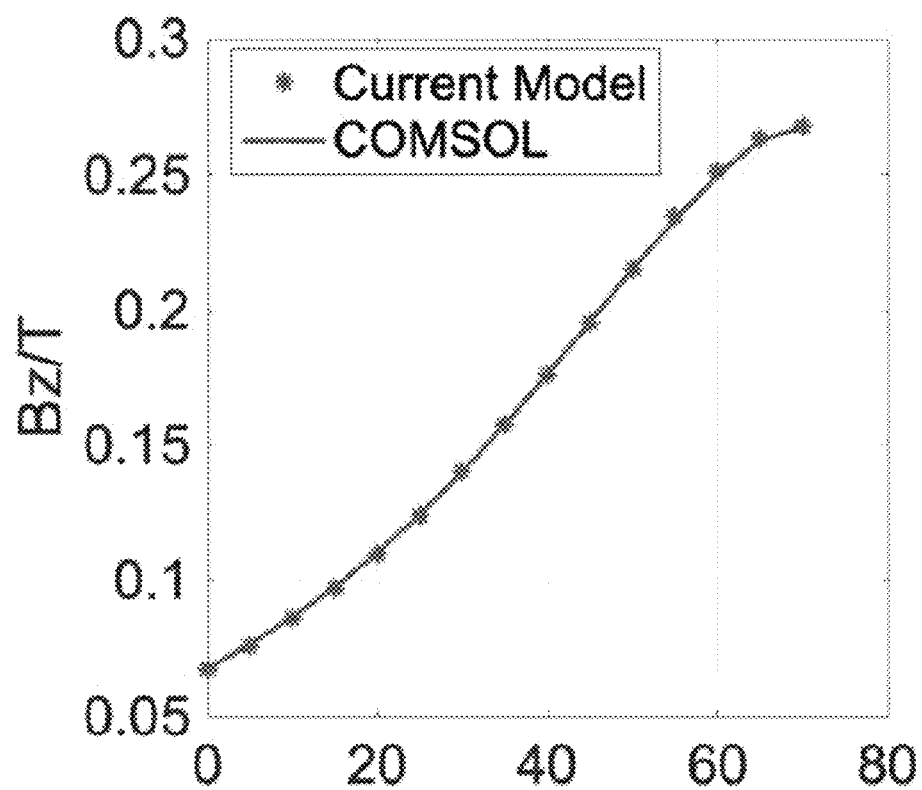
FIG. 20B shows the calculated $B_z$ on the observation points along the y-axis of the magnet segment pair shown in FIG. 20A based on MATLAB and based on COMSOL Multiphysics, according to various second example embodiments.

To validate the derivation, a fan-shaped segment pair shown in FIG. 20A was calculated using both Equation (16) and COMSOL Multiphysics. In particular, FIG. 20A shows a 3D view of a fan-shaped magnet segment pair, with the polarization of the magnets shown. FIG. 20B shows both results along the radial direction. In particular, FIG. 20B shows the calculated $B_z$ on the observation points along the y-axis (from 0 to 70 mm with a step of 5 mm) based on Equation (14) using MATLAB and those using COMSOL Multiphysics. As shown in FIG. 20B, the result using the derived current model and that using COMSOL Multiphysics (FEM-based) show a good agreement with each other.

In the GA optimization, according to various second example embodiments, the number of ring pairs, M, may be set to be 9, the thickness of each ring, t, may be set to be 12 mm, the distance of the two innermost rings, d, may be set to be 240 mm. The remanence of all the magnets may be set to be 1.4 T In various second example embodiments, a relatively high field strength with the low inhomogeneity may be obtained when the inner radii of the ring pairs are tapered outside in. To accelerate the optimization, in the current optimization according to various second example embodiments, the inner radii of the ring pairs, $R_{in}^j$ (j=1, 2, . . . , 9), were tapered outside in in the initial candidate solutions. Moreover, each magnet ring was segmented into 24 fan-shaped segments, resulting in 24 $R_{out}^i$ (j=1, 2, . . . , 24) in one individual for optimization.

To further accelerate the optimization efficiency, according to various second example embodiments, the symmetry with respect to the central $r\theta$-plane (xy-plane) and to the x-axis is set, which has advantageously been found to reduce the parameters to be optimized to be 12, which are $R_{out}^i$ (i=1, 2, . . . , 12) in one individual (configuration).

To have a monotonic field along the x-direction in the FoV, various second example embodiments identified that tapered outer radii along a semi-ring are helpful. Therefore, according to various second example embodiments, $R_{out}^i$ (i=1, 2, . . . , 12) may be set to be tapered and the number of optimization parameters was found to be further reduced. The governing equation as follows may be imposed to $R_{out}^i$'s, $$R_{out}^i = R_{out}^{max} - \rho(i-1)^\sigma \quad i=1,2,\ldots,12 \quad (17)$$

where, $\rho$ is the step reduction of the outer radius as the index of i increases, $\sigma$ is the order of the tapering function, and $R_{out}^{max}$ denotes the maximum radius among $R_{out}^i$ (i=1, 2, . . . , 12) under optimization. With the tapering function in Equation (17), the number of parameters in one individual (configuration) may advantageously be reduced from 12 to only 3. In the GA optimization according to various second example embodiments, $\rho \in [0.1\ 4]$, $\sigma \in [0.1\ 5]$, $R_{out}^{max} \in [290\ 320]$, and the population size was set to be 50 which can provide enough diversity for the candidate solutions. With the current model (the calculation time is $\frac{1}{10}$ of that using FEM) and the reduced number of optimization parameters, the forward calculation for one iteration was greatly accelerated.

VI. RESULTS

Figure 21A:
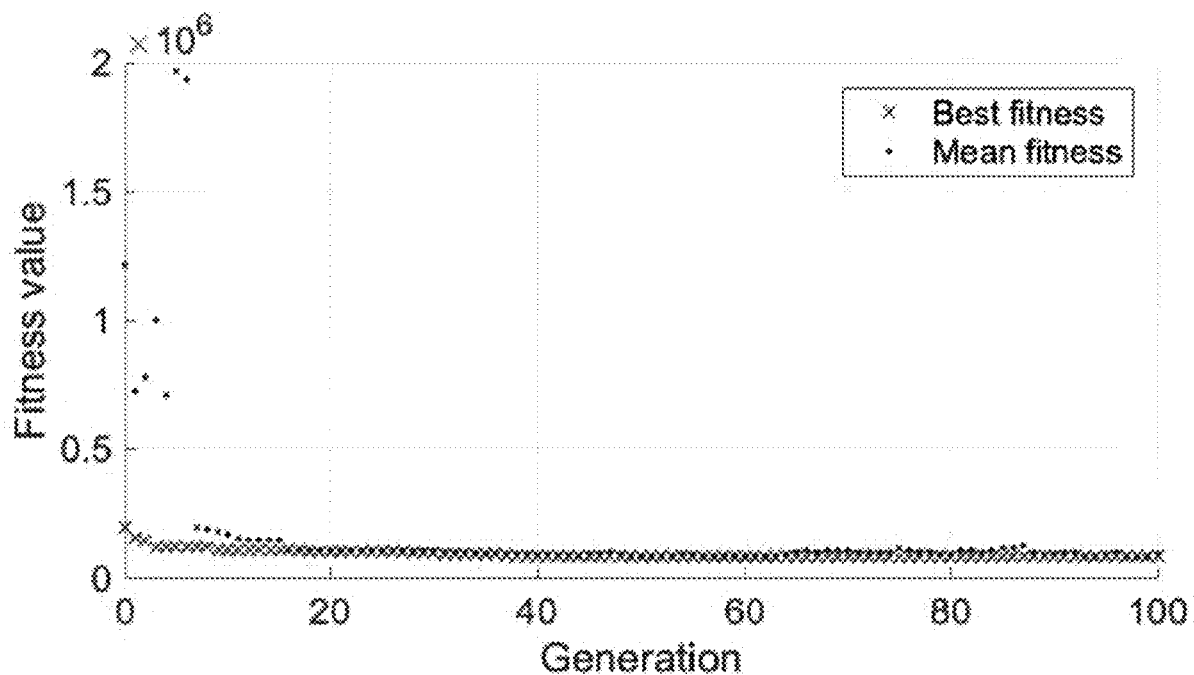
FIG. 21A depicts a plot of the change of fitness value versus iteration steps, for both the mean and the best fitness value for a candidate configuration, according to various second example embodiments of the present disclosure.
Figure 21B:
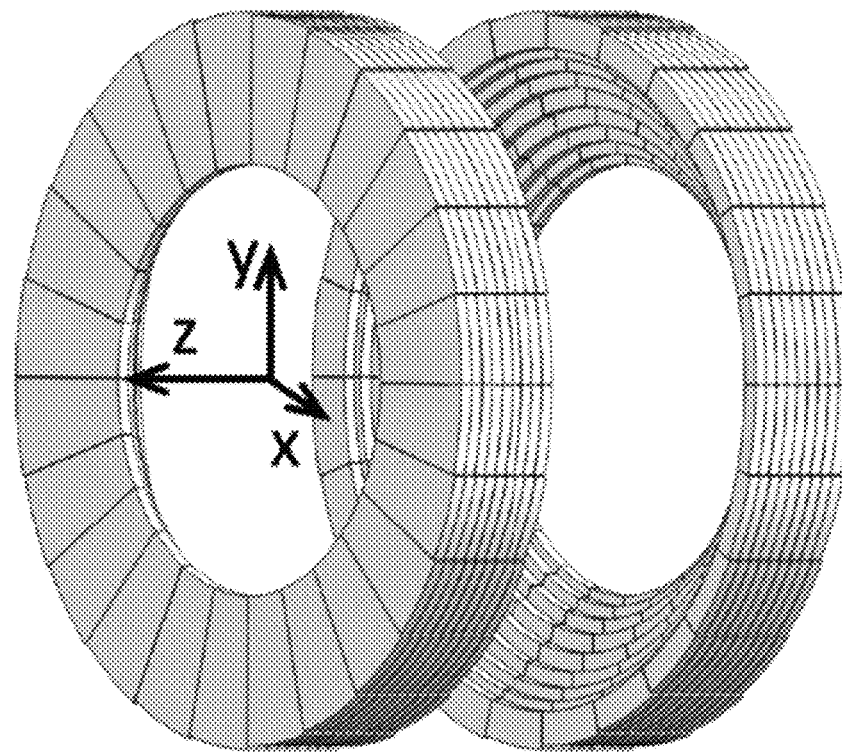
FIGS. 21B and 21C depict a perspective view and a front view of an optimized magnet array, according to various second example embodiments of the present disclosure.
Figure 21C:
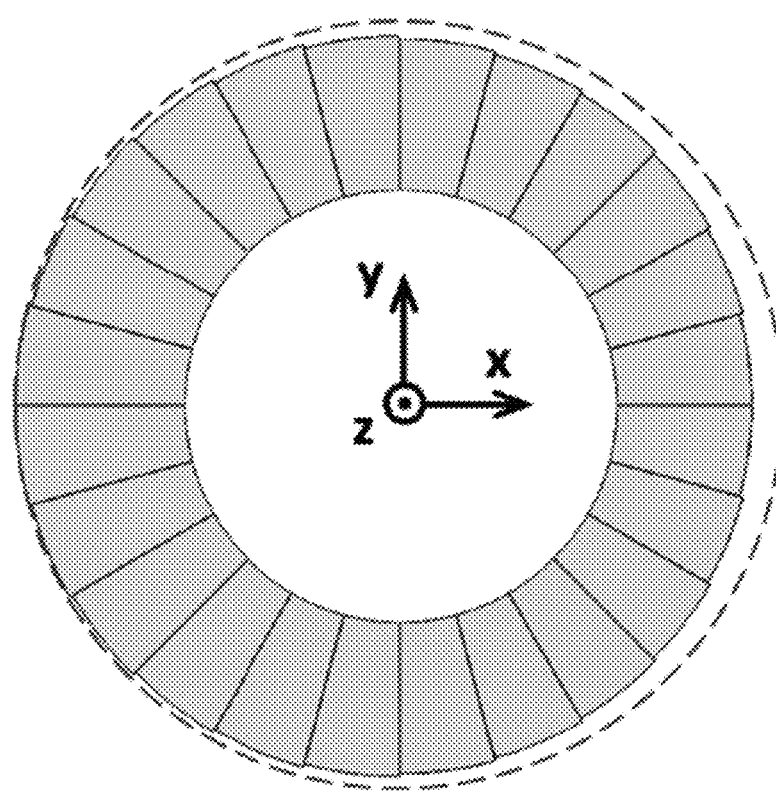

During the optimization process, the optimization may repeated multiple times since the genetic algorithm may not always converge to the same result. FIG. 21A depicts a plot of the change of fitness value versus iteration steps. In particular, FIG. 21A shows that both the mean and the best fitness value decreased as the number of iterations increased in one optimization loop. A good result with a fitness value of 61584 is presented here with a trade-off among the field strength, field inhomogeneity, and monotonicity of field pattern along the x-direction. The preset $R_{in}^j$ (j=1, 2, . . . , 9) were [276.0 267.6 256.8 243.6 228.0 212.4 199.2 188.4 180.0] (unit: mm), and the optimized values of $\rho$, $\sigma$, and $R_{out}^{max}$ were 2.3, 1.05 and 320 mm, respectively. Based on Equation (17), the optimized $R_{out}^i$ (i=1, 2, . . . , 12) were [320.0 317.7 315.2 312.7 310.1 307.5 304.9 302.3 299.6 296.9 294.2 291.5] (unit: mm). The optimized array was modeled in SolidWorks according to the optimized parameters, and the results are shown in FIGS. 21B and 21C. In particular, FIG. 21B depicts the 3D model of the optimal design, and FIG. 21C depicts a front view of the optimal magnet array according to various second example embodiments. In FIG. 21C, the dashed circle is a reference circle with a radius of 320 mm.

Figure 22A:
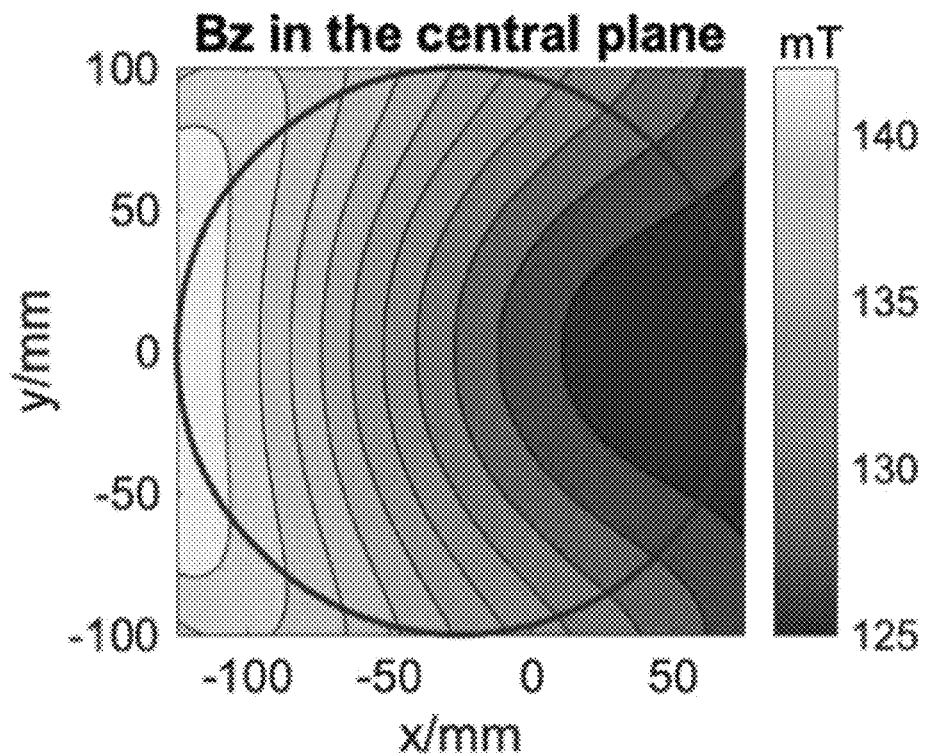
FIGS. 22A to 22C show the $B_z$ generated by the optimized magnet array shown in FIGS. 21B and 21C in the central xy-plane (z=0 mm) (FIG. 22A), in the side xy-plane (z=25 mm) (FIG. 22B), and in the xz-plane (y=0 mm) (FIG. 22C) of the FoV calculated in MATLAB, according to various second example embodiments of the present disclosure.
Figure 22B:
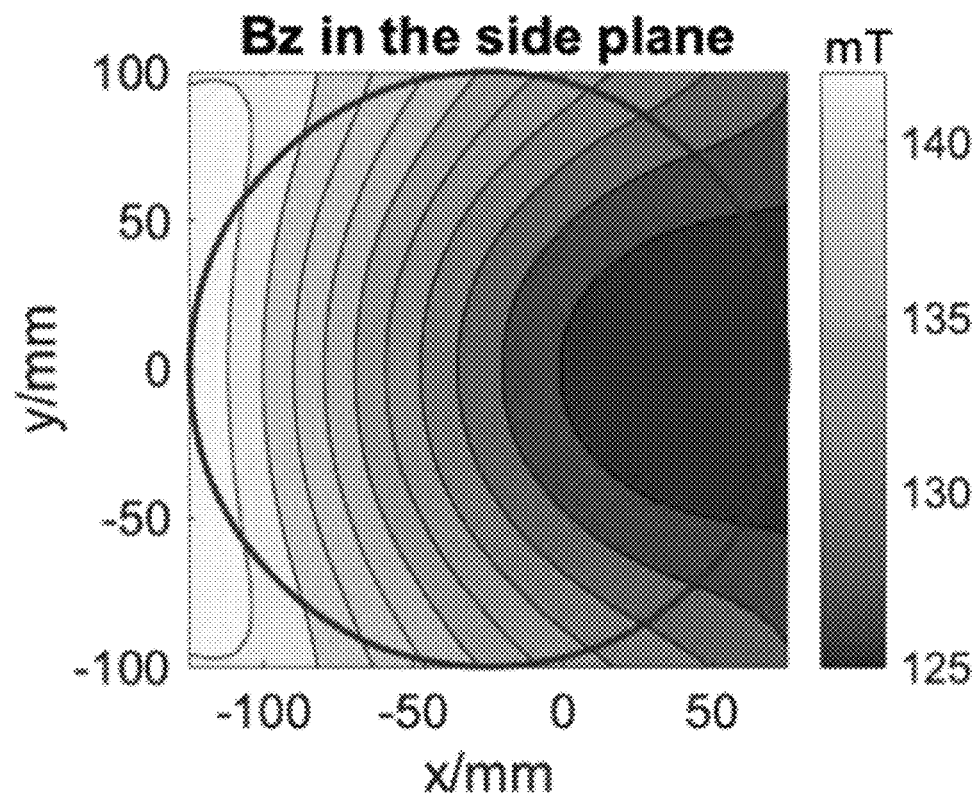
Figure 22C:
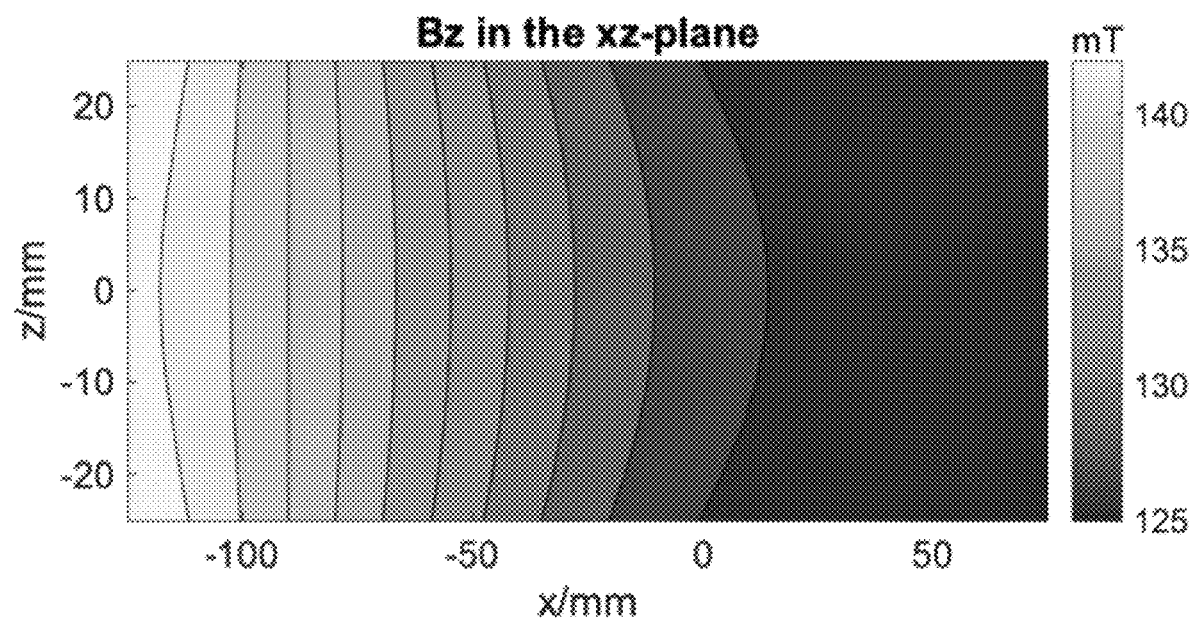
Figure 22D:
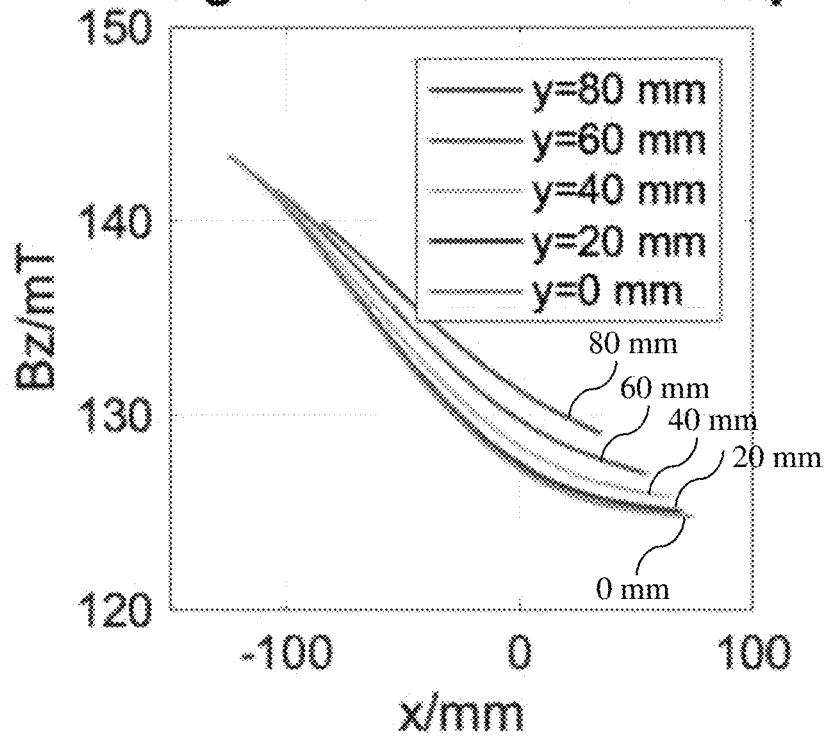
FIGS. 22D and 22E show the $B_z$ generated by the optimized magnet array shown in FIGS. 21B and 21C along the x-direction in the central xy-plane (z=0 mm) (FIG. 22D), and in the side xy-plane (z=25 mm) in the FoV (FIG. 22E), according to various second example embodiments of the present disclosure.
Figure 22E:
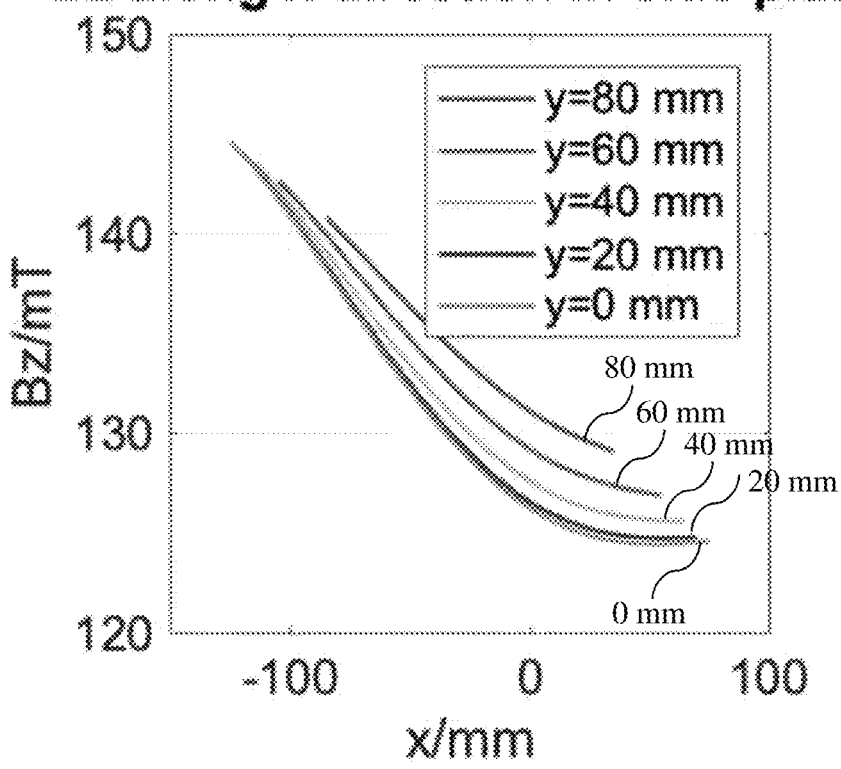

The field patterns of the optimal structures were calculated using Equation (14) for an evaluation. The optimized magnet array provides a $B_0$ field (z-components of the magnetic field generated by the magnet array according to various second example embodiments) with an average field strength of 132.98 mT and the field homogeneity of 151840 ppm in the FoV. FIGS. 22A to 22C show the $B_z$ distribution in the xy-plane at z=0 and 25 mm, and $B_z$ distribution in the xz-plane at y=0 mm, respectively. In particular, FIGS. 22A to 22C show the $B_z$ generated by the optimized magnet array in the central xy-plane (z=0 mm) (FIG. 22A), in the side xy-plane (z=25 mm) (FIG. 22B), and in the xz-plane (y=0 mm) (FIG. 22C) of the FoV calculated in MATLAB. FIGS. 22D and 22E show the $B_z$ along the x-direction at y=0, 20, 40, 60 and 80 mm within the planes shown in FIGS. 22A and 22B in the FoV, respectively. In particular, FIGS. 22D and 22E shows the $B_z$ along the x-direction at y=0, 20, 40, 60, 80 mm in the central xy-plane (z=0 mm) (FIG. 22D), and in the side xy-plane (z=25 mm) in the FoV (FIG. 22E).

As shown in FIGS. 22A to 22C, $B_z$ decreases monotonically from left to right, especially when −125 mm<x<25 mm. The monotonicity of the field can clearly be seen from the 1D plots along different lines in FIGS. 22D and 22E. When −125 mm<x<50 mm and −20 mm<y<20 mm, the gradient is about 122.5 mT/m and 140 mT/m in the xy-plane at z=0 and 25 mm, respectively. Outside the region of −20 mm<y<20 mm, the region that shows linear fields is smaller and the gradient is smaller as well. For example, when y=60 mm, the field shows a linearity from −105 mm to 0 mm, with a gradient of about 105.7 mT/m and 121 mT/m in the xy-plane at z=0 and 25 mm, respectively. As can be seen from FIGS. 22A to 22E, through the optimization when the inner radii of the rings were tapered outside in and the outer radii of each ring segment were tapered along the x-direction and optimized, a field monotonicity along the x-axis was successfully obtained for imaging.

Figure 23A:
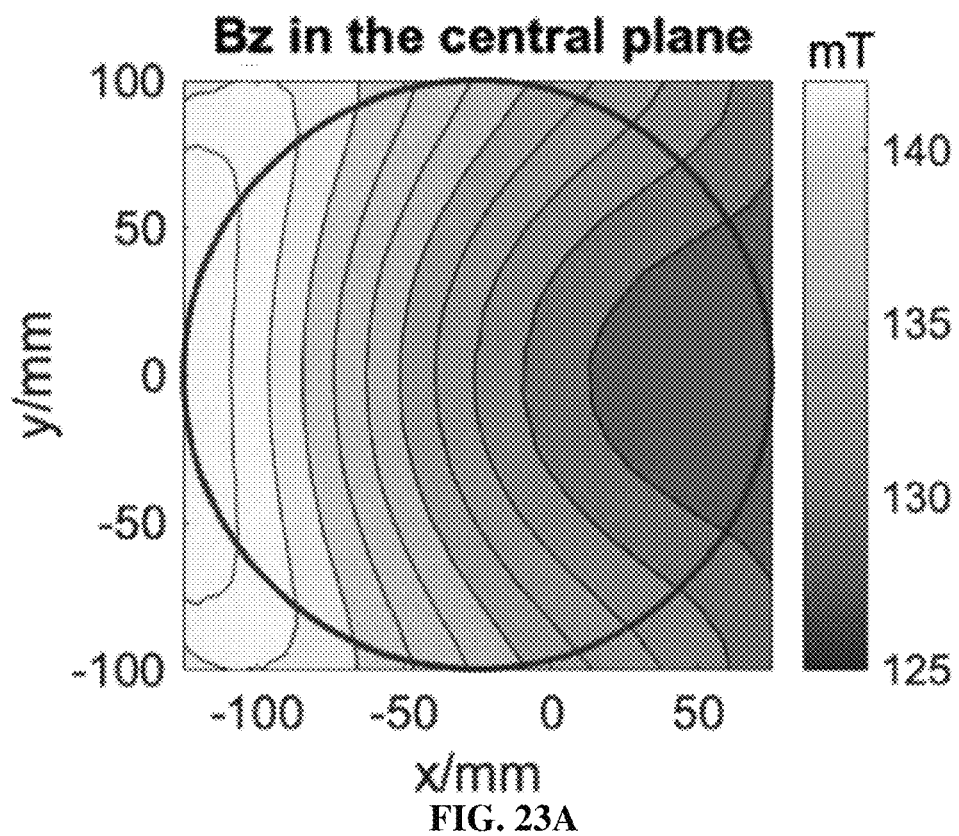
FIGS. 23A to 23C depict simulation performed in COMSOL Multiphysics to validate the optimized magnet array design, namely, the simulated $B_0$ field in the central xy-plane (z=0 mm) (FIG. 23A), the $|B_{xy}/B_0|$ (unit: %) in central plane of the FoV (FIG. 23B), and the simulated $B_0$ field in the xz-plane (y=0 mm) (FIG. 23C), according to various second example embodiments of the present disclosure.
Figure 23B:
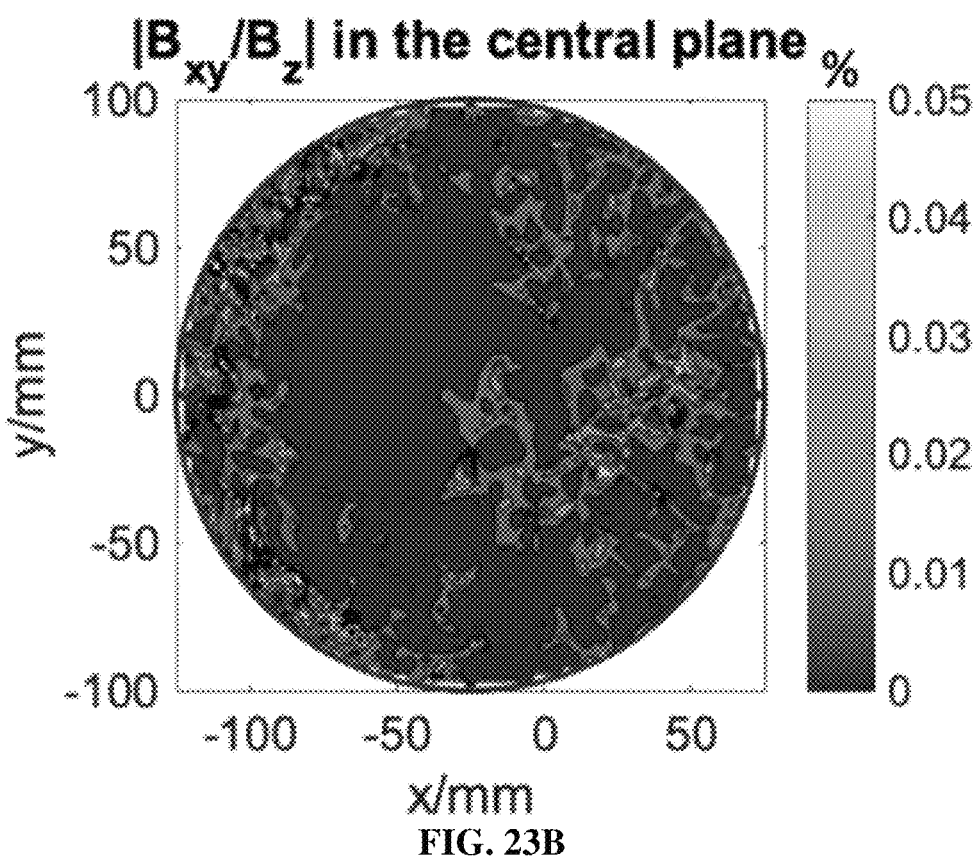
Figure 23C:
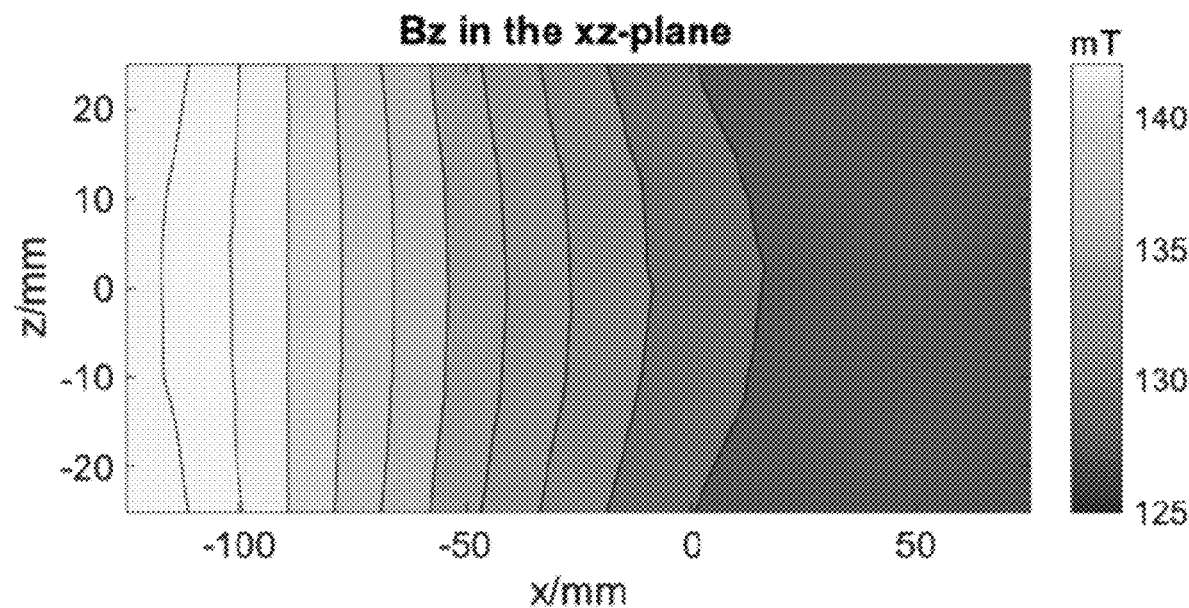

A realistic simulation was done in COMSOL Multiphysics to validate the optimal design. The simulated $B_z$ field in the central xy-plane (z=0 mm) and in the xz-plane (y=0 mm) were shown in FIGS. 23A and 23C, respectively. In particular, FIG. 23A depicts the simulated $B_0$ field in the central xy-plane (z=0 mm), and FIG. 23C depicts the simulated $B_0$ field in the xz-plane (y=0 mm). Compared to the $B_0$ field shown in FIGS. 22A and 22C, the current model and COMSOL Multiphysics showed the almost same field pattern in the FoV for the optimal design. The average field strength and field inhomogeneity from the COMSOL Multiphysics were 134.69 mT and 145680 ppm, and the differences compared to the current model are within 1.3% and 4.1%, respectively. They showed good agreement with each other, and the effectiveness of the optimization was validated. The x- and y-components of the magnetic field in FoV were also studied here, and the $|B_{xy}/B_0|$ (unit:%) in the FoV was calculated and shown in FIG. 23B. In particular, FIG. 23B depicts the $|B_{xy}/B_0|$ (unit: %) in central plane of the FoV. As can be seen, $|B_{xy}/B_0|$ is below 0.05% in the central plane of the FoV, and the z-components are dominant in the $B_0$ field generated.

Figure 24A:
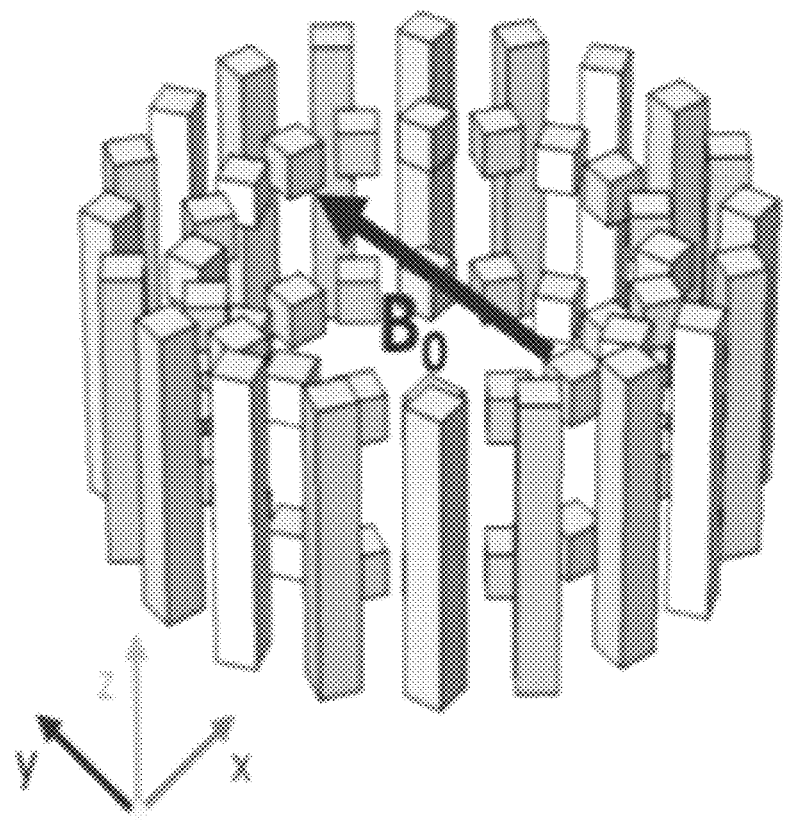
FIGS. 24A and 24B show a 3D model of a short sparse Halbach array, and an associated simulated field distribution in the central xy-plane, respectively.
Figure 24B:
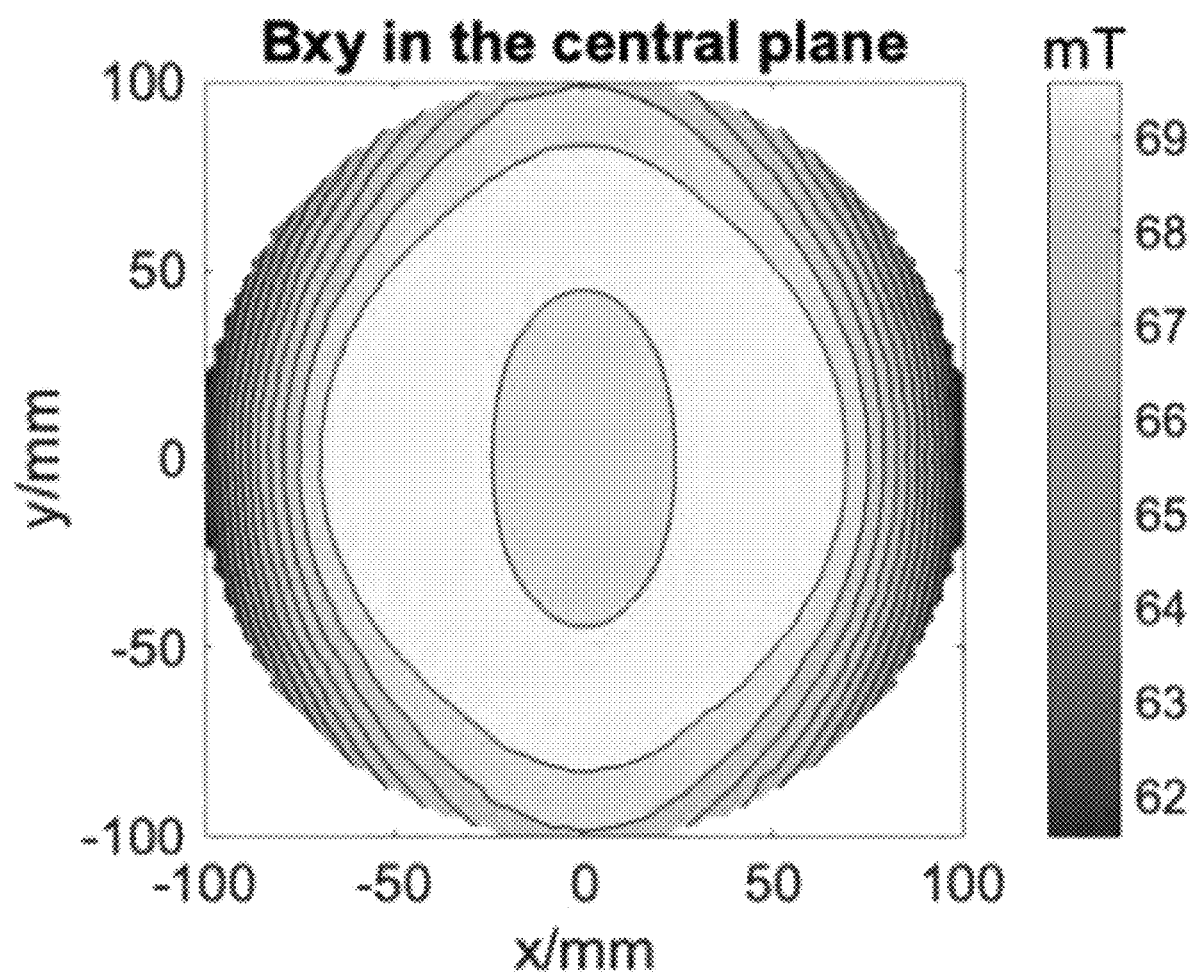

The optimized magnet array is compared to a sparse Halbach array in terms of the fields they generate, and when the fields they generate are used as SEMs for imaging. FIGS. 24A and 24B show a 3D model of a short sparse Halbach array, and the simulated field distribution in the central xy-plane (with a diameter of 200 mm), respectively. In particular, FIG. 24A shows a 3D model of a reference short sparse Halbach array, whereby the outer diameter of the Halbach cylinder is 380 mm, and includes 201'×1'×6.5' N52 NdFeB magnet bars and 40 1'×1'×1' N52 NdFeB magnet cubes. FIG. 24B shows the simulated field distribution in the central xy-plane (z=0 mm) of the Halbach array using COMSOL Multiphysics. As can be seen in FIG. 24B, there are considerable regions where gradients are low or zero, especially in the central region. Comparing the field pattern of the proposed magnet array in FIGS. 22A to 22C and that of the Halbach array in FIG. 24B, it can be seen that most of the regions with low or zero gradients were successfully eliminated.

The fields from both the magnet array according to various second example embodiments and the Halbach array (shown in FIG. 22A and FIG. 24B) were evaluated by examining the quality of reconstructed images when they are applied as SEMs to encode signals of a Shepp-Logan phantom shown in FIG. 25A by using simulation. For encoding, all SEMs were rotated 180° with a step of 2.8125° (total step number of 64). Eight surface coils with a diameter of 50 mm were located around the side wall of the cylindrical FoV, and used for signal reception. The spin echo signals were collected with quadrature demodulation by using CPMG pulse sequences in the simulation. At each angle, 256 readouts with a dwell time of 25 us were collected for image reconstruction. The SNR of NMR signal was set to be 20 dB for both SEMs for their relatively low field strength, and the field strength and field inhomogeneity were normalized to be the same level (mean($B_0$)=100 mT, $\Delta B_0$=1 mT) to eliminate of influence of the field strength and inhomogeneity on the quality of reconstructed images. Conjugate gradient (CG) based iterative time domain reconstruction (iTDR) was used for the image reconstruction. FIGS. 25B and 25C show the reconstructed images using the field of the Halbach array (FIG. 24B), and that using the central part of the magnetic field from the magnet array according to various second example embodiments (FIG. 22A) by using simulation, respectively. In particular, FIG. 25B shows a reconstructed image using the reference magnetic field generated by the Halbach array in FIG. 24A, FIG. 25C shows a reconstructed image using the $B_0$ field generated by the optimized magnet array, FIG. 25D shows a reconstructed image using the reference magnetic field generated by the further optimized array with improved monotonicity in FIGS. 26A to 26E.

For example, comparing the images in FIGS. 25B and 25C, clearer features can be seen in the image by using the fields from the proposed array which have an improved monotonicity. The normalized root mean square error (NRMSE) of the image using the proposed array was reduced by about 22.73% from 10.03% to 8.02% compared to that using the reference Halbach array. As can be seen in FIGS. 25B and 25C, the blurring, especially at the center of the image was greatly reduced with the proposed array compared to the reference Halbach array. The structural similarity index (SSIM) of the image using the proposed array was 0.296 with respect to FIG. 25A, which showed an improvement of about 54.94% compared to that using the Halbach array (the SSIM was 0.191). Clearer images can be reconstructed using the magnetic field of the proposed array, which is attributed to the removal of the central zero-gradient region, and that of the regions with low gradients in the field pattern of the proposed array from that of a Halbach array.

VII. DISCUSSION

Accordingly, it has been shown that the irregular-shaped IO ring pair magnet array according to various second example embodiments provides a monotonic field along a single direction in the central plane of a cylindrical FoV that works for head imaging. Through optimization using genetic algorithm, the field strength may be maintained at above 130 mT with the inhomogeneity controlled at 151840 ppm within the FoV. Due to the linearity in gradient, it serves better as a SEM leading to a better image quality in an MRI system, comparing to a Halbach array and the IO magnet ring-pair aggregate according to various first embodiments. For a Halbach array with a quadrupolar $B_0$ field pattern, there are regions where the gradients are low or zero, whereas for an IO magnet ring-pair aggregate according to various first example embodiments, a gradient in the θ-direction is missing although they may be compensated by adding additional structures or additional mechanical movements of the magnet when conducting encoding. Comparing to an optimized sparse Halbach array, the magnet array according to various second example embodiments has a similar length (45.6 cm vs. 45.7 cm in length), but a larger diameter by 21.9% (64 cm vs. 52.5 cm in diameter), and both were designed and optimized to obtain a monotonic SEM for imaging in a FoV with a diameter of 20 cm. The magnet array according to various second example embodiments generates a $B_0$ field with an average field strength of 132.98 mT, which is 64% higher compared to 81.1 mT of the sparse array. However, the field inhomogeneity of the sparse Halbach array may only be about 10% of the magnet array according to various second example embodiments. A large inhomogeneity requires a wider bandwidth of the RF system, which will be discussed in the next paragraph. Overall, the irregular-shaped IO ring-pair magnet array according to various second example embodiments can be a good candidate to supply the SEM in a low-field portable MRI system, besides a sparse Halbach array.

The field homogeneity from the optimized array is decreased from 24786 ppm to 151840 ppm compared to the IO ring-pair aggregate according to various first example embodiments, which can be considered as the trade-off for the field monotonicity to favor spatial encoding. The low homogeneity results in the fact that a wide bandwidth are needed for radio-frequency (RF) excitation and signal reception, which may require RF coils and the CONSOLE to have wide working frequency bands. Therefore, as a result, the RF hardware may be required to be re-engineered to obtain a corresponding broad working bandwidth. Ultra broadband techniques for RF system has previously been proposed for NMR/MRI systems. A broad-band RF system can by achieved by using, for example, a transformer-based non-resonant transmitter and receiver which covers a broad frequency range, or using a receiver with a binary switch array to switch the resonant frequencies spanning in a significantly wide bandwidth.

Figure 26A:
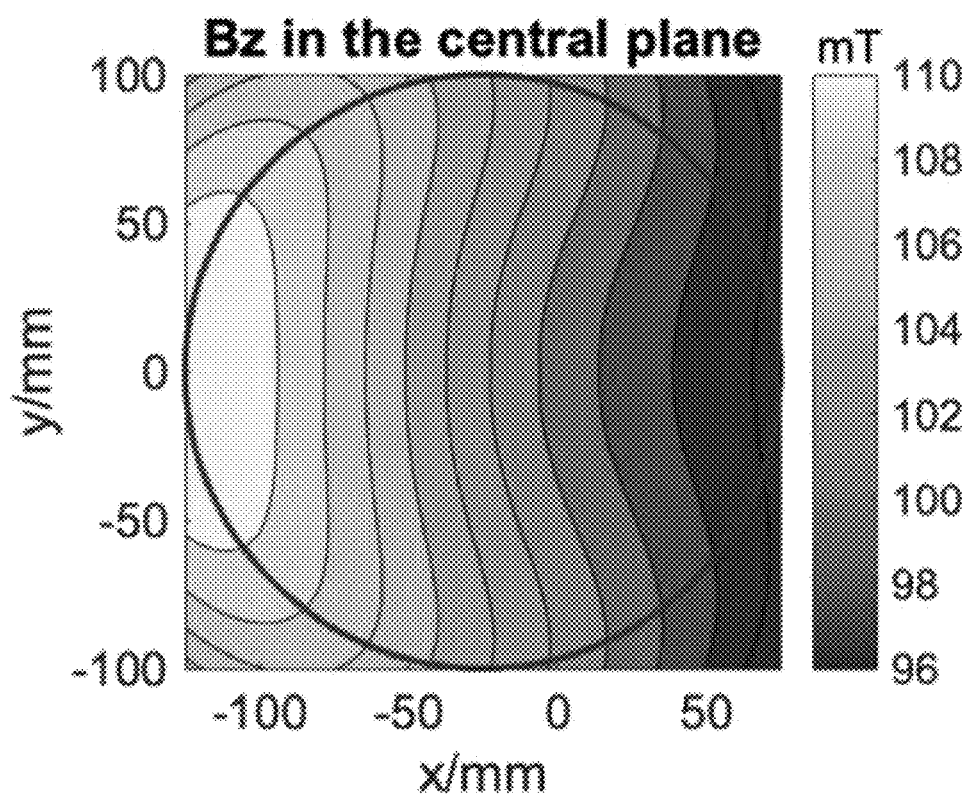
FIGS. 26A to 26C show the $B_z$ generated by a further optimized design with more field monotonicity in the central xy-plane (z=0 mm) (FIG. 26A), in the side xy-plane (z=25 mm) (FIG. 26B), and in the xz-plane (y=0 mm) (FIG. 26C) in the FoV calculated in MATLAB, according to various second example embodiments of the present disclosure.
Figure 26B:
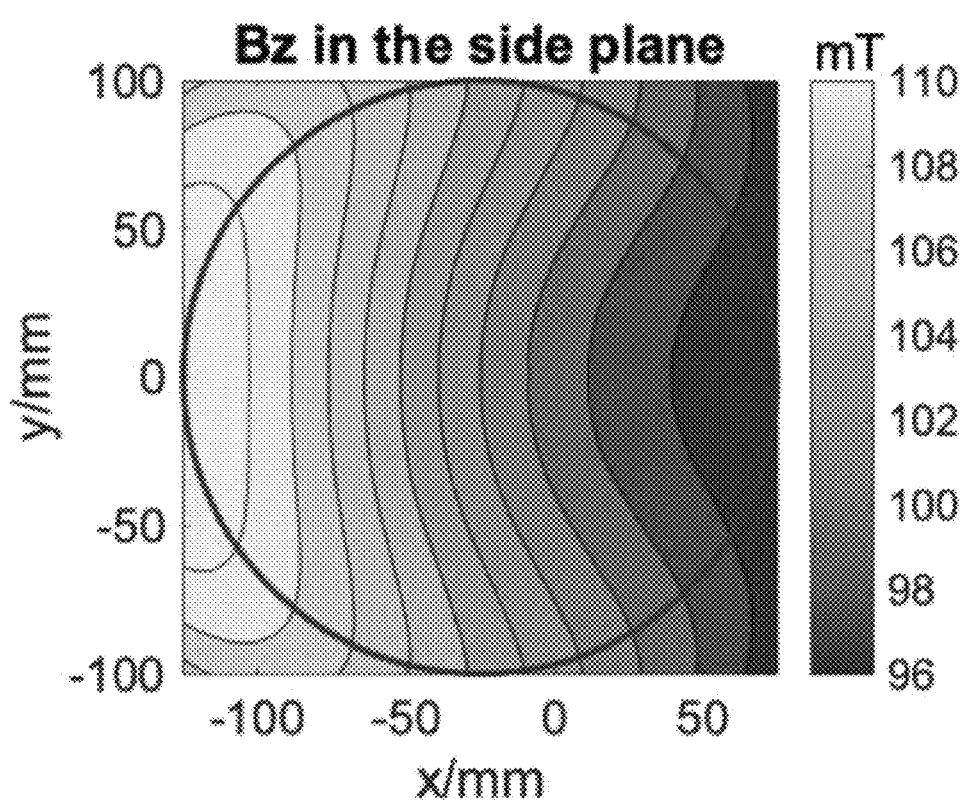
Figure 26C:
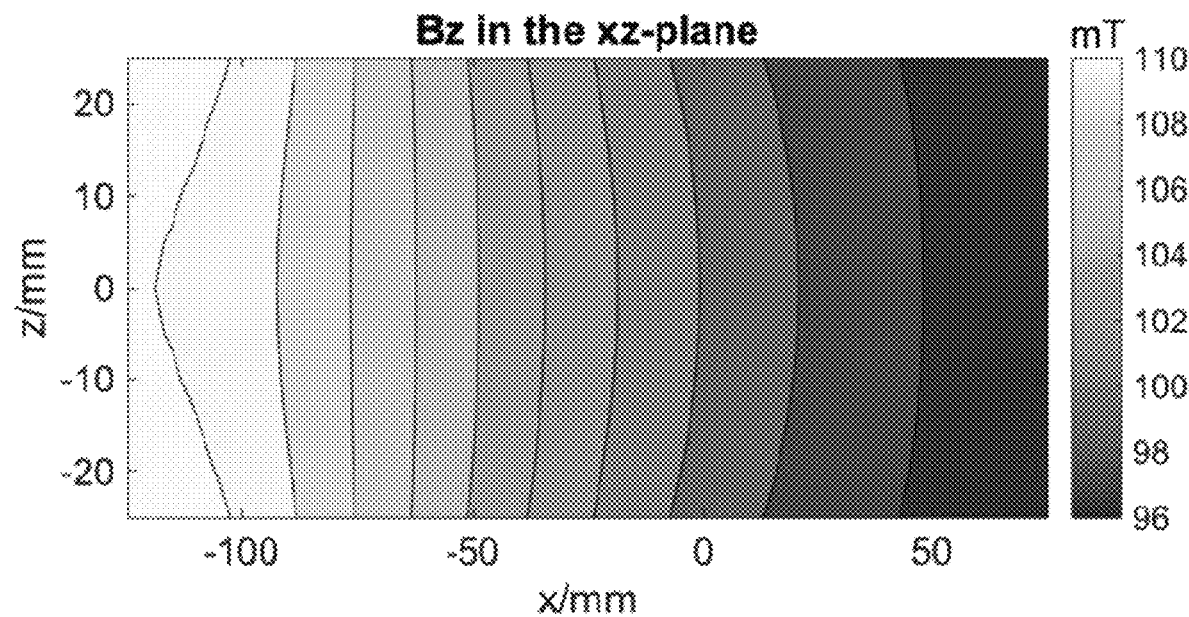
Figure 26D:
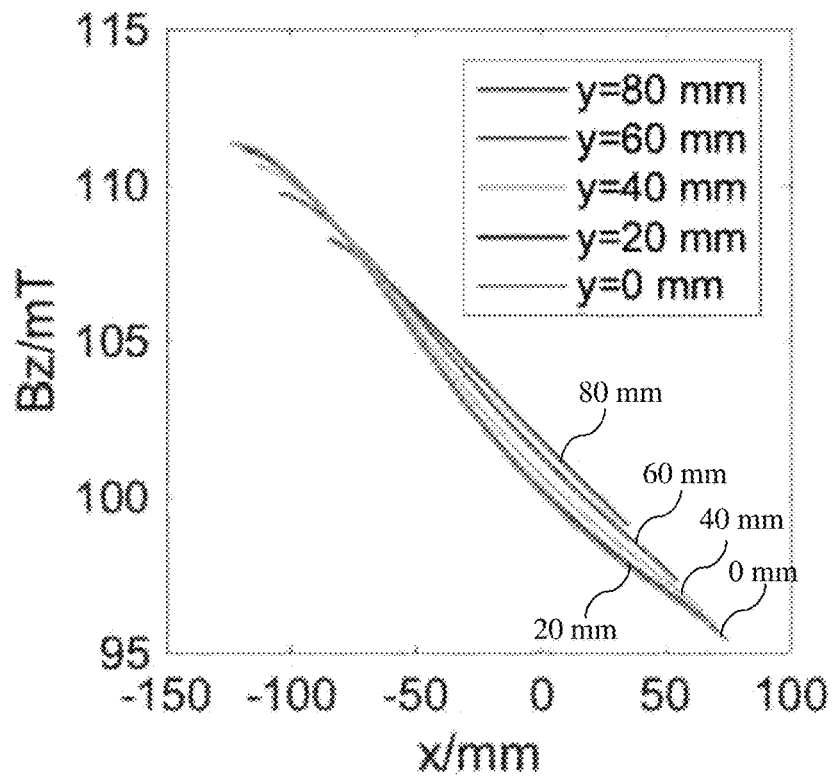
FIGS. 26D and 26E show the $B_z$ along the x-direction in the central xy-plane (z=0 mm) (FIG. 26D), and in the side xy-plane (z=25 mm) (FIG. 26E) in the FoV, according to various second example embodiments of the present disclosure.
Figure 26E:
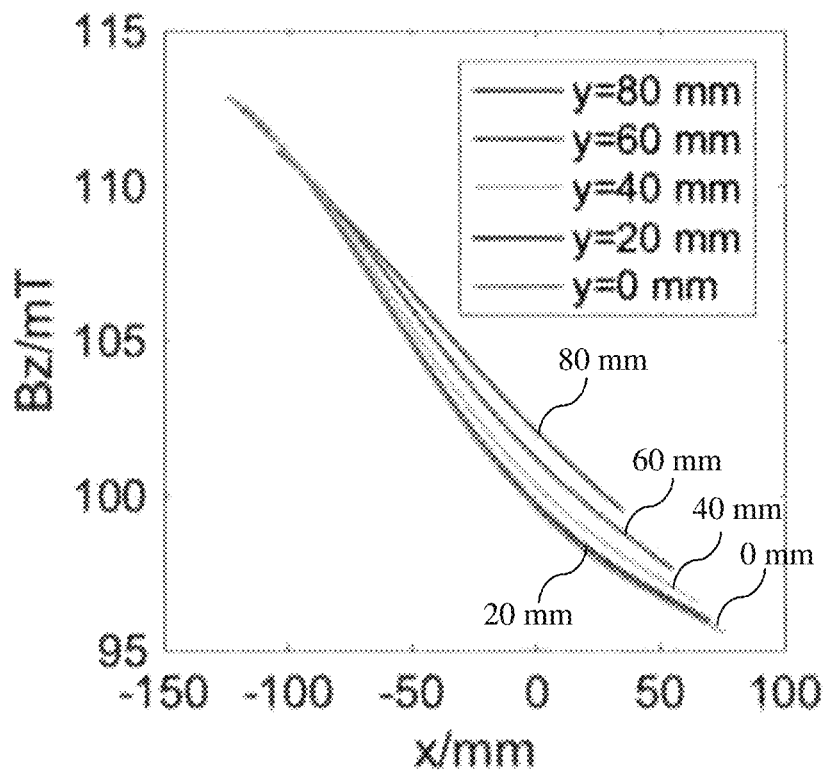

If the requirement for homogeneity can be relaxed further with the implementation of ultra broadband techniques, a more linear field can be obtained from the genetic algorithm optimization. FIGS. 26A to 26E shows the $B_0$ field from a design with the relaxed field homogeneity but a much more uniform monotonic gradient pattern compared to the design presented in section "VI. Results". In particular, FIGS. 26A to 26C shows the $B_z$ generated by a further optimized design with more field monotonicity in the central xy-plane (z=0 mm) (FIG. 26A), in the side xy-plane (z=25 mm) (FIG. 26B), and in the xz-plane (y=0 mm) (FIG. 26C) in the FoV calculated in MATLAB. FIGS. 26D and 26E show the $B_z$ along the x-direction at y=0, 20, 40, 60, 80 mm in the central xy-plane (z=0 mm) (FIG. 26D), and in the side xy-plane (z=25 mm) (FIG. 26E) in the FoV.

The preset $R_{in}^j$ (j=1, 2, . . . , 9) were the same as those presented in section "VI. Results", and the optimized $R_{out}^i$ (i=1, 2, . . . , 12) were [300 297.6 295.2 292.8 290.4 288.0 285.6 283.2 280.8 278.4 276.0 273.6] (unit: mm). This further optimized design provides a $B_0$ field with an average field strength of 103.04 mT, the field inhomogeneity of 178960 ppm in FoV, and the gradient fields range from 82.1 mT/m to 85.2 mT/m along the x-direction in the region −100 mm<x<50 mm in the central xy-plane (z=0 mm) of the FoV. Compared to the results presented in FIGS. 22A to 22E, with a compromised field strength and field homogeneity, the monotonic region is wider along the x-direction and the gradients are close to each other at different values of y. The uniformity of gradients along the y-direction helps to improve the uniformity of resolution in the reconstructed images. FIG. 25D shows the reconstructed image by using the magnetic field in FIG. 26A by using simulation, and it showed the 4:36% improvement in terms of the NRMSE with a NRMSE of 7.67% compared to FIG. 25C. In the meanwhile, the Gibbs (truncation) artifacts at the zoomed-in regions shown in FIG. 25D were greatly removed with the more linear SEM compared to those shown in FIG. 25C. However, it is worth pointing out that an improved monotonicity is obtained at a price of having a lower field strength and the lower field homogeneity, which may cause a low SNR and a consequent low spatial resolution, and a wide working frequency band for the RF system, respectively.

Figure 27:
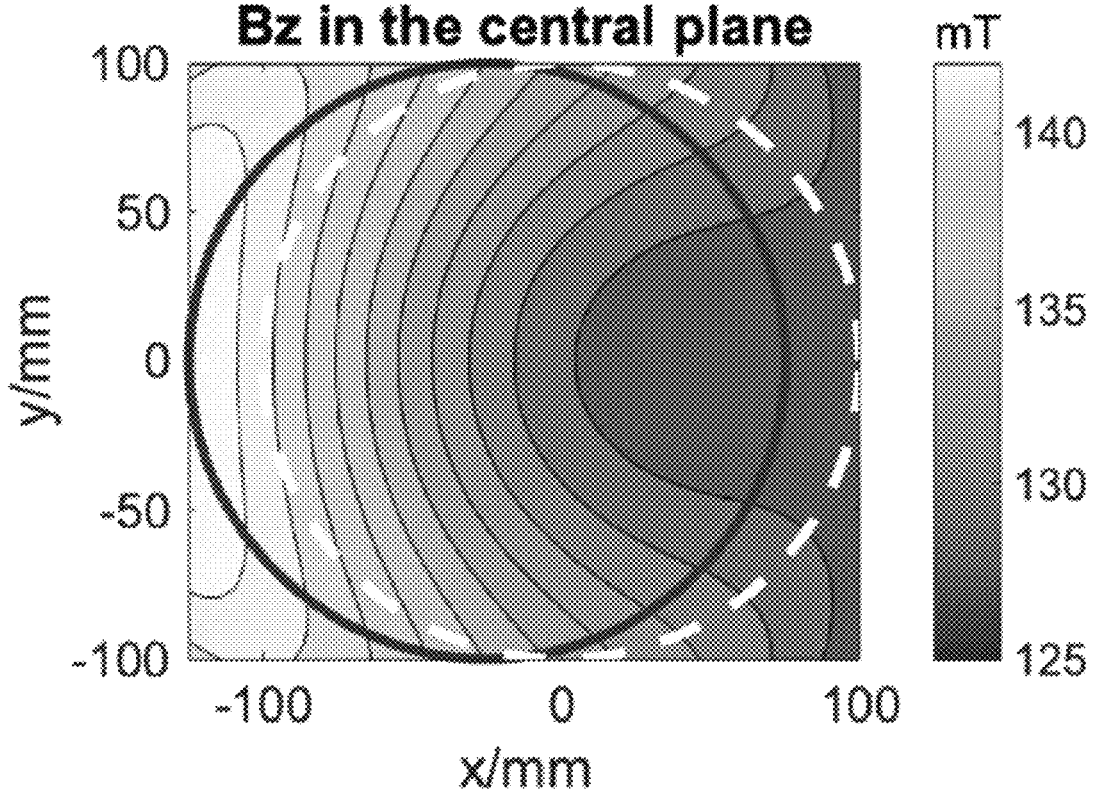
FIG. 27 illustrates a circle enclosing the FoV with the center 25 mm off the center of the array along the negative x-direction in the xy-plane (z=0 mm), according to various second example embodiments of the present disclosure.

The FoV is 25 mm off the center of the magnet array to have more regions with monotonic gradients, avoiding the area where the gradient is low (as shown in FIG. 27). The magnet array will be rotated around the center of the FoV rather than the center of the magnet array to facilitate a non-Fourier transform image reconstruction. A rotation mechanism can be designed accordingly to achieve this off-center rotation. In particular, in FIG. 27, the circle encloses the FoV with the center 25 mm off the center of the array along the negative x-direction in the xy-plane (z=0 mm), and the dashed white circle encloses the one without the offset distance.

Figure 28A:
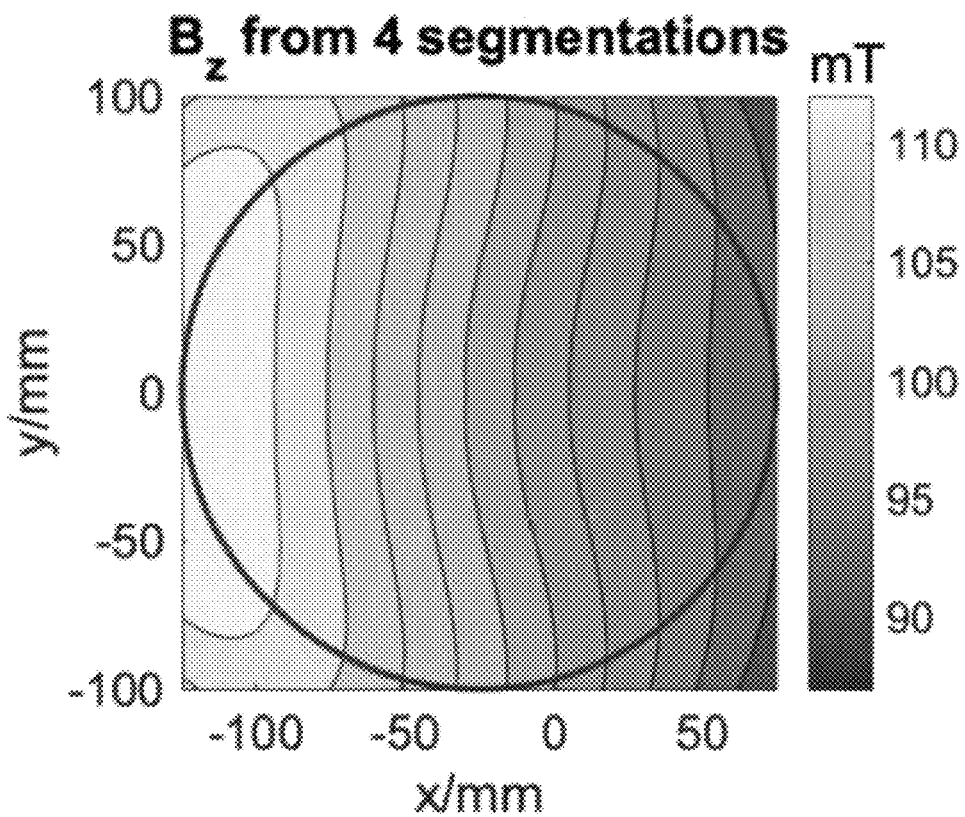
FIGS. 28A to 28F show the $B_0$ field generated by the irregular-shaped IO ring-pair magnet array presented in FIG. 26 with each annular magnet segmented to 4, 8, 12, 18, 24, and 36 fan-shaped magnets, respectively, according to various second example embodiments of the present disclosure.
Figure 28B:
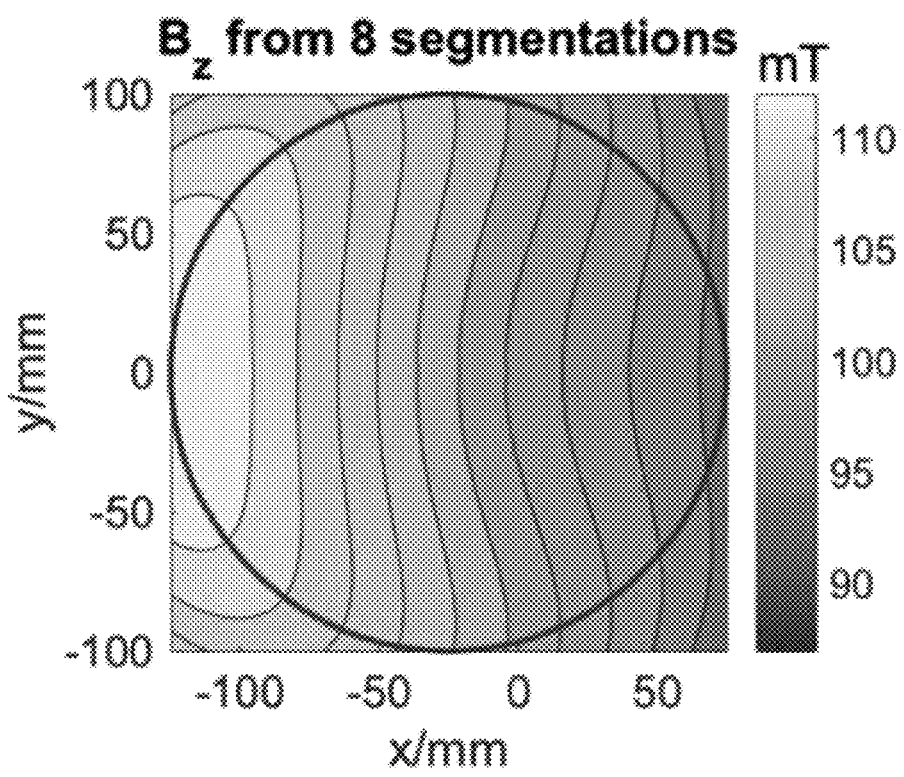
Figure 28C:
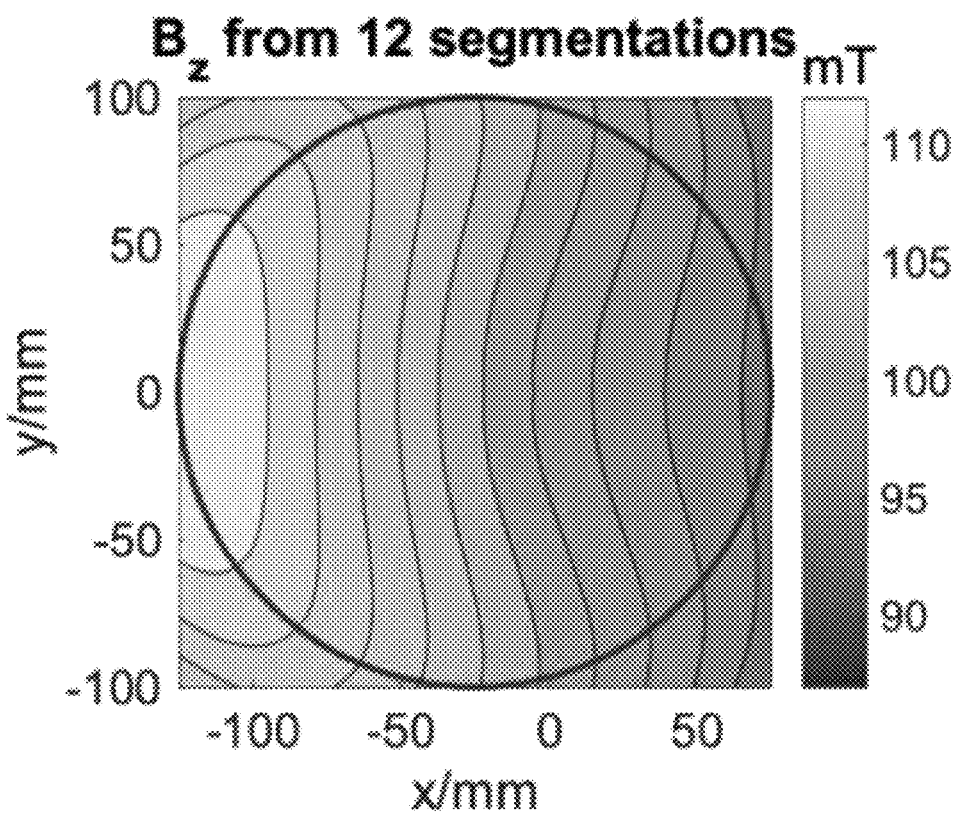
Figure 28D:
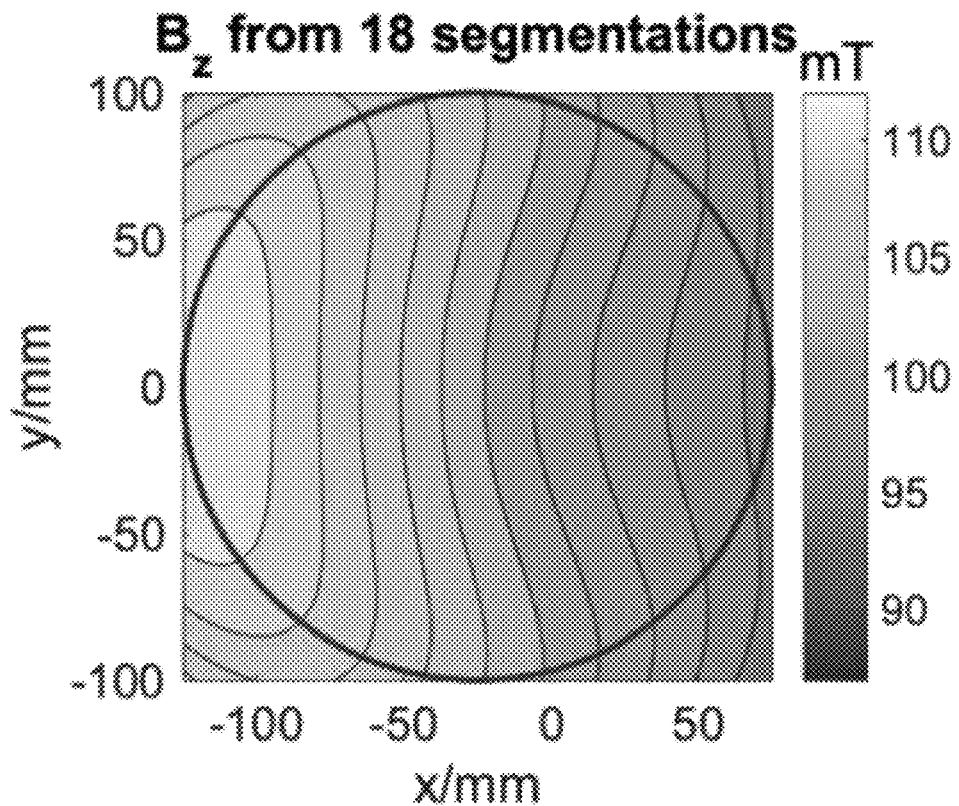
Figure 28E:
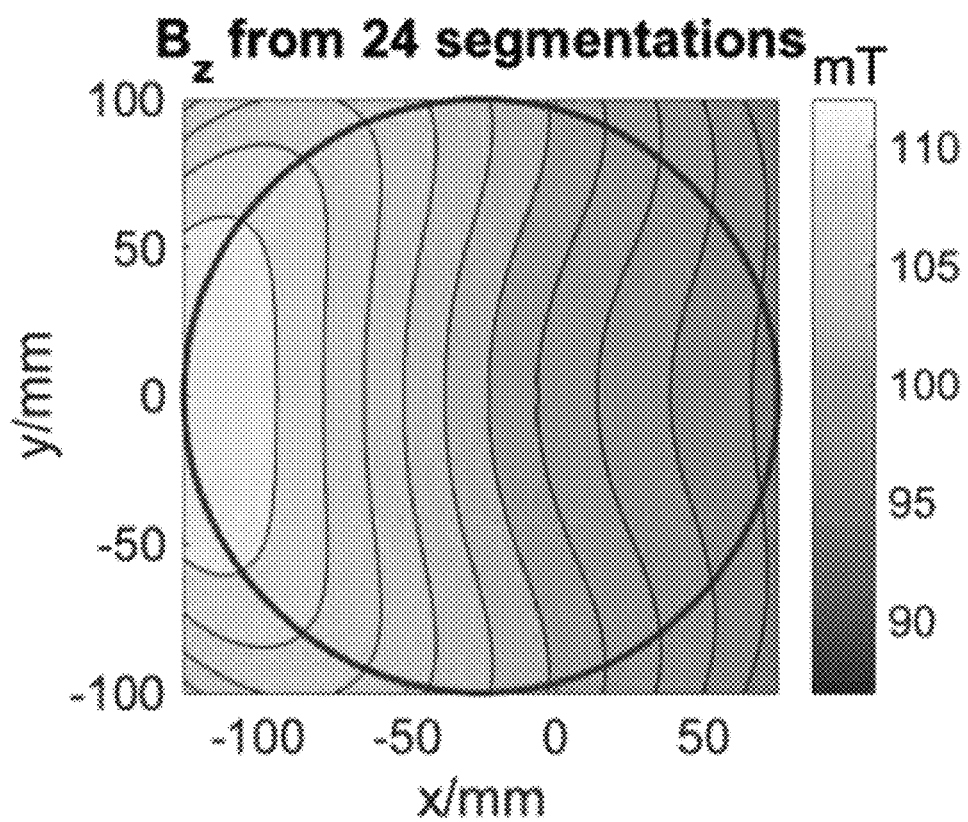
Figure 28F:
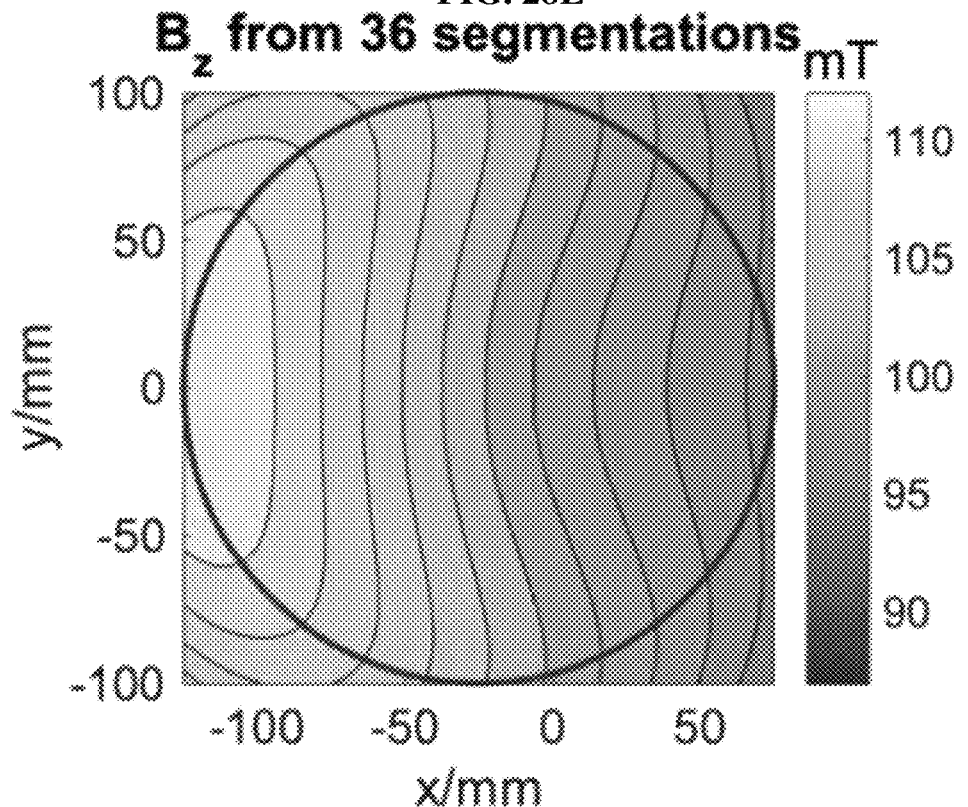
Figure 28G:
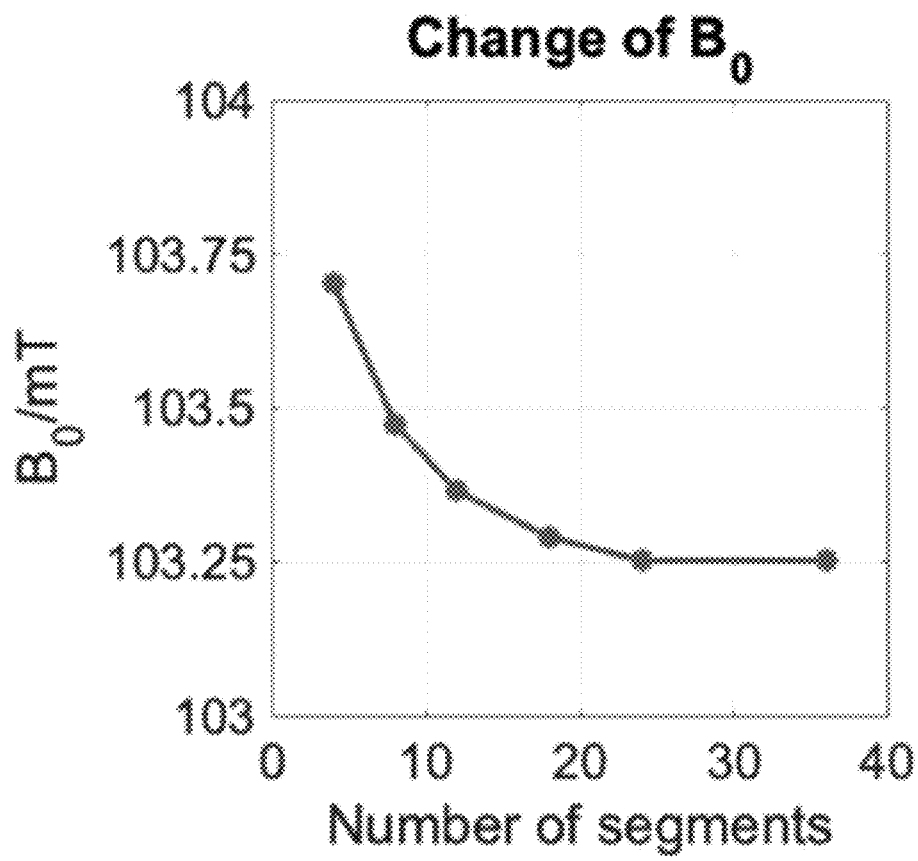
FIGS. 28G and 28H show the changes of the average $B_0$ field strength ($B_{0\text{-}avg}$) and the field inhomogeneity with the increase of number of segments, according to various second example embodiments of the present disclosure.
Figure 28H:
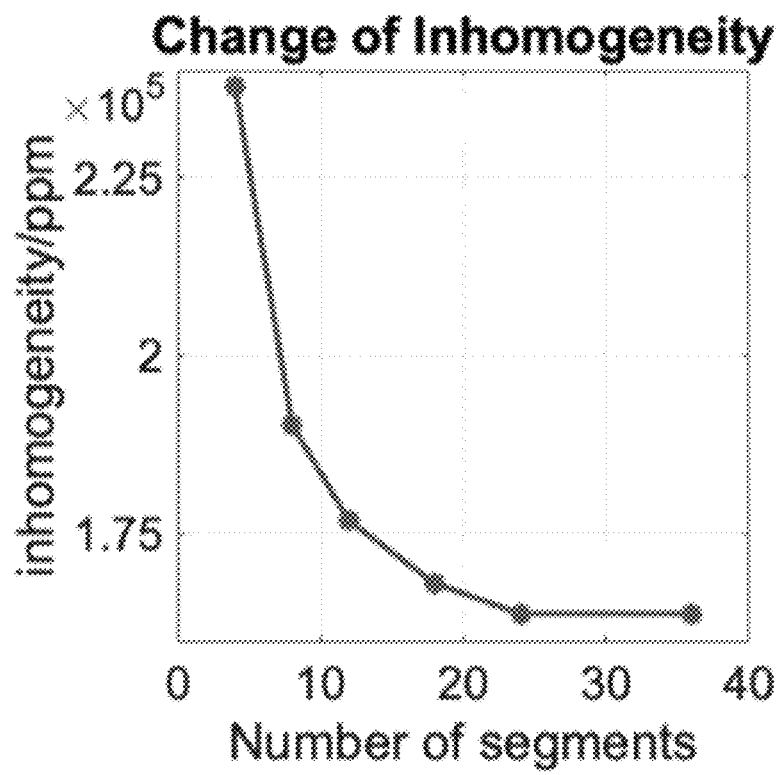

The smaller number of segments are helpful to reduce the cost of the whole magnet array. Here, the influence of the number of segments on the field pattern was investigated. Each annular magnet under optimization was segmented to 4, 8, 12, 18, 24, and 36 fan-shaped elements, and calculated using Equations (7) and (8), respectively. In all six cases, the $R_{out}^i$ were tapered from 300 mm to 273.6 mm (as the design shown in FIGS. 26B and 26C) according to the Equation (17). The $B_0$ field calculated in the central xy-plane (z=0 mm) of FoV based on different segmentations are shown in FIGS. 28A to 28F. In particular, FIGS. 28A to 28F show the $B_0$ field generated by the irregular-shaped IO ring-pair magnet array presented in FIG. 26 with each annular magnet segmented to 4, 8, 12, 18, 24, and 36 fan-shaped magnets, respectively. FIGS. 28G and 28H show the changes of the average $B_0$ field strength ($B_{0-avg}$) and the field inhomogeneity (unit: ppm) with the increase of number of segments. As can be seen, the segmentation with different element numbers showed a similar field pattern and average field strength. However, the field inhomogeneity was influenced a lot by the number of segments as shown in FIG. 28H. Overall, in various second example embodiments, 20 to 24 may be a suitable range for the number of segments of an annular magnet in the proposed irregular-shaped IO ring-pair magnet array, which can provide both good field homogeneity and less segments to be calculated.

In various second example embodiments, similar to the various first example embodiments, the magnet ring array may be formed using various fabrication techniques or procedures known in the art based on geometrical parameters determined according to various first embodiments of the present disclosure, such as using computer numerical control machines, and thus need not be described herein for clarity and conciseness.

VIII. CONCLUSION

Accordingly, various second example embodiments provide a design and the optimization of an irregular-shaped IO ring-pair magnet array that generates a 1D monotonic field pattern for 2D head imaging. Genetic algorithm is applied for the optimization, and a current model for a fan-shaped ring segment pair is derived for a fast forward calculation for the optimization. In an example simulation as described hereinbefore, an optimized magnet array according to various second example embodiments shows an average $B_0$ field of 132.98 mT and the field homogeneity of 151840 ppm in the a cylindrical FoV with a diameter of 200 mm and a length of 50 mm. Furthermore, the obtained magnetic field was applied as a SEM for signal encoding for imaging for a further evaluation of the magnet array according to various second example embodiments. The magnet array according to various second example embodiments successfully removes the blur at the central region of the image encoded by a Halbach array due to a highly monotonic gradient. It is a promising alternative to provide SEMs for imaging in a permanent-magnet-based low-field portable MRI system, besides a sparse Halbach array and an IO ring-pair aggregate according to various first example embodiments.

While embodiments of the present disclosure have been particularly shown and described with reference to specific embodiments, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A method of forming a permanent magnet system, the method comprising:
   determining one or more types of geometrical parameters for forming an array of magnet ring pairs comprising a first subarray of first magnet rings and a second subarray of second magnet rings spaced apart from the first subarray of the first magnet rings along a longitudinal axis; and
   forming the array of magnet ring pairs based on the determined one or more types of geometrical parameters, wherein
   said determining one or more types of geometrical parameters for forming the array of magnet ring pairs is based on a genetic algorithm, and
   the one or more types of geometrical parameters for the array of magnet ring pairs comprises one or more types of geometrical parameters for each magnet ring pair of the array of magnet ring pairs,
   the first magnet rings of the first subarray are arranged in series along the longitudinal axis and immediately adjacent first magnet rings of the first subarray are in contact with each other via planar surfaces thereof facing each other, and
   the second magnet rings of the second subarray are arranged in series along the longitudinal axis and immediately adjacent second magnet rings of the second subarray are in contact with each other via planar surfaces thereof facing each other.

2. The method according to claim 1, wherein based on the genetic algorithm, said determining the one or more types of geometrical parameters for forming the array of magnetic ring pairs comprises:
   optimizing the one or more types of geometrical parameters for forming the array of magnetic ring pairs with respect to a field strength and a field homogeneity of a magnetic field in a longitudinal direction in a field of view within the array of magnetic ring pairs to be generated by the array of magnetic ring pairs when formed based on the determined one or more types of geometrical parameters.

3. The method according to claim 2, wherein based on the genetic algorithm, said optimizing the one or more types of geometrical parameters for forming the array of magnetic ring pairs comprises:
   obtaining a plurality of test configurations for forming the array of magnetic ring pairs, each test configuration comprising a test set of geometrical parameters relating to the one or more types of geometrical parameters being optimized for forming the array of magnetic ring pairs; and
   determining, for each of the plurality of test configurations, a field strength and a field homogeneity of a magnetic field in the longitudinal direction in the field of view within the array of magnet ring pairs having the test configuration.

4. The method according to claim 3, wherein said determining, for each of the plurality of test configurations, the field strength and the field homogeneity of the magnetic field comprises determining, for each of the plurality of test configurations, the magnetic field for the array of magnetic ring pairs having the test configuration based on a current density model for each magnet ring in the array of magnetic ring pairs having the test configuration.

5. The method according to claim 4, wherein the current density model is based on a first equivalent surface current source relating to a first surface of the magnet ring facing a first direction substantially parallel to the longitudinal axis and a second equivalent surface current source relating to a second surface of the magnet ring facing a second direction, opposite to the first direction, substantially parallel to the longitudinal axis.

6. The method according to claim 4, wherein the current density model is simplified by configuring the current density model to determine the magnetic field for each magnet ring in the array of magnet ring pairs having the test configuration to be symmetric about the longitudinal axis.

7. The method according to claim 4, wherein said optimizing the one or more types of geometrical parameters for forming the array of magnetic ring pairs further comprises:
   determining, for each of the plurality of test configurations, a fitness measure of the field strength and the field homogeneity of the magnetic field determined based on the current density model for the array of magnetic ring pairs having the test configuration; and
   determining whether the fitness measures determined for the plurality of test configurations satisfy a predetermined condition,
   wherein if the fitness measures satisfy the predetermined condition, said optimizing the one or more types of geometrical parameters for forming the array of magnetic ring pairs further comprises selecting one of the plurality of test configurations as the determined one or more types of geometrical parameters for the array of magnet ring pairs; and
   wherein if the fitness measures do not satisfy the predetermined condition, said optimizing the one or more types of geometrical parameters for forming the array of magnetic ring pairs further comprises:
   generating a plurality of offspring configurations based on a selected number of the plurality of test configurations;
   mutating and crossovering the plurality of offspring configurations generated; and
   determining, for each of the plurality of offspring configurations, a field strength and a field homogeneity of a magnetic field in the longitudinal direction in the field of view within the array of magnet ring pairs having the offspring configuration.

8. The method according to claim 1,
wherein the one or more types of geometrical parameters for each magnet ring pair is selected from a group consisting of an inner radius parameter relating to an inner radius of the magnet ring pair, an outer radius parameter relating to an outer radius of the magnet ring pair, and a thickness parameter relating to a thickness of each magnet ring in the magnet ring pair; and
wherein the one or more types of geometrical parameters for the array of magnet ring pairs further comprises a number parameter relating to a number of ring pairs in the array of magnet ring pairs, and a distance parameter relating to a distance in which the first subarray and the second subarray is spaced apart along the longitudinal axis.

9. The method according to claim 1, wherein based on the genetic algorithm, said determining the one or more types of geometrical parameters for forming the array of magnetic ring pairs comprises:
optimizing the one or more types of geometrical parameters for forming the array of magnetic ring pairs with respect to a field strength and a field homogeneity of a magnetic field in a longitudinal direction and with respect to a field monotonicity of the magnetic field in a transverse direction in a field of view within the array of magnetic ring pairs to be generated by the array of magnetic ring pairs when formed based on the determined one or more types of geometrical parameters.

10. The method according to claim 9, wherein based on the genetic algorithm, said optimizing the one or more types of geometrical parameters for forming the array of magnetic ring pairs comprises:
obtaining a plurality of test configurations for forming the array of magnetic ring pairs, each test configuration comprising a test set of geometrical parameters relating to the one or more types of geometrical parameters being optimized for forming the array of magnetic ring pairs; and
determining, for each of the plurality of test configurations, a field strength and a field homogeneity of a magnetic field in the longitudinal direction and with respect to a field monotonicity of the magnetic field in the transverse direction in the field of view within the array of magnetic ring pairs having the test configuration.

11. The method according to claim 10, wherein said determining, for each of the plurality of test configurations, the field strength, the field homogeneity and the field monotonicity of the magnetic field comprises determining, for each of the plurality of test configurations, the magnetic field for the array of magnetic ring pairs having the test configuration based on a current density model for each ring segment of each magnet ring in the array of magnetic ring pairs having the test configuration.

12. The method according to claim 11, wherein the current density model is simplified by configuring the current density model to generate the magnetic field for each ring segment of each magnet ring in the array of magnet ring pairs having the test configuration, including setting each magnet ring pair of the array of magnet ring pairs to have an inner radius parameter relating to an inner radius of the magnet ring pair to taper from an outermost magnet ring pair to an innermost magnet ring pair of the array of magnet ring pairs.

13. The method according to claim 12, wherein the current density model is further simplified by configuring the current density model to determine the magnetic field for each ring segment of each magnet ring in the array of magnet ring pairs having the test configuration to be symmetric with respect to a plane perpendicular to the longitudinal axis and about the transverse axis.

14. The method according to claim 11, wherein said optimizing the one or more types of geometrical parameters for forming the array of magnetic ring pairs further comprises:
determining, for each of the plurality of test configurations, a fitness measure of the field strength, the field homogeneity and the field monotonicity of the magnetic field determined based on the current density model for the array of magnetic ring pairs having the test configuration; and
determining whether the fitness measures determined for the plurality of test configurations satisfy a predetermined condition,
wherein if the fitness measures satisfy the predetermined condition, said optimizing the one or more types of geometrical parameters for forming the array of magnetic ring pairs further comprises selecting one of the plurality of test configurations as the determined one or more types of geometrical parameters for the array of magnet ring pairs; and
wherein if the fitness measures do not satisfy the predetermined condition, said optimizing the one or more types of geometrical parameters for forming the array of magnetic ring pairs further comprises:
generating a plurality of offspring configurations based on a selected number of the plurality of test configurations;
mutating and crossovering the plurality of offspring configurations generated; and
determining, for each of the plurality of offspring configurations, a field strength and a field homogeneity of a magnetic field in the longitudinal direction and with respect to a field monotonicity of the magnetic field in the transverse direction in the field of view within the array of magnetic ring pairs having the offspring configuration.

15. The method according to claim 9, wherein the one or more types of geometrical parameters for the array of magnet ring pairs comprises one or more types of geometrical parameters for each ring segment of each magnet ring pair of the array of magnet ring pairs,
wherein the one or more types of geometrical parameters for each ring segment is selected from a group consisting of an inner radius parameter relating to an inner radius of the ring segment, an outer radius parameter relating to an outer radius of the ring segment, a step reduction parameter relating to a step reduction of the outer radius of the ring segment, and a tapering order parameter relating to an order of a tapering function associated with the ring segment; and
wherein the one or more types of geometrical parameters for the array of magnet ring pairs further comprises a number parameter relating to a number of ring segments in each of the first subarray of the first magnet rings and the second subarray of the second magnet rings, and a distance parameter relating to a distance in which the first subarray of the first magnet rings and the second subarray of the second magnet rings are spaced apart along the longitudinal axis.

16. A permanent magnet system comprising:
an array of magnet ring pairs comprising:
a first subarray of first magnet rings; and
a second subarray of second magnet rings spaced apart from the first subarray of the first magnet rings along a longitudinal axis, wherein
the first magnet rings of the first subarray are arranged in series along the longitudinal axis and immediately adjacent first magnet rings of the first subarray are in contact with each other via planar surfaces thereof facing each other, and
the second magnet rings of the second subarray are arranged in series along the longitudinal axis and immediately adjacent second magnet rings of the second subarray are in contact with each other via planar surfaces thereof facing each other.

17. The permanent magnet according to claim 16, wherein the array of magnet ring pairs is configured based on one or more types of geometrical parameters determined to generate a magnetic field in the longitudinal direction in a field of view within the array of magnetic ring pairs having an average field strength of 150 mT or more and a field homogeneity of 50,000 ppm or less.

18. The permanent magnet system according to claim 16, wherein the first subarray of the first magnet rings is segmented into a first subarray of first ring segments about the longitudinal axis and the second subarray of the second magnet rings is segmented into a second subarray of second ring segments about the longitudinal axis, each first ring segment extending through all first magnet rings in the first subarray, and each second ring segment extending through all second magnet rings in the second subarray.

19. The permanent magnet system according to claim 18, wherein each magnet ring pair of the array of magnet ring pairs is configured to have an inner radius parameter relating to an inner radius of the magnet ring pair tapering from an outermost magnet ring pair to an innermost magnet ring pair of the array of magnet ring pairs.

20. The permanent magnet according to claim 18, wherein the array of magnet ring pairs is configured based on one or more types of geometrical parameters to generate a magnetic field in a field of view within the array of magnetic ring pairs having an average field strength of 100 mT or more and a field homogeneity of 200,000 ppm or less in the longitudinal direction, and a field monotonicity having a field gradient of 0.40 T/m or less in the transverse direction.

* * * * *